(12) United States Patent
van Lengerich et al.

(10) Patent No.: US 12,263,656 B2
(45) Date of Patent: Apr. 1, 2025

(54) MATERIALS AND METHODS FOR FORMING NANO-STRUCTURES ON SUBSTRATES

(71) Applicant: 3M INNOVATIVE PROPERTIES COMPANY, St. Paul, MN (US)

(72) Inventors: Henrik B. van Lengerich, St. Paul, MN (US); Karl K. Stensvad, Eagan, MN (US); Edwin L Kusilek, Baldwin, WI (US); Matthew S. Stay, Bloomington, MN (US); Caleb T. Nelson, Woodbury, MN (US); Christopher S. Lyons, Woodbury, MN (US); Moses M. David, Wells, TX (US); Jeffrey L. Solomon, Centerville, MN (US); Martin B. Wolk, Woodbury, MN (US); Nicholas C. Erickson, St. Paul, MN (US); James Zhu, Woodbury, MN (US); James M. Nelson, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 747 days.

(21) Appl. No.: 17/250,995

(22) PCT Filed: Nov. 8, 2019

(86) PCT No.: PCT/IB2019/059605
§ 371 (c)(1),
(2) Date: Apr. 8, 2021

(87) PCT Pub. No.: WO2020/095258
PCT Pub. Date: May 14, 2020

(65) Prior Publication Data
US 2021/0347135 A1    Nov. 11, 2021

Related U.S. Application Data

(60) Provisional application No. 62/928,742, filed on Oct. 31, 2019, provisional application No. 62/759,914, (Continued)

(51) Int. Cl.
*B29D 11/00* (2006.01)
*B82Y 20/00* (2011.01)
(Continued)

(52) U.S. Cl.
CPC .. *B29D 11/00788* (2013.01); *B29D 11/00865* (2013.01); *B82Y 20/00* (2013.01);
(Continued)

(58) Field of Classification Search
CPC ................................................ B29D 11/00865
See application file for complete search history.

(56) References Cited

U.S. PATENT DOCUMENTS

| 3,515,778 A | 6/1970 | Fields |
| 3,689,346 A | 9/1972 | Rowland |

(Continued)

FOREIGN PATENT DOCUMENTS

| CN | 106444275 | 2/2017 |
| EP | 1860501 A2 | 11/2007 |

(Continued)

OTHER PUBLICATIONS

Liu, "Diamond turning of high-precision roll-to-roll imprinting molds for fabricating subwavelength grating", Optical Engineering, Jun. 2016, vol. 55, No. 6, pp. 064105-1-064105-7.
(Continued)

*Primary Examiner* — Robert A Vetere
(74) *Attorney, Agent, or Firm* — Thomas M. Spielbauer

(57) ABSTRACT

Materials and methods useful in forming nano-scale features on substrates, and articles such as optical films incorporating such nano-scale patterned substrates.

11 Claims, 30 Drawing Sheets

Related U.S. Application Data filed on Nov. 12, 2018, provisional application No. 62/757,864, filed on Nov. 9, 2018.

(51) Int. Cl.
  *B82Y 40/00* (2011.01)
  *G02B 1/00* (2006.01)
  *G02B 5/02* (2006.01)
  *G02B 5/20* (2006.01)

(52) U.S. Cl.
  CPC .............. *B82Y 40/00* (2013.01); *G02B 1/002* (2013.01); *G02B 5/0268* (2013.01); *G02B 5/208* (2013.01); *G02B 2207/101* (2013.01)

(56) References Cited

U.S. PATENT DOCUMENTS

| | | |
|---|---|---|
| 4,097,634 A | 6/1978 | Bergh |
| 4,374,077 A | 2/1983 | Kerfeld |
| 4,576,850 A | 3/1986 | Martens |
| 4,847,137 A | 7/1989 | Kellen |
| 5,175,030 A | 12/1992 | Lu |
| 5,183,597 A | 2/1993 | Lu |
| 5,440,446 A | 8/1995 | Shaw |
| 5,639,305 A | 6/1997 | Brown |
| 5,691,846 A | 11/1997 | Benson, Jr. |
| 5,772,905 A | 6/1998 | Chou |
| 5,972,176 A | 10/1999 | Kirk |
| 6,033,728 A | 3/2000 | Kikuchi |
| 6,334,960 B1 | 1/2002 | Wilson |
| 6,696,157 B1 | 2/2004 | David |
| 6,719,915 B2 | 4/2004 | Wilson |
| 7,018,713 B2 | 3/2006 | Padiyath |
| 7,125,603 B2 | 10/2006 | David |
| 7,173,778 B2 | 2/2007 | Jing |
| 7,387,081 B2 | 6/2008 | David |
| 7,591,903 B2 | 9/2009 | Maier |
| 7,749,802 B2 | 7/2010 | McFeely |
| 7,758,761 B2 | 7/2010 | Nakagawa |
| 7,799,888 B2 | 9/2010 | Arkles |
| 7,858,528 B2 | 12/2010 | Sreenivasan |
| 7,947,608 B2 | 5/2011 | Sreenivasan |
| 7,981,986 B2 | 7/2011 | Hunt |
| 8,027,086 B2 | 9/2011 | Guo |
| 8,187,679 B2 | 5/2012 | Dickey |
| 8,263,129 B2 | 9/2012 | DeSimone |
| 8,460,568 B2 | 6/2013 | David |
| 8,623,140 B2 | 1/2014 | Yapel |
| 8,658,248 B2 | 2/2014 | Anderson |
| 8,664,323 B2 | 3/2014 | Iyer |
| 8,703,232 B2 | 4/2014 | Stay |
| 8,808,811 B2 | 8/2014 | Kolb |
| 8,917,447 B2 | 12/2014 | Wolk et al. |
| 9,029,586 B2 | 5/2015 | Arkles |
| 9,069,244 B2 | 6/2015 | Kobrin |
| 9,103,016 B2 | 8/2015 | Heau |
| 9,254,506 B2 | 2/2016 | Roehrig |
| 9,302,291 B2 | 4/2016 | Lyons |
| 9,307,648 B2 | 4/2016 | Slafer |
| 9,360,592 B2 | 6/2016 | Hunt |
| 9,718,961 B2 | 8/2017 | Corveleyn |
| 9,759,663 B2 | 9/2017 | Halverson |
| 9,790,396 B2 | 10/2017 | Klun |
| 9,982,160 B2 | 5/2018 | Klun |
| 10,011,735 B2 | 7/2018 | Klun |
| 2004/0021866 A1* | 2/2004 | Watts .................... G03F 7/0002 |
| | | 356/401 |
| 2005/0150864 A1 | 7/2005 | Stasiak |
| 2005/0202350 A1 | 9/2005 | Colburn |
| 2007/0065636 A1 | 3/2007 | Merrill |
| 2007/0117389 A1 | 5/2007 | Takaki |
| 2007/0298176 A1 | 12/2007 | DiPietro |
| 2009/0015757 A1 | 1/2009 | Potts |
| 2009/0046362 A1* | 2/2009 | Guo ...................... B82Y 10/00 |
| | | 427/457 |
| 2010/0030875 A1 | 2/2010 | Visser |
| 2010/0308497 A1 | 12/2010 | David |
| 2011/0207329 A1 | 8/2011 | Shih |
| 2012/0152887 A1 | 6/2012 | Lee |
| 2013/0011608 A1 | 1/2013 | Wolk |
| 2013/0087528 A1* | 4/2013 | Zhu ........................ C08L 63/00 |
| | | 264/293 |
| 2013/0229378 A1 | 9/2013 | Iyer |
| 2014/0054264 A1 | 2/2014 | Lee |
| 2014/0087016 A1 | 3/2014 | Gao |
| 2014/0193612 A1* | 7/2014 | Yu ........................... C08K 9/04 |
| | | 428/143 |
| 2015/0203707 A1 | 7/2015 | Klun |
| 2015/0218294 A1 | 8/2015 | Klun |
| 2016/0083839 A1 | 3/2016 | Bright |
| 2016/0263929 A1 | 9/2016 | Dodds |
| 2017/0005038 A1 | 1/2017 | Lee |
| 2017/0240782 A1 | 8/2017 | Suwa |
| 2019/0243042 A1 | 8/2019 | Wee |
| 2021/0157041 A1* | 5/2021 | Olkkonen .......... G02B 27/0081 |

FOREIGN PATENT DOCUMENTS

| | | |
|---|---|---|
| WO | WO 1995-11464 | 4/1995 |
| WO | WO 1995-29811 | 11/1995 |
| WO | WO 1997-11328 | 3/1997 |
| WO | WO 2007-133472 | 11/2007 |
| WO | WO 2009-002637 | 12/2008 |
| WO | WO 2017-003870 | 1/2017 |
| WO | WO 2017-091738 | 6/2017 |
| WO | WO 2017-172531 | 10/2017 |
| WO | WO 2018-052895 | 3/2018 |
| WO | WO 2018-080036 | 5/2018 |

OTHER PUBLICATIONS

Weidner, "Role of Surface Tension Gradients in Correcting Coating Defects in Corners", Journal of Colloid and Interface Science, Apr. 1996, vol. 179, No. 1, pp. 66-75.

International Search Report for PCT International Application No. PCT/IB2019/059605, mailed on Feb. 25, 2020, 3 pages.

\* cited by examiner

MATERIALS AND METHODS FOR FORMING NANO-STRUCTURES ON SUBSTRATES

CROSS REFERENCE TO RELATED APPLICATIONS

This application is a national stage filing under 35 U.S.C. 371 of PCT/IB2019,059605, filed Nov. 8, 2019, which claims the benefit of U.S. Application Nos. 62/757,864, filed Nov. 9, 2018; 62/759,914, filed Nov. 12, 2018; and 62/928,742, filed Oct. 31, 2019, the disclosure of which is incorporated by reference in its/their entirety herein.

FIELD

The present disclosure relates to materials and methods useful in forming nanostructures on substrates, and more particularly, to transfer tooling and patterning processes for producing nano-scale features on patterned substrates to produce meta-materials such as optical films.

BACKGROUND

Meta-materials are synthetic composite materials having nano-scale features on at least one surface. When the nano-scale features are selected to have at least one dimension less than the wavelength of light impinging on the surface, the meta-materials may exhibit properties not usually found in nature. For example, a property uniquely exhibited by some meta-materials is a negative index of refraction. Meta-materials may have simple surface structures such as a single patterned layer or more complex surface structures such as stacked patterned layers, often in registration to each other, such that the individual nano-scale features interact electromagnetically with impinging radiation according to their design. Meta-materials having nano-scale surface features have recently found applications in optics, bio-sensing, semiconductors and other electronic devices.

SUMMARY

The art continually searches for new meta-materials and methods for producing nano-scale features on surfaces, particularly surfaces of meta-materials such as optical films. We have recently investigated production of meta-materials by nano-scale patterning using a nano-scale patterned tool prepared using novel multi-layer material stacks.

We have discovered that known multi-layer material stacks for pattern transfer of micro-scale features suffer from a number of deficiencies when used in nano-scale feature patterning, including, for example, their expense and complicated fabrication methodology; their poor inter-layer bonding which may require additional adhesion-enhancing layer(s) or surface treatments; their difficulty of use in achieving opened-through pattern transfer without introducing defects; their poor adhesion to different end-use substrates; and upper limits on the build-up thickness of the multi-layer stack, which limits the aspect ratio of the features which can be transferred to generally less than two.

We have designed novel multi-layer material stacks which can be used to fabricate tooling capable of producing micro-scale and/or nano-scale features on a substrate with high fidelity. The challenge of high fidelity nano-scale feature fabrication on tooling or end-use substrates is particularly daunting for nanoscale features having a sub-micron height above the substrate and an aspect ratio (ratio of the height of the feature to its width) greater than 1, or for example, aspect ratios of at least 2, 3, 4, 5, 6, 7, 8, 9, 10 or even higher.

The novel material stacks disclosed in the present disclosure exhibit improvements that may eliminate many of the above-identified disadvantages and may be used to apply micro-scale or nano-scale features on tool surfaces or substrate surface with high fidelity. The novel material stacks may be used to transfer fine patterns (ranging from micrometer-scale to nanometer-scale) from a patterned layer to a replication tool. The novel material stacks may be used to transfer patterns to replication tools made from a variety of materials, in a variety of geometric shapes, and for applications using different pattern replication techniques.

Briefly, in one aspect, the present disclosure describes novel material stacks useful in various methods of forming an etched nano-scale pattern on a substrate. In some exemplary embodiments, each layer of the novel material stacks can be deposited through a variety of techniques, which can be chosen, for example, based on the layer thickness, the replication tool material type, the particular end-use application, production efficiency, and/or cost. The present disclosure illustrates how the order in which the stacks are assembled can advantageously vary. This ordering can be chosen to access certain material sets; increase production efficiency, for example, by combining vacuum steps or utilizing existing process flows; or increasing or decreasing adhesion between certain layers, for example, for process steps such as sputtering and solvent coating the adhesion to the surface to be coated is enhanced by the energy of the particles or the partial solvation of the substrate.

In certain exemplary embodiments, a hard mask layer and a second pattern transfer layer have good inter-layer bonding may be advantageously used. In such embodiments, no additional adhesion layer is required, which simplifies the pattern transfer process without compromising pattern dimensions, resolution, or reproduction fidelity.

In some exemplary embodiments, an etch-stop layer may also function as a tie-layer, which can bond well with the tool surface. However, it should be readily understood that any layer may be tailored to enhance adhesion or bonding to an adjoining layer using a variety of surface modification techniques described herein.

In further exemplary embodiments, the pattern layer, which may be applied on top of an upper hard mask layer, can be produced using a variety of techniques. The pattern layer can be produced, for example, from photo resist materials or noble metals, and the like. In some embodiments, a second pattern transfer layer can be patterned using reactive ion etching (RIE) with a variety of different chemistries and specified conditions.

In certain exemplary embodiments where the pattern layer is made by sputtering of noble metals with high sputter rates, the sputter yielding from the pattern layer can be limited. As a result, the related patterning defects are also limited. In addition, the roughness at the pattern edges can be smoothed using a multi-step RIE process.

In additional exemplary embodiments, the thickness of a second pattern transfer layer in the novel material stacks can be tailored for transferring fine patterns with different aspect ratios without compromising transferred pattern resolution or fidelity. At the same time, the novel material stacks can make it easier to achieve a good variety of aspect ratios, including high ones.

In a second aspect, the present disclosure describes a method of forming an etched nano-scale pattern on a substrate, the method including providing a patterned surface comprising an etchable material on a substrate, the patterned surface including one or more recessed features, each recessed feature adjoining at least one plateau feature extending away from the recessed feature; depositing an etch resist comprising an etch resistant material on at least a portion of the patterned surface including the at least one recessed feature and the at least one plateau feature; and selectively etching the patterned surface to remove at least a portion of the at least one plateau feature, thereby forming the etched nano-scale pattern on the substrate. In some embodiments, the etched nano-scale pattern includes a multiplicity of nano-scale features. In certain such embodiments, each nano-scale feature exhibits at least one dimension from 1 nanometer (nm) to 900 nm.

In another aspect, the present disclosure describes a method of forming an etched nano-scale pattern on a substrate, the method including providing a substrate; depositing an etch resist comprising an etch resistant material on at least a portion of the substrate; imprinting into the etch resist a patterned surface including one or more recessed features, each recessed feature adjoining at least one plateau feature extending away from the recessed feature; and selectively etching the patterned surface of the etch resist and the substrate to remove at least a portion of the at least one plateau feature, thereby forming an etched nano-scale pattern on the substrate. In some embodiments, the etched nano-scale pattern includes a multiplicity of nano-scale features. In certain such embodiments, each nano-scale feature exhibits at least one dimension from 1 nm to 900 nm.

In an additional aspect, the present disclosure describes a method of forming an etched nano-scale pattern on a substrate, the method including providing a substrate; depositing a first etch resist comprising a first etch resistant material on at least a portion of the substrate; depositing a patterned layer on the first etch resist, the patterned layer having a patterned surface including one or more recessed features, each recessed feature adjoining at least one plateau feature extending away from the recessed feature; overlaying the patterned layer with a second etch resist by depositing a second etch resistant material on at least a portion of the patterned layer, optionally wherein the first and second etch resistant materials are the same composition; and selectively etching the patterned surface of the patterned layer to remove at least a portion of the at least one plateau feature, thereby forming the etched nano-scale pattern on the substrate. In some embodiments, the etched nano-scale pattern includes a multiplicity of nano-scale features. In certain such embodiments, each nano-scale feature exhibits at least one dimension from 1 nm to 900 nm.

In another aspect, the present disclosure describes a method of forming an etched nano-scale pattern on a substrate, the method including providing a substrate; depositing a first etch resist comprising a first etch resistant material on at least a portion of the substrate; overlaying the first etch resist with a transfer layer in contact with the first etch resist; overlaying the transfer layer with a second etch resist comprising a second etch resistant material in contact with the transfer layer; imprinting into the second etch resist a patterned surface including one or more recessed features, each recessed feature adjoining at least one plateau feature extending away from the recessed feature; and selectively etching the patterned surface of the second etch resist to remove at least a portion of the second etch resistant material, thereby forming an etched nano-scale pattern on the substrate. In some embodiments, the etched nano-scale pattern includes a multiplicity of nano-scale features. In certain such embodiments, each nano-scale feature exhibits at least one dimension from 1 nm to 900 nm.

In one additional aspect, the present disclosure describes a method of forming an etched nano-scale pattern on a substrate, the method including providing a first substrate having a patterned surface, the patterned surface including one or more recessed features, each recessed feature adjoining at least one plateau feature extending away from the recessed feature; depositing a first etch resist comprising a first etch resistant material on at least a portion of the patterned surface; overlaying the first etch resist with a transfer layer contacting the first etch resist; optionally overlaying the transfer layer with a second etch resist comprising a second etch resistant material contacting the transfer layer, wherein the second etch resist is overlaid by a second substrate; removing the patterned surface of the substrate from the first etch resist to create a patterned surface of the first etch resist on the second substrate; and selectively etching the patterned surface of the first etch resist to remove at least a portion of the first etch resistant material, thereby forming the etched nano-scale pattern on the second substrate. In some embodiments, the etched nano-scale pattern includes a multiplicity of nano-scale features. In certain such embodiments, each nano-scale feature exhibits at least one dimension from 1 nm to 900 nm.

In yet another aspect, the present disclosure describes a method of forming an etched nano-scale pattern on a substrate, the method including providing a first substrate having a patterned surface, the patterned surface including one or more recessed features, each recessed feature adjoining at least one plateau feature extending away from the recessed feature; depositing a masking layer on and contacting the patterned surface of the substrate; overlaying the masking layer with a first etch resist comprising a first etch resistant material contacting at least a portion of the masking layer; overlaying the masking layer with a transfer layer contacting at least a portion of the first etch resist; overlaying the transfer layer with a second etch resist comprising a second etch resistant material in contact with the transfer layer, wherein the second etch resist is overlaid by a second substrate; removing the patterned surface of the first substrate from the first etch resist to create a patterned surface of the first etch resist; and selectively etching the patterned surface of the first etch resist to remove at least a portion of the first etch resistant material, thereby forming the etched nano-scale pattern on the second substrate. In some embodiments, the etched nano-scale pattern includes a multiplicity of nano-scale features. In certain such embodiments, each nano-scale feature exhibits at least one dimension from 1 nm to 900 nm. In certain exemplary embodiments, at least one of the first substrate and the second substrate is flexible.

In still another aspect, the present disclosure describes a method of forming an etched nano-scale pattern on a substrate, the method including providing a substrate having opposed first and second major surfaces, the first major surface having positioned thereon a first etch resist comprising a first etch resistant material in contact with the first major surface of the substrate, a transfer layer overlaying and contacting the first etch resist, and a second etch resist comprising a second etch resistant material overlaying and contacting the transfer layer; covering the second etch resist with a masking layer; imprinting into the masking layer a patterned surface; selectively etching the patterned surface of the masking layer to remove at least a portion of the second etch resistant material and the transfer layer, thereby forming an etched nano-scale pattern on the substrate. In some embodiments, the etched nano-scale pattern includes a multiplicity of nano-scale features. In certain such embodiments, each nano-scale feature exhibits at least one dimension from 1 nm to 900 nm.

In a final aspect, the present disclosure describes an article comprising a nano-scale pattern on a substrate, the nano-scale pattern made using any of the foregoing methods. In certain exemplary embodiments, the article is an optical film. In some exemplary embodiments, a height of the nano-scale features is at least five times larger than a width of the nano-scale features, optionally wherein the width of the nanoscale features is less than 500 nm. In certain exemplary embodiments, the nano-scale features include at least one of a multiplicity of holes, a multiplicity of pillars, a multiplicity of recesses having a substantially flat bottom surface, a multiplicity of flat-topped plateau features, or a multiplicity of three-dimensional polygonal structures. In additional exemplary embodiments, a depth of 90% of the nano-scale features is within +/−20 nm of an average etch depth.

Various unexpected results and advantages are obtained in exemplary embodiments of the disclosure.

LISTING OF EXEMPLARY EMBODIMENTS

A. A method of forming an etched nano-scale pattern on a substrate, the method comprising:
  providing a patterned surface comprising an etchable material on a substrate, the patterned surface including one or more recessed features, each recessed feature adjoining at least one plateau feature extending away from the recessed feature;
  depositing an etch resist comprising an etch resistant material on at least a portion of the patterned surface including the at least one recessed feature and the at least one plateau feature; and
  selectively etching the patterned surface to remove at least a portion of the at least one plateau feature, thereby forming the etched nano-scale pattern on the substrate, optionally wherein the etched nano-scale pattern comprises a plurality of nano-scale features, wherein each nano-scale feature exhibits at least one dimension from 1 nm to 900 nm.

B. A method of forming an etched nano-scale pattern on a substrate, the method comprising:
  providing a substrate;
  depositing an etch resist comprising an etch resistant material on at least a portion of the substrate;
  imprinting into the etch resist a patterned surface including one or more recessed features, each recessed feature adjoining at least one plateau feature extending away from the recessed feature; and
  selectively etching the patterned surface of the etch resist and the substrate to remove at least a portion of the at least one plateau feature, thereby forming an etched nano-scale pattern on the substrate, optionally wherein the etched nano-scale pattern comprises a plurality of nano-scale features, wherein each nano-scale feature exhibits at least one dimension from 1 nm to 900 nm.

C. The method of Embodiment A, wherein the imprinting of the patterned surface into the etch resist is carried out under a pressure of less than 0.5 atm.

D. The method of Embodiment A or B, where the imprinting of the patterned surface into the etch resist is carried under a gas that is more soluble in the etch resist than air.

E. The method of any preceding Embodiment, wherein the substrate is flexible.

F. The method of any preceding Embodiment, wherein the etch resist is deposited from a liquid solution, a liquid dispersion, or a combination thereof.

G. The method of any preceding Embodiment, wherein depositing the etch resist is carried out using liquid coating, vapor deposition, or a combination thereof.

H. The method of Embodiment G, wherein depositing the etch resist is carried out using vapor deposition followed by liquid coating.

I. The method of any preceding Embodiment, wherein a top surface of the etch resist is substantially flat compared to a height of the at least one plateau feature.

J. The method of any preceding Embodiment, wherein the etch resist has a thickness over the one or more recessed features that is greater than a thickness of the etch resist over the at least one plateau feature.

K. The method of any preceding Embodiment, wherein the patterned surface is treated with a plasma to change a chemical composition of the patterned surface prior to deposition of the etch resist.

L. The method of any preceding Embodiment, wherein a coating is applied to the patterned surface to change a chemical composition of the patterned surface optionally wherein the coating has a thickness less than 100 nm.

M. The method of any preceding Embodiment, wherein the selectively etching the patterned surface removes a portion of the etch resist material from the patterned surface, optionally wherein the selectively etching the patterned surface removes substantially all of the etch resistant material from the patterned surface.

N. The method of any preceding Embodiment, wherein the selectively etching the patterned surface is carried out using a reactive ion etch in a fluorine-containing environment followed by a reactive ion etch in an oxygen-containing environment.

O. The method of any preceding Embodiment, wherein the etch resist material comprises silicon.

P. The method of any preceding Embodiment, wherein the patterned surface comprises a (meth)acrylate (co)polymer.

Q. The method of any preceding Embodiment, wherein the nano-scale pattern is back-filled with a high refractive index layer comprising a material having a refractive index of at least 1.7, and optionally greater than 2.0.

R. The method of Embodiment Q, wherein the high refractive index layer is deposited by vapor deposition, atomic layer deposition, liquid coating, or a combination thereof.

S. The method of Embodiment R, wherein the high refractive index layer is deposited using liquid coating followed by atomic layer deposition.

T. The method of Embodiment Q, wherein the high refractive index layer comprises at least one of titanium, zirconium, tantalum, hafnium, niobium, or cerium; an oxide of titanium, zirconium, tantalum, hafnium, niobium, or cerium; a nitride of titanium, zirconium, tantalum, hafnium, niobium, or cerium; or a combination thereof.

U. A method of forming an etched nano-scale pattern on a substrate, the method comprising:
providing a substrate;
depositing a first etch resist comprising a first etch resistant material on at least a portion of the substrate;
depositing a patterned layer on the first etch resist, the patterned layer having a patterned surface including one or more recessed features, each recessed feature adjoining at least one plateau feature extending away from the recessed feature;
overlaying the patterned layer with a second etch resist by depositing a second etch resistant material on at least a portion of the patterned layer, optionally wherein the first and second etch resistant materials are the same composition; and
selectively etching the patterned surface of the patterned layer to remove at least a portion of the at least one plateau feature, thereby forming the etched nano-scale pattern on the substrate, optionally wherein the etched nano-scale pattern comprises a plurality of nano-scale features, wherein each nano-scale feature exhibits at least one dimension from 1 nm to 900 nm.

V. A method of forming an etched nano-scale pattern on a substrate, the method comprising:
providing a substrate;
depositing a first etch resist comprising a first etch resistant material on at least a portion of the substrate;
overlaying the first etch resist with a transfer layer in contact with the first etch resist;
overlaying the transfer layer with a second etch resist comprising a second etch resistant material in contact with the transfer layer, optionally wherein the first and second etch resistant materials are the same composition;
imprinting into the second etch resist a patterned surface including one or more recessed features, each recessed feature adjoining at least one plateau feature extending away from the recessed feature; and
selectively etching the patterned surface of the second etch resist to remove at least a portion of the second etch resistant material, thereby forming an etched nano-scale pattern on the substrate, optionally wherein the etched nano-scale pattern comprises a plurality of nano-scale features, wherein each nano-scale feature exhibits at least one dimension from 1 nm to 900 nm.

W. A method of forming an etched nano-scale pattern on a substrate, the method comprising:
providing a first substrate having a patterned surface, the patterned surface including one or more recessed features, each recessed feature adjoining at least one plateau feature extending away from the recessed feature;
depositing a first etch resist comprising a first etch resistant material on at least a portion of the patterned surface;
overlaying the first etch resist with a transfer layer contacting the first etch resist;
optionally overlaying the transfer layer with a second etch resist comprising a second etch resistant material contacting the transfer layer, wherein the second etch resist is overlaid by a second substrate, optionally wherein the first and second etch resistant materials are the same composition;
removing the patterned surface of the substrate from the first etch resist to create a patterned surface of the first etch resist on the second substrate; and
selectively etching the patterned surface of the first etch resist to remove at least a portion of the first etch resistant material, thereby forming the etched nano-scale pattern on the second substrate, optionally wherein the etched nano-scale pattern comprises a plurality of nano-scale features, wherein each nano-scale feature exhibits at least one dimension from 1 nm to 900 nm.

X. The method of any one of Embodiments V or W, wherein overlaying the first etch resist with the transfer layer is carried out by liquid coating the transfer layer from a volatile carrier liquid, liquid coating the transfer layer from a composition at 100% solids or depositing the transfer layer from a vapor.

Y. The method of any one of Embodiments V, W or X, wherein the transfer layer is coated onto the first etch resist, then laminated to the second etch resist, and then solidified.

Z. The method of any one of claims Embodiments V, W or X, wherein the transfer layer is coated onto the second etch resist, then laminated to the first etch resist, and then solidified.

AA. The method of any one of Embodiments W or X, wherein the second etch resist is coated onto the transfer layer, then laminated to the second substrate, and then solidified.

BB. The method of any one of Embodiments W or X, wherein the second etch resist is coated onto the second substrate, then laminated to the first substrate, and then solidified.

CC. The method of any one of Embodiments W or X, claim 1 where the second etch resist is coated onto the transfer layer, then adhered to a flexible backing using an adhesive.

DD. The method of any one of Embodiments W or X, wherein the second etch resist is omitted and the first etch resist is adhered to either the transfer layer or to the second substrate EE. The method of any one of Embodiments U, V, W, X, Y, Z, AA, BB, CC or DD, wherein the composition of a surface of the first etch resist or a surface of the second etch resist is modified to increase adhesion to the patterned surface.

FF. The method of any one of Embodiments U, V, W, X, Y, Z, AA, BB, CC, DD or EE, wherein the composition of the patterned surface of the first substrate is modified to increase adhesion to the patterned surface.

GG. The method of any one of Embodiments U, V, W, X, Y, Z, AA, BB, CC, DD, EE or FF, wherein a tie layer is coated between the first etch resist and the patterned surface of the first substrate.

HH. The method of any one of Embodiments U, V, W, X, Y, Z, AA, BB, CC, DD, EE, FF or GG, wherein a temperature is modified to increase adhesion between the patterned surface of the first substrate and the first etch resist.

II. The method of any one of Embodiments U, V, W, X, Y, Z, AA, BB, CC, DD, EE, FF, GG or HH, wherein the patterned surface is treated to change the composition of the patterned surface before overlaying the patterned surface with the second etch resist.

JJ. The method of any one of Embodiments U, V, W, X, Y, Z, AA, BB, CC, DD, EE, FF, GG, HH, or II, wherein the substrate is flexible.

KK. The method of any one of Embodiments U, V, W, X, Y, Z, AA, BB, CC, DD, EE, FF, GG, HH, II or JJ, wherein at least one of the first etch resist or the second etch resist is deposited from a liquid solution, a liquid dispersion, or a combination thereof.

LL. The method of any one of Embodiments U, V, W, X, Y, Z, AA, BB, CC, DD, EE, FF, GG, HH, II, JJ or KK, wherein depositing at least one of the first etch resist or the second etch resist is carried out using liquid coating, vapor deposition, or a combination thereof.

MM. The method of any one of any one of Embodiments U, V, W, X, Y, Z, AA, BB, CC, DD, EE, FF. GG, HH, II, JJ, KK or LL, wherein depositing at least one of the first etch resist or the second etch resist is carried out using vapor deposition followed by liquid coating.

NN. The method of Embodiment U, wherein a top surface of the second etch resist is substantially flat compared to a height of the at least one plateau feature.

OO. The method of Embodiment U, wherein the second etch resist has a thickness over the one or more recessed features that is greater than a thickness of the second etch resist over the at least one plateau feature.

PP. The method of any one of Embodiments U, V, W, X, Y, Z, AA, BB, CC, DD, EE, FF, GG, HH, II, JJ, KK, LL, MM, NN or OO, wherein a surface of the second etch resist is treated with a plasma to change a chemical composition of the surface of the second etch resist.

QQ. The method of any one of Embodiments U, V, W, X, Y, Z, AA, BB, CC, DD, EE, FF, GG, HH, II, JJ, KK, LL, MM, NN, OO or PP, wherein a coating is applied to the patterned surface to change a chemical composition of the patterned surface, optionally wherein the coating has a thickness less than 100 nm.

RR. The method of any one of Embodiments U, V, W, X, Y, Z, AA, BB, CC, DD, EE, FF, GG, HH, II, JJ, KK, LL, MM, NN, OO, PP or QQ, wherein the selectively etching the patterned surface removes a portion of the second etch resistant material from the patterned surface, optionally wherein the selectively etching the patterned surface removes substantially all of the second etch resistant material from the patterned surface.

SS. The method of any one of Embodiments U, V, W, X, Y, Z, AA, BB, CC, DD, EE, FF, GG, HH, II, JJ, KK, LL, MM, NN, OO, PP, QQ or RR, wherein the selectively etching the patterned surface is carried out using a reactive ion etch in a fluorine-containing environment followed by a reactive ion etch in an oxygen-containing environment.

TT. The method of any one of Embodiments U, V, W, X, Y, Z, AA, BB, CC, DD, EE, FF, GG, HH, II, JJ, KK, LL, MM, NN, OO, PP, QQ, RR or SS, wherein at least one of the first etch resistant material or the second etch resistant material comprises silicon.

UU. The method of any one of Embodiments U, V, W, X, Y, Z, AA, BB, CC, DD, EE, FF, GG, HH, II, JJ, KK, LL, MM, NN, OO, PP, QQ, RR, SS or TT, wherein the patterned surface comprises a (meth)acrylate (co)polymer.

VV. The method of any one of Embodiments U, V, W, X, Y, Z, AA, BB, CC, DD, EE, FF, GG, HH, II, JJ, KK, LL, MM, NN, OO, PP, QQ, RR, SS, TT or UU, wherein the selective-etching is inhibited by the second etch resist.

WW. The method of any one of Embodiments U, V, W, X, Y, Z, AA, BB, CC, DD, EE, FF, GG, HH, II, JJ, KK, LL, MM, NN, OO, PP, QQ, RR, SS, TT, UU or VV, wherein the selective etching is carried out using reactive ion etching, high density RF inductive plasma etching, high density linear ion plasma etching, microwave plasma etching, linear microwave plasma etching, helicon wave plasma etching, ion-beam milling, pulsed ion beam etching, pulsed reactive ion etching, or a combination thereof.

XX. The method of any one of Embodiments U, V, W, X, Y, Z, AA, BB, CC, DD, EE, FF, GG, HH, II, JJ, KK, LL, MM, NN, OO, PP, QQ, RR, SS, TT, UU, VV or WW, wherein the selective etching is carried out using oxygen, argon, $CF_4$, $C_2F_6$, $C_3F_8$, $C_4F_{10}$, $NF_3$, $SF_6$, $Cl_2$, $CH_4$, or a combination thereof.

YY. The method of Embodiment U, wherein the patterned layer is deposited by coating onto the first etch resist, laminating with a tool, solidifying, then releasing from a tool.

ZZ. The method of Embodiment U, wherein the patterned layer is deposited by coating into a lamination nip between the first etch resist and a tool, solidifying then releasing from the tool.

AAA. The method of Embodiment U, wherein the patterned layer is deposited by coating onto a tool, laminating onto the first etch resist, solidifying, then releasing from the tool.

BBB. The method of Embodiment U, wherein the patterned layer is deposited by coating onto a tool, solidifying, laminating with the first etch resist, then solidifying the first etch resist.

CCC. The method of Embodiment U, wherein the patterned layer is deposited by liquid coating out of solvent.

DDD. The method of any one of Embodiments U, V, W, X, Y, Z, AA, BB, CC, DD, EE, FF, GG, HH, II, JJ, KK, LL, MM, NN, OO, PP, QQ, RR, SS, TT, UU, VV, WW, XX, YY, ZZ, AAA, BBB, or CCC, wherein the nano-scale pattern is back-filled with a high refractive index layer comprising a material having a refractive index of at least 1.7, and optionally greater than 2.0.

EEE. The method of Embodiment DDD, wherein the high refractive index layer is deposited by vapor deposition, atomic layer deposition, liquid coating, or a combination thereof.

FFF. The method of claim EEE, wherein the high refractive index layer is deposited using liquid coating followed by atomic layer deposition.

GGG. The method of any one of claims DDD, EEE or FFF, wherein the high refractive index layer comprises at least one of titanium, zirconium, tantalum, hafnium, niobium, or cerium; an oxide of titanium, zirconium, tantalum, hafnium, niobium, or cerium; a nitride of titanium, zirconium, tantalum, hafnium, niobium, or cerium; or a combination thereof.

HHH. A method of forming an etched nano-scale pattern on a substrate, the method comprising:
providing a first substrate having a patterned surface, the patterned surface including one or more recessed features, each recessed feature adjoining at least one plateau feature extending away from the recessed feature;
depositing a masking layer on and contacting the patterned surface of the substrate;

overlaying the masking layer with a first etch resist comprising a first etch resistant material contacting at least a portion of the masking layer;

overlaying the masking layer with a transfer layer contacting at least a portion of the first etch resist;

overlaying the transfer layer with a second etch resist comprising a second etch resistant material in contact with the transfer layer, wherein the second etch resist is overlaid by a second substrate, optionally wherein the first and second etch resistant materials are the same composition;

removing the patterned surface of the first substrate from the first etch resist to create a patterned surface of the first etch resist; and selectively etching the patterned surface of the first etch resist to remove at least a portion of the first etch resistant material, thereby forming the etched nano-scale pattern on the second substrate, optionally wherein the etched nano-scale pattern comprises a plurality of nano-scale features, wherein each nano-scale feature exhibits at least one dimension from 1 nm to 900 nm.

III. A method of forming an etched nano-scale pattern on a substrate, the method comprising:

providing a substrate having opposed first and second major surfaces, the first major surface having positioned thereon a first etch resist comprising a first etch resistant material in contact with the first major surface of the substrate, a transfer layer overlaying and contacting the first etch resist, and a second etch resist comprising a second etch resistant material overlaying and contacting the transfer layer, optionally wherein the substrate is flexible;

covering the second etch resist with a masking layer;

imprinting into the masking layer a patterned surface;

selectively etching the patterned surface of the masking layer to remove at least a portion of the second etch resistant material and the transfer layer, thereby forming an etched nano-scale pattern on the substrate, wherein the etched nano-scale pattern comprises a plurality of nano-scale features, further wherein each nano-scale feature exhibits at least one dimension from 1 nm to 900 nm.

JJJ. The method of Embodiment HHH or III, wherein the first and second etch resistant materials are the same composition.

KKK. The method of any one of Embodiments HHH, III or JJJ, wherein an aspect ratio of the etched pattern is at least 2.5:1.

LLL. The method of any one of Embodiments HHH, III, JJJ or KKK, wherein the etched nano-scale pattern is a predetermined patterned, optionally wherein the etched nano-scale pattern is a substantially negative pattern of a positive pattern on a tool.

MMM. The method of any one of Embodiments HHH, III, JJJ, KKK or LLL, wherein the method is carried out on a roll of the substrate using a substantially continuous roll-to-roll process.

NNN. The method of any one of Embodiments HHH, III, JJJ, KKK, LLL or MMM, wherein the masking layer is coated onto the patterned surface, then laminated to the first etch resist layer, then solidified.

OOO. The method of any of any one of Embodiments HHH, III, JJJ, KKK, LLL or MMM, wherein the first etch resist is coated onto the masking layer, then laminated to the transfer layer, then solidified.

PPP. The method of any one of Embodiments HHH, III, JJJ, KKK, LLL or MMM, wherein the first etch resist is coated onto the transfer layer, then laminated to the first etch resist, then solidified.

QQQ. The method any one of Embodiments HHH, III, JJJ, KKK, LLL or MMM, wherein the transfer layer is coated onto the first etch resist, laminated to the second etch resist, and then solidified.

RRR. The method of any one of Embodiments Embodiments HHH, III, JJJ, KKK, LLL or MMM, wherein the transfer layer is coated onto the second etch resist, laminated to the first etch resist, and then solidified.

SSS. The method of Embodiment HHH, wherein the second etch resist is coated onto the transfer layer, laminated to the second substrate, and then solidified.

TTT. The method of Embodiment HHH, wherein the second etch resist is coated onto the second substrate, laminated to the first substrate, then solidified.

UUU. The method of Embodiments HHH, wherein the second etch resist is coated onto the transfer layer, then adhered to a flexible backing, optionally using an adhesive.

VVV. The method of any one of Embodiments HHH, III, JJJ, KKK, LLL, MMM, NNN, OOO, PPP, QQQ, RRR, SSS, TTT or UUU, wherein the masking layer is applied using liquid coating, vapor deposition, or a combination thereof.

WWW. The method of any one of Embodiments HHH, III, JJJ, KKK, LLL, MMM, NNN, OOO, PPP, QQQ, RRR, SSS, TTT or UUU, wherein at least one of the masking layer, the first etch resist, the transfer layer, or and the second etch resist, is applied using liquid coating of a solution, liquid coating of a dispersion, liquid coating of a composition at 100% solids, vapor deposition, or a combination thereof.

XXX. The method of Embodiment WWW, wherein at least one of the masking layer, the first etch resist, the transfer layer, or and the second etch resist, is applied using vapor deposition followed by solution coating.

YYY. The method of any one of Embodiments HHH, III, JJJ, KKK, LLL, MMM, NNN, OOO, PPP, QQQ, RRR, SSS, TTT or UUU, wherein a top surface of the masking layer is substantially flat compared to a height of the pattern.

ZZZ. The method of any one of Embodiments HHH, or III, wherein the masking layer is thicker in the recessed features than the plateau features.

AAAA. The method of any one of Embodiments HHH, III, JJJ, KKK, LLL, MMM, NNN, OOO, PPP, QQQ, RRR, SSS, TTT, UUU, VVV, WWW, YYY or ZZZ, wherein a surface of the second etch resist is treated with a plasma to change a chemical composition of the surface of the second etch resist.

BBBB. The method of any one of Embodiments HHH, III, JJJ, KKK, LLL, MMM, NNN, OOO, PPP, QQQ, RRR, SSS, TTT, UUU, VVV, WWW, XXX, YYY, ZZZ or AAAA, wherein a coating is applied to the patterned surface to change a chemical composition of the patterned surface, optionally wherein the coating has a thickness less than 100 nm.

CCCC. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA or BBBB, wherein the selectively etching the patterned surface removes a portion of the second etch resistant material from the patterned surface, optionally wherein the selectively etching the patterned surface removes substantially all of the second etch resistant material from the patterned surface.

DDDD. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB or CCCC, wherein the selectively etching the patterned surface is carried out using a reactive ion etch in a fluorine-containing environment followed by a reactive ion etch in an oxygen-containing environment.

EEEE. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC or DDDD, wherein at least one of the first etch resistant material or the second etch resistant material comprises silicon.

FFFF. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD or EEEE, wherein the patterned surface comprises a (meth)acrylate (co)polymer.

GGGG. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE or FFFF, wherein the selective-etching is inhibited by the second etch resist.

HHHH. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF or GGGG, wherein the selective etching is carried out using reactive ion etching, high density RF inductive plasma etching, high density linear ion plasma etching, microwave plasma etching, linear microwave plasma etching, helicon wave plasma etching, ion-beam milling, pulsed ion beam etching, pulsed reactive ion etching, or a combination thereof.

IIII. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG or HHHH, wherein the surface of the patterned surface is modified to decrease adhesion to the masking layer.

JJJJ. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH or IIII, wherein the surface of the patterned surface is modified to reduce de-wetting of the masking layer.

KKKK. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII or JJJJ, wherein the surface of the masking layer is modified to increase adhesion to the first etch resist.

LLLL. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ or KKKK, wherein the surface of the first etch resist is modified to increase adhesion to the masking layer.

MMMM. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK or LLLL, wherein the surface of the first etch resist is modified to increase adhesion to the transfer layer.

NNNN. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK, LLLL or MMMM, wherein the surface of the transfer layer is modified to increase adhesion to the first etch resist.

OOOO. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK, LLLL, MMMM, or NNNN, wherein the surface of the transfer layer is modified to increase adhesion to the second etch resist.

PPPP. The method of any one of Embodiments HHH, III, JJJ, KKK, LLL, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK, LLLL, MMMM, NNNN or OOOO, wherein the surface of the second etch resist is modified to increase adhesion to the transfer layer.

QQQQ. The method of any one of Embodiments HHH, or III, wherein the surface of the second etch resist is modified to increase adhesion to the second substrate.

RRRR. The method of any one of Embodiments HHH, III, JJJ, KKK, LLL, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK, LLLL, MMMM, NNNN, OOOO, PPPP, or QQQQ, wherein a coating is applied to modify a surface composition of one or more of: the patterned surface, the first etch layer, the transfer layer, the second etch layer or the second substrate to modify the surface, optionally wherein the coating has a thickness less than 100 nm.

SSSS. The method of any one of Embodiments HHH, III, JJJ, KKK, LLL, MMM, NNN, OOO, PPP, QQQ, RRR, SSS, TTT, UUU, VVV, WWW, XXX, YYY, ZZZ, AAAA, BBBB, CCCC, DDDD, EEEE, FFFF, GGGG, HHHH, IIII, JJJJ, KKKK, LLLL, MMMM, NNNN, OOOO, PPPP, QQQQ or RRRR, wherein the nanoscale pattern is back-filled with a high refractive index layer comprising a material having a refractive index of at least 1.7, and optionally greater than 2.0.

TTTT. The method of Embodiment SSSS, wherein the high refractive index layer is deposited by vapor deposition, atomic layer deposition, liquid coating, or a combination thereof.

UUUU. The method of Embodiment TTTT, wherein the high refractive index layer is deposited using liquid coating followed by atomic layer deposition.

VVVV. The method of any one of Embodiments SSSS, TTTT or UUUU, wherein the high refractive index layer comprises at least one of titanium, zirconium, tantalum, hafnium, niobium, or cerium; an oxide of titanium, zirconium, tantalum, hafnium, niobium, or cerium; a nitride of titanium, zirconium, tantalum, hafnium, niobium, or cerium; or a combination thereof.

WWWW. An article comprising a nano-scale pattern on a substrate, the nano-scale pattern made using the method of any one of Embodiments A through Embodiment VVVV, optionally wherein the article is an optical film.

XXXX. The article of Embodiment WWWW, wherein a height of the nano-scale features is at least five times larger than a width of the nano-scale features, optionally wherein the width of the nanoscale features is less than 500 nm.

YYYY. The article of Embodiment WWWW or XXXX, wherein the nano-scale features comprise at least one of a plurality of holes, a plurality of pillars, a plurality of recesses having a substantially flat bottom surface, a plurality of flat-topped plateau features, or a plurality of three-dimensional polygonal structures.

ZZZZ. The article of any one of Embodiments WWWW, XXXX or YYYY, wherein a depth of 90% of the nano-scale features is within +/−20 nm of an average etch depth.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1:
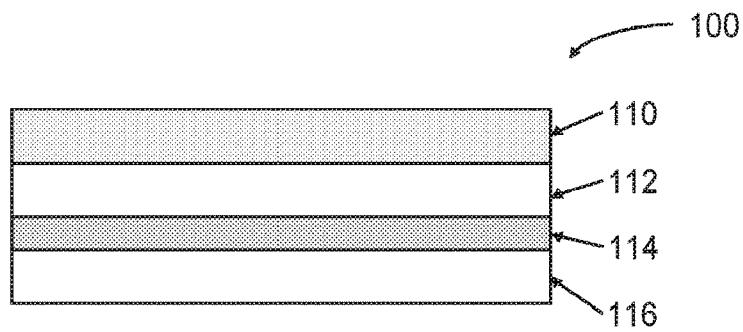
FIG. 1 is a side view of an exemplary process embodiment of the present disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that:

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "(meth)acrylate" with respect to a monomer, oligomer or means a vinyl-functional alkyl ester formed as the reaction product of an alcohol with an acrylic or a methacrylic acid.

The terms "cross-linking," "cross-linked" or "cross-linkable" refers to materials and processes in which a (co)polymer, monomer and/or oligomer undergo chemical reaction to form a three-dimensional (co)polymer network.

The term "curing" refers to a process (e.g. polymerization, cross-linking, gelling, drying, and the like) in which a (co)polymer, monomer and/or oligomer undergoes "firming." Curing may be advantageously carried out by application of heat (i.e. thermal curing), actinic radiation (e.g., ultraviolet light curing, visible light curing, infrared light curing and combinations thereof), ionizing radiation (e.g. electron beam curing, gamma radiation curing, and combinations thereof) or a combination thereof.

The term "firming" means to cause a liquid-like material to exhibit a more solid-like or resilient state, for example, by curing.

The term "micro-scale" with respect to a feature means that at least one dimension of the feature has a length-scale of at least one micrometer, but less than one millimeter.

The term "nano-scale" with respect to a feature means that at least one dimension of the feature has a length-scale of less than one micrometer.

The term "patterning tool" refers to a structured surface which can release from a cured or solidified molding material. For example, a patterning tool could be prepared using photolithography or e-beam lithography to prepare a tooling master, a metal copy thereof, (see e.g., PCT Pat. Publication No. WO 2009/002637A2 (Zhang et al.)), a polymer copy of either a tooling master or a metal copy thereof, a polymer copy of such a polymer copy, a directly written tool (see e.g., U.S. Pat. Pub. No. 2007/0065636 (Merrill et al.)) or any copy thereof, a copy of a structured liner (see e.g., U.S. Pat. Pub. No. 2014/0193612 (Yu et al.) and U.S. Pat. No. 8,460,568 (David et al.) or any copy thereof.

The terms "solidify" and "solidified" refer to a material that has undergone firming.

The term "adjoining" with reference to one or more particular layers means joined with or attached to another layer, in a position wherein the two layers are next to (i.e., adjacent to) and directly contacting each other The term "overlaying" with reference to one or more particular layers means positioner over, either in direct contact or not in direct contact (i.e., there are one or more additional layers intervening between the layers).

By using terms of orientation such as "atop", "on", "over," "covering", "uppermost", "underlying," "overlaying," and the like for the location of various elements in the disclosed multi-layer articles, we refer to the relative position of an element with respect to a horizontally-disposed, upwardly-facing substrate. However, unless otherwise indicated, it is not intended that the substrate or articles should have any particular orientation in space during or after manufacture.

By using the term "overcoated" to describe the position of a layer with respect to a substrate or other layer of an article of the present disclosure, we refer to the layer as being atop the substrate or other element, but not necessarily contacting or contiguous to either the substrate or the other layer.

By using the term "separated by" to describe the position of a layer with respect to other layers, we refer to the layer as being positioned between two other layers but not necessarily contiguous to or adjacent to either layer.

The terms "about" or "approximately" with reference to a numerical value or a shape means +/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments but is to be controlled by the limitations set forth in the claims and any equivalents thereof.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but rather are to be controlled by the limitations set forth in the claims and any equivalents thereof.

Thus, in some exemplary embodiments, the present disclosure relates to a group of novel material stacks for fine pattern transfer and the process to pattern replication tools. Each novel material stack includes an upper hard mask layer overlaying a secondary (second) pattern transfer layer, overlaying an etch-stop layer. The novel material stacks can be used to transfer micro-scale and/or nano-scale features from the pattern transfer layer, which can be generated using a variety of techniques, over its upper hard mask layer to a rigid or flexible replication tool surface through a multi-step reactive ion etch (RIE) process. Therefore, the novel material stacks can transfer fine patterns (ranging from micrometer- to nanometer-scales) from the pattern layer to a replication tool, which can be made from different materials, in a variety of shapes, etc., and for applications in different pattern replication technologies.

In other exemplary embodiments, the disclosure relates to various methods of transferring nanostructures from master tooling to films. These methods generally consist of a replication step, an etch step and lastly an optional back-filling or encapsulation step.

Material Stacks for Tool Patterning

Various material stacks useful as tools in processes for nano-scale patterning will now be described with particular reference to the drawings. Referring now to FIG. 1, an exemplary novel material stack (100) is shown having three layers: an upper hard mask layer (110); a secondary (second) pattern transfer layer (112) under and preferably adjoining the upper hard mask layer; and an etch resist (e.g., etch-stop) layer (114) under and preferably adjoining the second pattern transfer layer above the tool surface (116).

Optionally, a $4^{th}$ layer or even additional layers may be added after the features have been transferred into the pattern transfer layer to advantageously control the surface energy of the final material stack construction.

The materials for the etch resist (e.g., etch-stop) layer 114 can be, but not limited to, $Si_xC_yH_z$ (x=1, y=1~4, z=1~4), or $Si_xC_yN_zH_n$ (x=1, y=1~4, z=0~1, n=1~4), $Si_xN_y$ (x=1, y=0~1), $SiO_x$ (x=1~2), $Si_xO_yN_z$ (x=1, y=1~2, z=0~1), $SiH_x$ (x=1~4), and the like.

The materials for the second pattern transfer layer 112 can be, but are not limited to, diamond-like carbon (DLC), diamond-like glass (DLG), or different kinds of (meth) acrylate (co)polymers or resins.

The materials for the upper hard mask layer 110 can be made from tungsten (W), iridium (Ir), platinum (Pt), ruthenium (Ru), osmium (Os), rhenium (Re), titanium nitride (TiN), aluminum oxide ($Al_2O_3$), aluminum and chromium (Al/Cr) metal alloys, etc. It can also be made from $Si_xC_yH_z$ (x=1, y=1~4, z=1~4), or $Si_xC_yN_zH_n$ (x=1, y=1~4, z=0~1, n=1~4), $Si_xN_y$ (x=1, y=0~1), $SiO_x$ (x=1~2), $Si_xO_yN_z$ (x=1, y=1~2, z=0~1), $SiH_x$ (x=1~4), and the like.

To build up the novel material stacks, different processing techniques may be used to obtain each stack layer, depending on the chemical and physical nature of the tool surface 116, application of the stack, and the thickness of each stacking layer.

Preferably, but not necessarily, to obtain an etch resist (e.g., etch-stop) layer of $Si_xC_yH_z$ (x=1, y=1~4, z=1~4), or $Si_xC_yN_zH_n$ (x=1, y=1~4, z=0~1, n=1~4), $Si_xN_y$ (x=1, y=0~1), $SiO_x$ (x=1~2), $Si_xO_yN_z$ (x=1, y=1~2, z=0~1), $SiH_x$ (x=1~4), or the like, a plasma enhanced chemical deposition method (PECVD), chemical vapor deposition (CVD) method, atomic layer deposition (ALD) method, physical vapor deposition method (PVD) method, or a combination thereof or the like can be used depending on the substrate type and the thickness of the etch-stop layer. An atmospheric pressure atomic layer deposition process may be preferred, as a vacuum system would generally not be required for such a process.

The thickness of the etch resist (e.g., etch-stop) layer may range from about 1 nm to about 200 nm, more preferably, from about 2 nm to about 50 nm, and most preferably from about 2.5 nm to about 10 nm.

To build up a second pattern transfer layer right above the etch resist (e.g., etch-stop) layer, a variety of methods can be applied depending on the layer material, the material type of the replication tool and the layer thickness. Specifically, a DLC or DLG layer can be obtained using a CVD method, a PECVD method, or a PVD method, and the like. A CVD method may be preferred.

To build up a second pattern transfer layer of acrylate resins, different techniques can be used depending on the material type of the tool surface and the layer thickness. Preferably, it can be obtained using a variety of chemical solution deposition methods or lamination techniques, such as a roll-to-roll coating technique, a cast coating method, a spin-coating method, or a lamination process, and the like.

The second pattern transfer layer may have a thickness ranging from about sub 10 nm to 10 μm, more preferably, from about 20 nm to 5 μm, and most preferably, from about 50 nm to about 3 μm.

The second pattern transfer layer may comprise any number of sublayers, with or without being separated by other inter layers. In FIGS. 1 and 2, one thick second pattern transfer layer is illustrated. However, it is readily understood that the specific numbers of second pattern transfer sublayers individually applied to build up the second pattern transfer layer and optional inter layers are not limited in any manner.

To obtain an upper hard mask layer of W, or Ir, or Pt, or Ru, or Os, or Re, a variety of deposition methods can be used considering the material type of the tool surface and the layer thickness. Suitable deposition methods may include, but are not limited to, a chemical vapor deposition (CVD) method, a sputter coating method, a physical vapor deposition (PVD method, an atomic layer deposition (ALD) method, or a combination thereof, or the like. An atmospheric pressure atomic layer deposition process may be preferred, as a vacuum system would generally not be required for such a process.

To obtain an upper hard mask layer of TiN, a variety of deposition methods can be used considering the material type of the tool surface and the layer thickness. Suitable deposition methods may include, but are not limited to, a CVD method, a PVD method, an ALD method, a combination thereof, or the like.

To obtain an upper hard mask layer of $Al_2O_3$, a variety of deposition methods can be used considering the material type of the tool surface and the layer thickness. The suitable deposition methods may include, but not limited to, an anodizing method, a CVD method, an ALD method, a combination thereof, or the like.

To obtain an upper hard mask layer of Al/Cr alloy, a variety of deposition methods can be used considering the material type of the tool surface and the layer thickness. The suitable deposition methods may include, but not limited to, a CVD method, a PVD method, a combination thereof, or the like.

The upper hard mask layer may have a thickness ranging from about sub 2 nm to about 200 nm, preferably, from about 5 nm to about 50 nm, and most preferably, from about 10 nm to about 20 nm.

Methods for Forming the Pattern Layer on the Material Stacks for Tool Patterning The pattern layer overlaying the upper hard mask of the novel material stacks can be formed using different pattern printing, transferring or replication technologies, which may include, but not limited to, a photo-, e-beam or nanoimprint lithographic methods; a micro-contact printing method (μCP); a superionic solid-state stamping ($S^4$) approach, and the like. Lithographic methods may be preferred for applications in which the nano-scale features of a master will be replicated in a tooling film. Micro-contact printing methods may be preferred where the master is selected to be a patterned roller.

The pattern layer can be built up from a variety of materials depending on the technique used to generate the pattern layer. Therefore, it may include, but not limited to, noble metals, liquid resist coating, dry film lamination layer, and the like.

Pattern Transfer Process on the Material Stacks for Tool Patterning

Figure 2A:
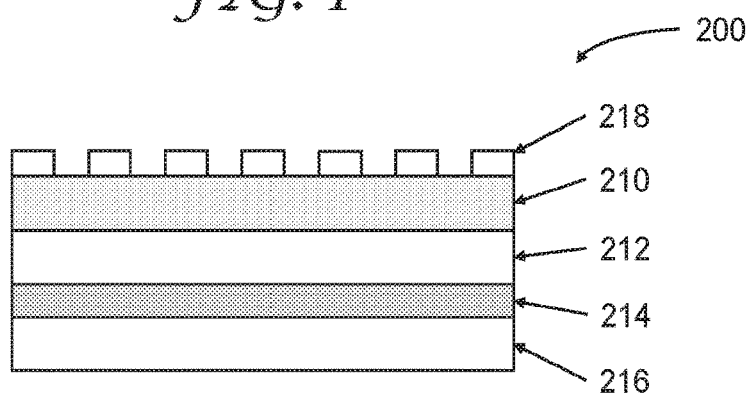
FIGS. 2A-2C are side views of another exemplary process embodiment of the present disclosure.
Figure 2B:
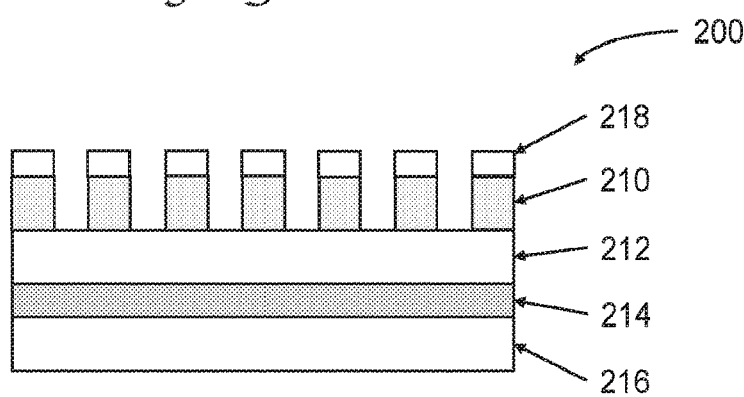
Figure 2C:
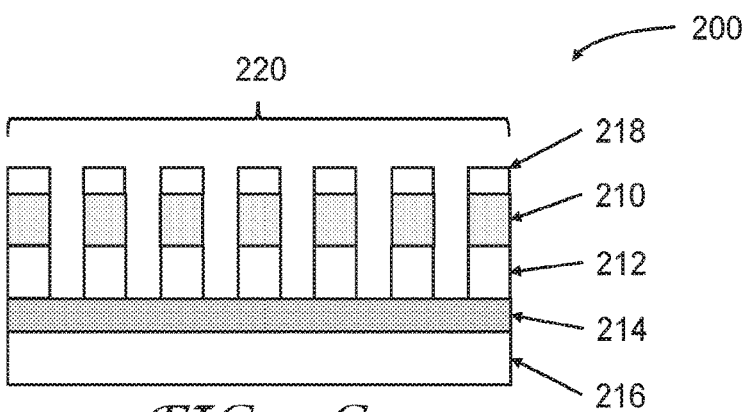

Referring now to FIGS. 2A-2C, an exemplary embodiment of a pattern transfer process of the present disclosure is shown. An exemplary novel material stack (200) is shown having three layers: an upper hard mask layer (210); a secondary (second) pattern transfer layer (212) under and preferably adjoining the upper hard mask layer; and an etch resist (e.g., etch-stop) layer (214) under and preferably adjoining the second pattern transfer layer above the tool surface (216). The process may be used to transfer a pattern from the pattern layer (218) on the top surface of the multi-layer stack stack to the upper hard mask layer (210) directly beneath. A first reactive ion etching step (RIE-1) as illustrated in FIG. 2B may be carried out using an etching chemistry that can be chosen based on the etching selectivity on the pattern layer on the top, the upper hard mask layer itself, and the second pattern transfer layer directly beneath.

Preferably, but not necessarily, the RIE-1 step can be carried out using some fluorine-containing chemistry, or other halogen-containing chemistries like chloride-containing chemistry, or their mixture alone or with other gases (such as Ar, He, $N_2$, $O_2$) and the like, to transfer pattern through an upper hard mask layer.

The second pattern transfer layer is opened through for pattern transfer by a second RIE step (RIE-2) as illustrated in FIG. 2C. The etching chemistry for RIE-2 can be chosen regarding the etching selectivity on the upper hard mask layer directly above, the second pattern transfer layer itself, and the etch-stop layer right beneath. Preferably, but not necessarily, for the second pattern transfer layer made from diamond-like carbon (DLC), diamond-like glass (DLG) or a (meth)acrylate (co)polymer, the RIE-2 step can be carried out using an oxygen-containing chemistry, or its mixture with other chemicals, e.g. fluorine-containing chemicals at certain conditions. For example, but not necessarily, DLC, DLG and a (meth)acrylate (co)polymer can all be RIE etched using $O_2$ with or without doping of $NF_3$ with certain controls.

To protect the tool surface below in many cases, the etch-stop layer may preferably not be etched during the pattern transfer process.

As for the pattern layer on the upper hard mask layer, it may be, but is not necessarily, stripped off using some chemical method after the first RIE step finished patterning the upper hard mask layer, or may be consumed through the RIE-1 or/and RIE-2 steps, depending on its chemical and physical nature (metal, noble metal, cured photo resist, etc.) as well as the multi-step RIE process.

After the pattern features (220) are transferred to the tool surface as described above, it is optional to have a $4^{th}$ layer to control the surface energy of the final construction. This layer may be deposited a variety of methods, including, but not limited to, a plasma deposition method.

Figure 3A:
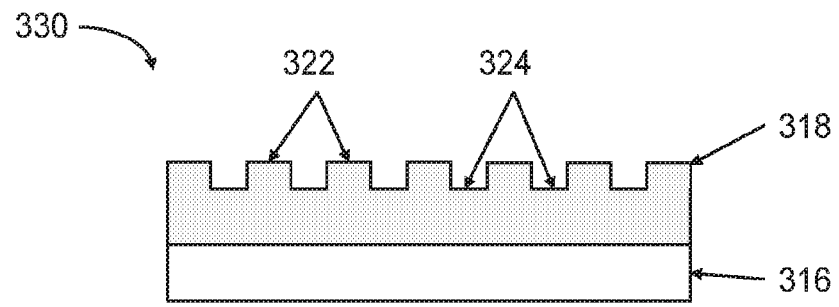
FIGS. 3A-3F are side views of an additional exemplary process embodiment of the present disclosure.
Figure 3B:
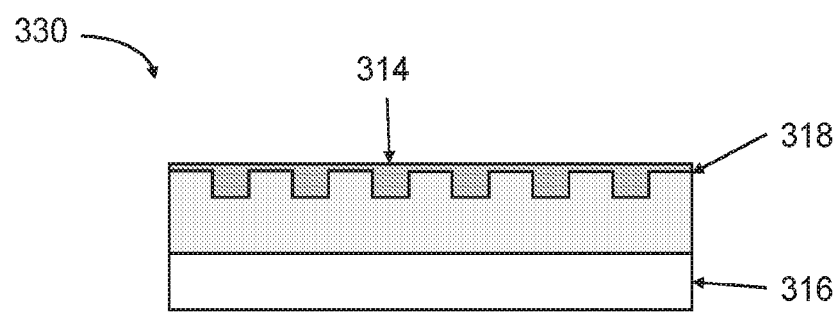
Figure 3C:
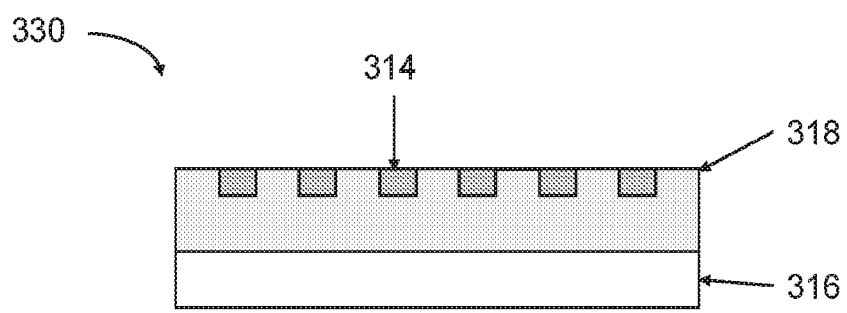
Figure 3D:
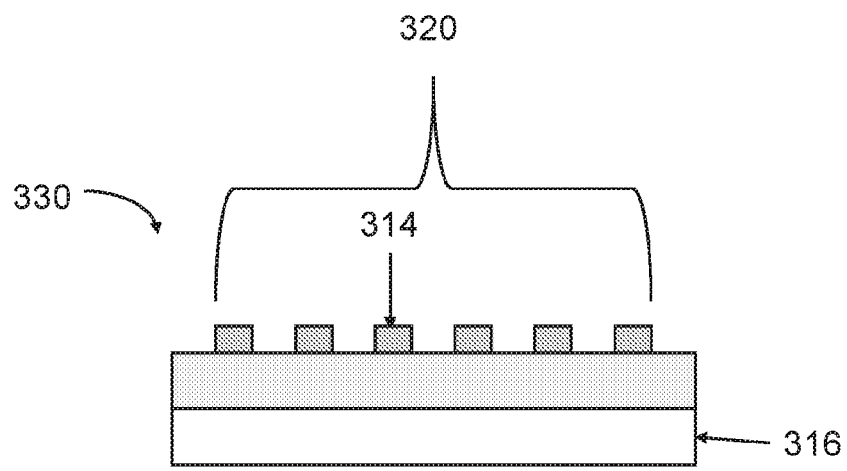
Figure 3E:
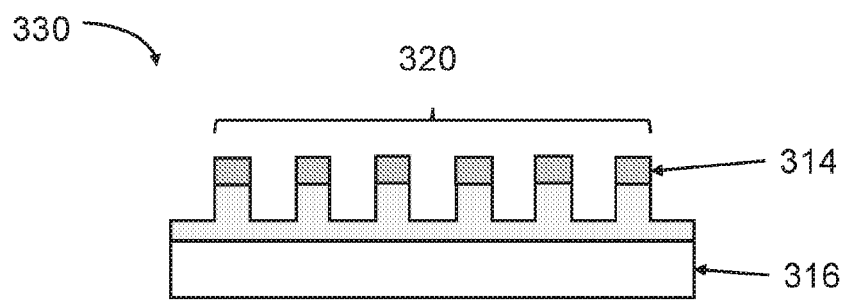
Figure 3F:
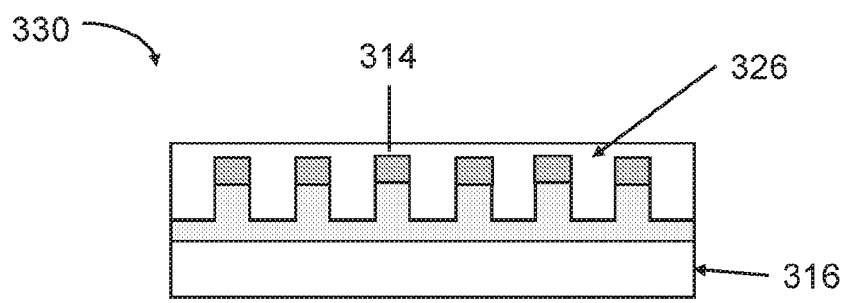

Methods of Producing a Nano-Scale Pattern on a Substrate
One-Layer Method with Capillary Leveling Referring now to FIGS. 3A-3F, in one exemplary embodiment, the present disclosure describes a method of forming an etched nano-scale pattern on a substrate (316), the method including: (a) providing a patterned surface (330) comprising an etchable material (318) on a substrate (316), the patterned surface including one or more recessed features (324), each recessed feature adjoining at least one plateau feature (322) extending away from the recessed feature; (b) depositing an etch resist (314) comprising an etch resistant material on at least a portion of the patterned surface including the at least one recessed feature and at least one plateau feature; (c) etching the etch resist (314) to expose the plateau feature (322); (d) selectively etching the patterned surface to remove at least a portion of the at least one plateau feature, thereby forming the etched nano-scale pattern (320) on the substrate and € optionally etching the plateau features (322) of the etchable material (318) to a height below the recessed features (324). In some embodiments, the etched nanoscale pattern can be then filled with high index material (326) as represented in FIG. 3F. In some embodiments, the etched nano-scale pattern includes a multiplicity of nano-scale features. In certain such embodiments, each nano-scale feature exhibits at least one dimension from 1 nm to 900 nm.

One-Layer Method with Low-Land Replication

Figure 4A:
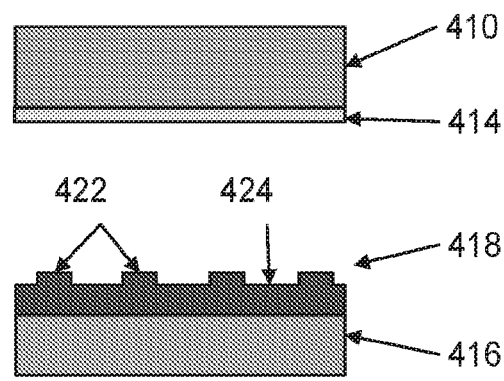
FIGS. 4A-4G are side views of a further exemplary process embodiment of the present disclosure.
Figure 4B:
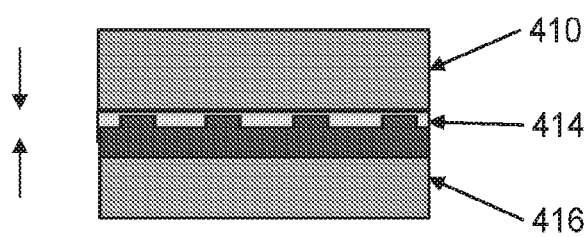
Figure 4C:
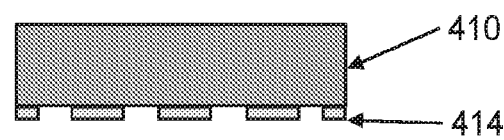
Figure 4D:
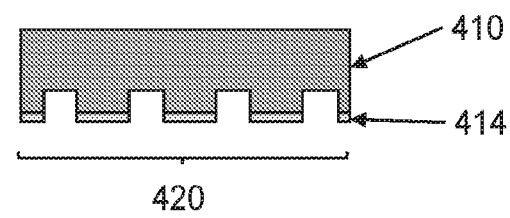
Figure 4E:
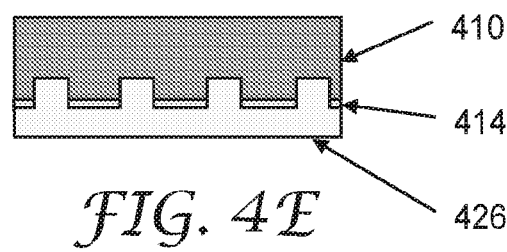
Figure 4F:
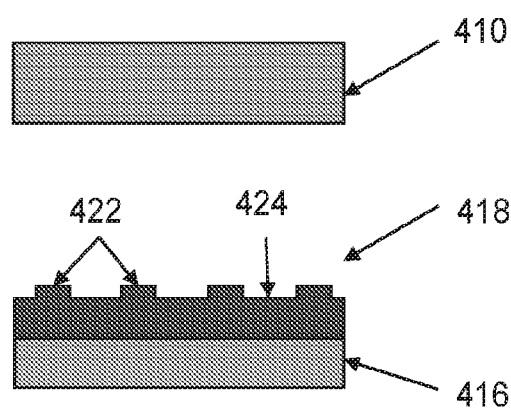

Referring to FIGS. 4A-4E, in other exemplary embodiments, the present disclosure describes a method of forming an etched nano-scale pattern on a substrate (410), the method including: (a) providing a substrate (410) and depositing an etch resist (414) comprising an etch resistant material on at least a portion of the substrate; (b) imprinting into the etch resist the patterned surface (418) on the support layer (416) from step (a), the patterned surface including one or more recessed features (424), each recessed feature adjoining at least one plateau feature (422) extending away from the recessed feature, as shown in FIG. 4A; and (c) etching the patterned surface of the etch resist; and (d) optionally selectively etching a portion of the substrate (410) to remove at least a portion of at least one plateau feature (422), thereby forming an etched nano-scale pattern on the substrate (410). In some embodiments, the etched nanoscale pattern can be then filled with high index material (426) as represented in FIG. 4E. In some embodiments, the etched nano-scale pattern includes a multiplicity of nano-scale features. In certain such embodiments, each nano-scale feature exhibits at least one dimension from 1 nm to 900 nm.

Referring to FIGS. 4F, 4G and 4B-4E, in other exemplary embodiments, the present disclosure describes a method of forming an etched nano-scale pattern on a substrate (410), the method including: (f) providing a patterned surface (418) on a support layer (416), the patterned surface including one or more recessed features (424), each recessed feature adjoining at least one plateau feature (422) extending away from the recessed feature; (g) depositing an etch resist (414) on the patterned surface (418); (b) laminating a substrate (410) to the etch resist (414); (c) removing the support layer (416) and etching the patterned surface of the etch resist; and (d) optionally selectively etching a portion of the substrate (410) to remove at least a portion of at least one plateau feature (422), thereby forming an etched nano-scale pattern on the substrate (410). In some embodiments, the etched nanoscale pattern can be then filled with high index material (426) as represented in FIG. 4E. In some embodiments, the etched nano-scale pattern includes a multiplicity of nano-scale features. In certain such embodiments, each nano-scale feature exhibits at least one dimension from 1 nm to 900 nm.

Figure 4G:
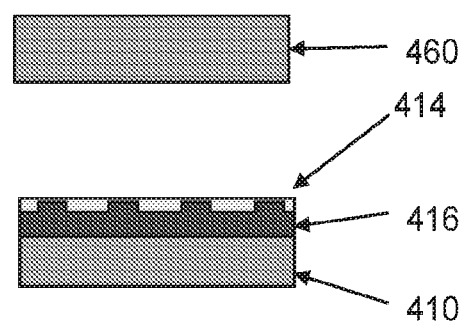

In certain exemplary embodiments, the etched nano-scale pattern on substrate (410) may be useful as a tooling master to replicate the nano-scale pattern into the surface of a second substrate 460, as shown in FIG. 4G.

Single Replicated Resist Layer with Precision Land and Etch Stop Layer

Figure 5A:
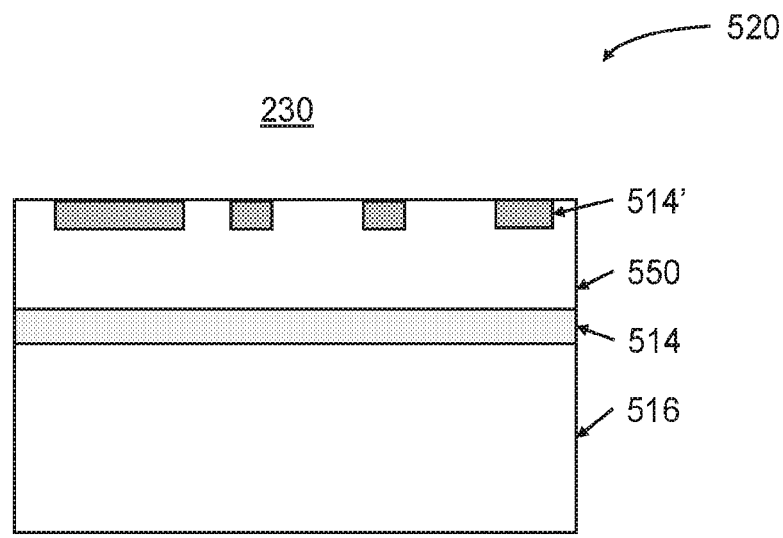
FIGS. 5A-5B are side views of yet another exemplary process embodiment of the present disclosure.
Figure 5B:
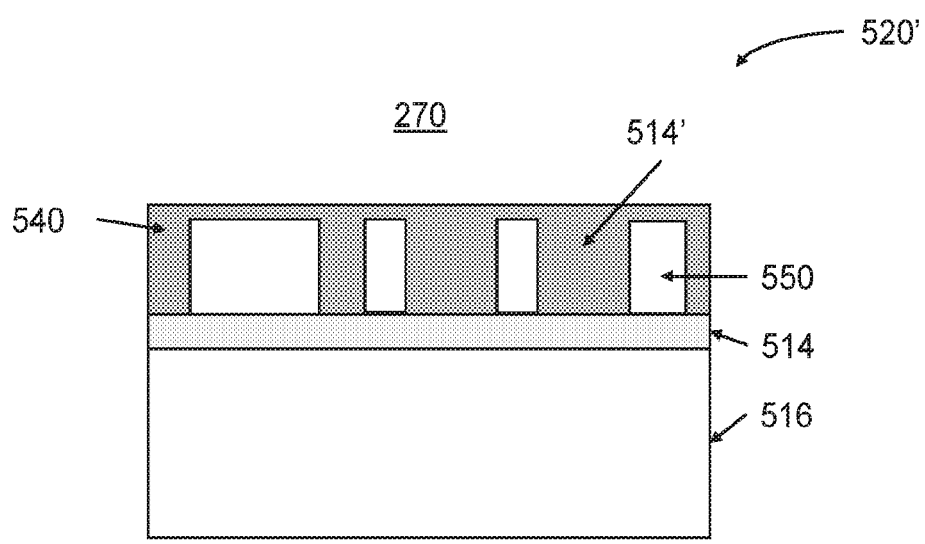
Figure 6A:
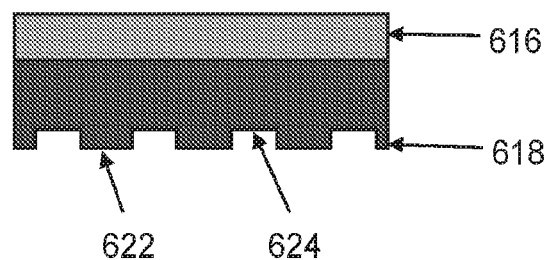
FIGS. 6A-6J are side views of another additional exemplary process embodiment of the present disclosure.
Figure 6A:
Figure 6B:
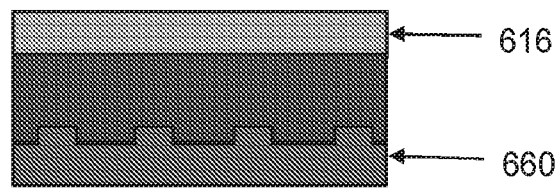
Figure 6B:
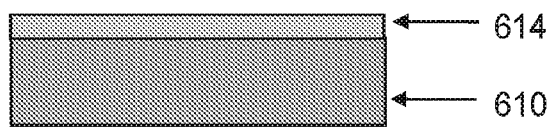
Figure 6C:
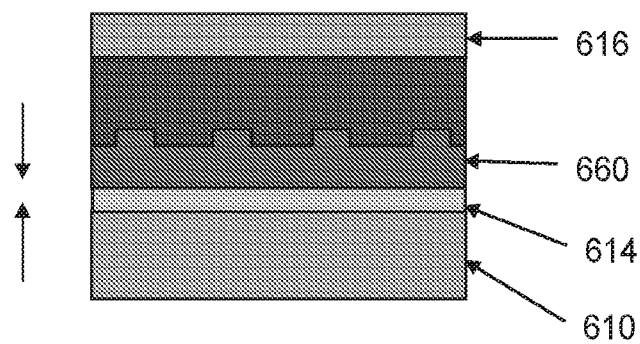
Figure 6D:
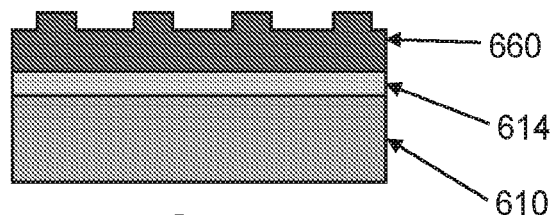
Figure 6E:
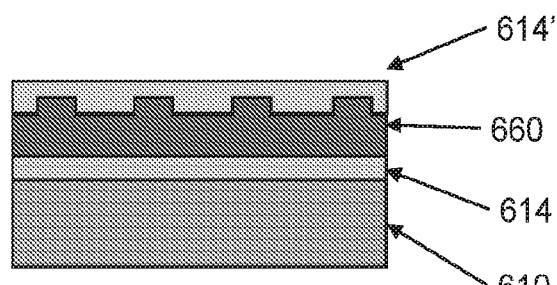
Figure 6F:
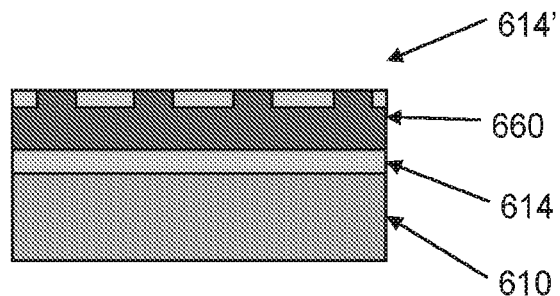
Figure 6G:
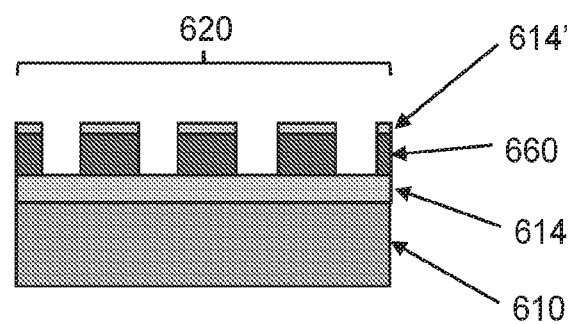
Figure 6H:
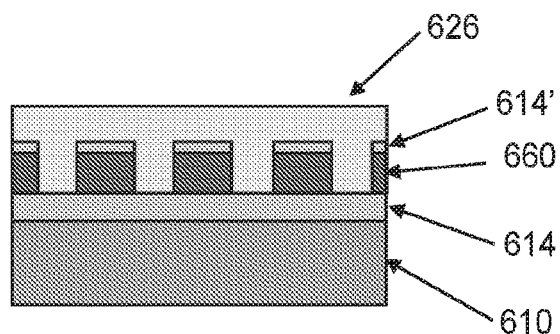
Figure 6I:
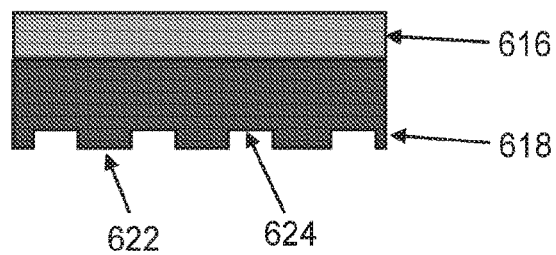
Figure 6I:
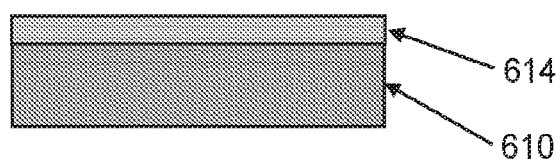
Figure 6J:
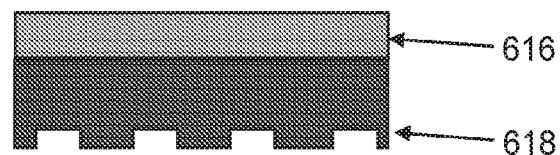
Figure 6J:
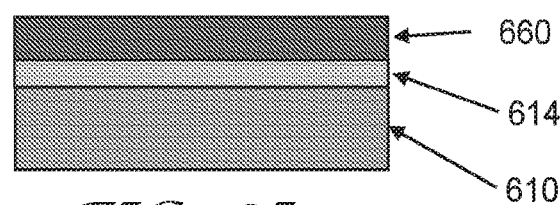

As shown in FIGS. 5A and 5B, two distinct articles (a) (230; 520) and (b) (270; 520') can be made using the following methods. The articles include a (co)polymeric support film (516), an etch resist (i.e., etch stop layer 514), a nano-replicated layer with a precision land area (550), and a planarized second etch resist layer (514')

Once the etch has progressed to remove at least the land area, structure 230 is obtained. By using a selective etch process and back-filling with a high refractive index material (540), this method can be used to construct article 270. The substrate is a (co)polymeric support film, the first etch resist is the etch stop layer, and the patterned layer is a nano-replicated resin layer.

Three-Layer Method with Capillary Leveling and Tool Peel Only

With reference to FIGS. 6A-6H, in an additional embodiment, the present disclosure describes a method of forming an etched nano-scale pattern on a substrate 610), the method including: (a) providing a substrate (610) and a support layer (616) with a patterned layer (618), the patterned layer having a patterned surface including one or more recessed features (624), each recessed feature adjoining at least one plateau feature (622); (b) depositing a first etch resist (614) comprising an etch resistant material on at least a portion of the substrate (610) and coating the support layer (616) with a transfer layer (660); (c) laminating the etch resist (614) to the transfer layer (660); (d) removing the support layer (616); (e) depositing a second etch resist (614') comprising an etch resistant material on at least a portion of the transfer layer (660); (f) etching the patterned surface of the etch resist; and (g) optionally selectively etching a portion of the transfer layer (660) to remove at least a portion of the at least one plateau feature, thereby forming an etched nano-scale pattern on the first etch resist (614). In some embodiments, the etched nanoscale pattern can be then filled with high index material (626) as represented in FIG. 4H. In some embodiments, the etched nano-scale pattern includes a multiplicity of nano-scale features. In certain such embodiments, each nano-scale feature exhibits at least one dimension from 1 nm to 900 nm.

Referring to FIGS. 6I, 6J, and 6C-6H, in other exemplary embodiments, the present disclosure describes a method of forming an etched nano-scale pattern on a substrate (610), the method including: (i) providing a substrate (610) and a support layer (616) with a patterned layer (618), the patterned layer having a patterned surface including one or more recessed features (624), each recessed feature adjoining at least one plateau feature (622); depositing an etch resist (614) comprising an etch resistant material on at least a portion of the substrate; (j) depositing a transfer layer (660) on the etch resist (614); (c) imprinting into the transfer layer (660) the patterned surface (618) on a support layer (616); (d) removing the support layer (616); (e) depositing a second etch resist (614') comprising an etch resistant material on at least a portion of the transfer layer (660); (f) etching the patterned surface of the etch resist; and (g) optionally selectively etching a portion of the transfer layer (660) to remove at least a portion of the at least one plateau feature, thereby forming an etched nano-scale pattern (620) on the first etch resist (614). In some embodiments, the etched nanoscale pattern can be then filled with a high index material (626) as represented in FIG. 4H. In some embodiments, the etched nano-scale pattern includes a multiplicity of nano-scale features. In certain such embodiments, each nano-scale feature exhibits at least one dimension from 1 nm to 900 nm.

Near Zero Land Resist Layer with Precision Pattern Transfer Layer

Figure 7A:
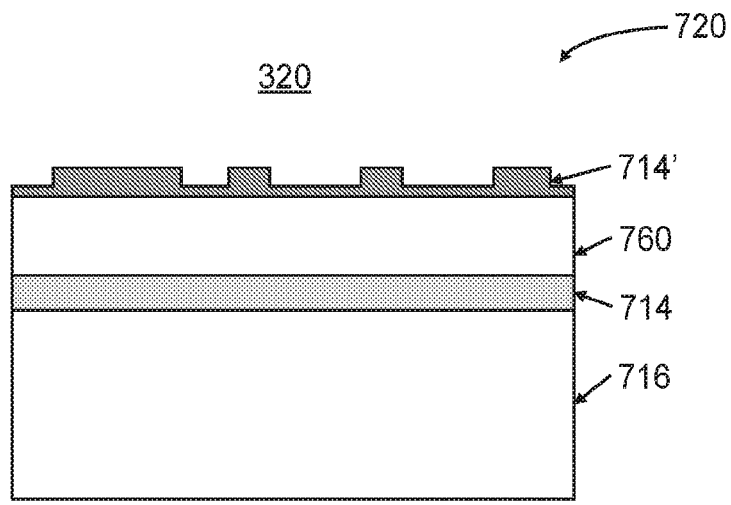
FIGS. 7A-7B are side views of still another exemplary process embodiment according to an exemplary embodiment of the present disclosure.
Figure 7B:
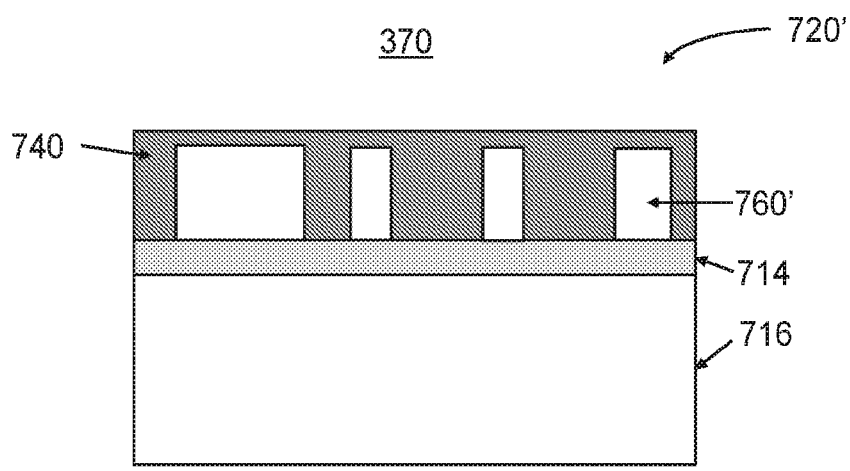

As shown in FIG. 7, two distinct articles (a) (320; 720) and (b) (370; 720') can be made using the following methods. The articles include a (co)polymeric support film (716), an etch resist (i.e., etch stop layer 714), a transfer layer (760) and a patterned second etch resist layer (714'). Once the etch has progressed, article (320; 720) is obtained. By using a selective etch process and back-filling with a high refractive index material (740), this method can be used to construct article (370; 720'). The substrate is a (co)polymeric support film, the first etch resist is the etch stop layer, and the patterned layer is a nano-replicated resin layer.

Articles (a) (320; 720) and (b) (370; 720') differ from the preceding articles (a) (230; 520) and (b) (270; 520') in that the transfer layers for Articles (320; 720) and (b) (370; 720') can be selected from a larger array of materials because the transfer layer does not need to be replicated.

Three-Layer Method with Low-Land Replication

This method can be used to make Article (320). By using a selective etch process and back-filling with a high refractive index material, this method can be used to construct article (370). The order of the coating of resist layers and transfer layer is arbitrary and can be done as described in previous references.

Figure 8A:
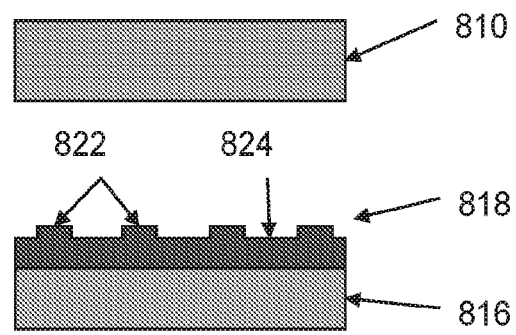
FIGS. 8A-8F are side views of yet a further exemplary process embodiment of the present disclosure.
Figure 8B:
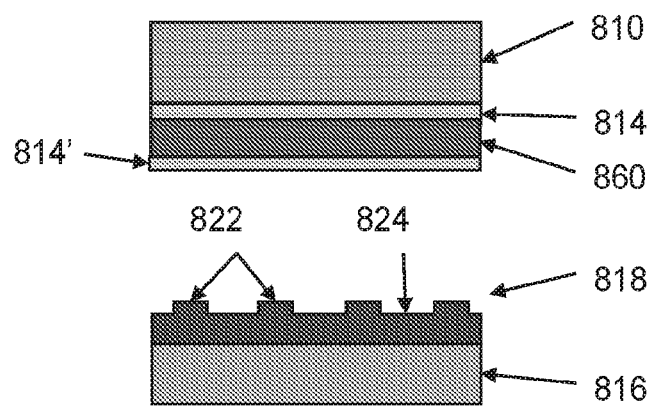
Figure 8C:
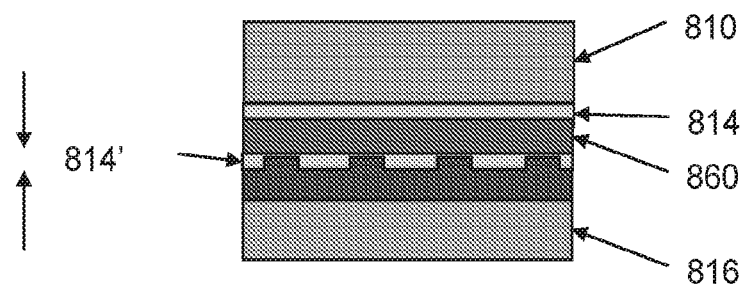
Figure 8D:
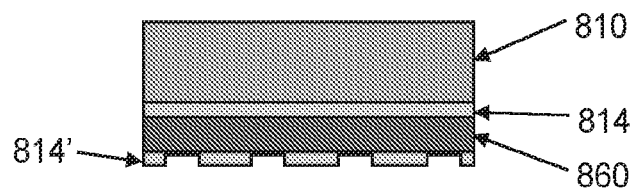
Figure 8E:
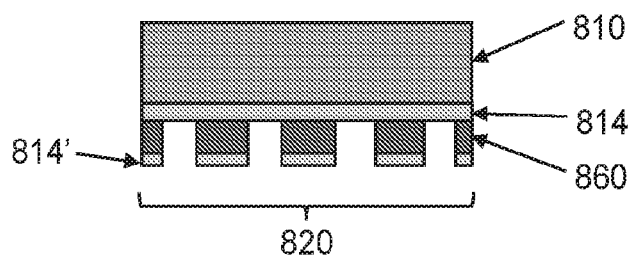
Figure 8F:
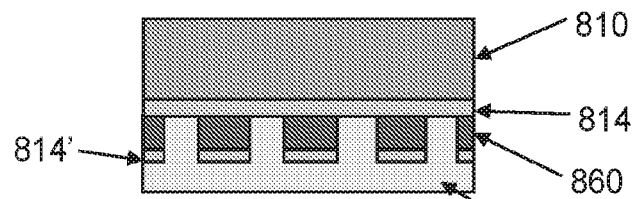

Thus, in another exemplary embodiment illustrated in FIG. 8A-8E, the present disclosure describes a method of forming an etched nano-scale pattern on a substrate (810), the method including: (a) providing a patterning tool (816) with a patterned surface (818) including one or more recessed features (824), each recessed feature adjoining at least one plateau feature (822) extending away from the recessed feature; providing a substrate (810); (b) depositing a first etch resist (814) comprising a first etch resistant material on at least a portion of the substrate; overlaying the first etch resist with a transfer layer (860) in contact with the first etch resist; overlaying the transfer layer with a second etch resist (814') comprising a second etch resistant material in contact with the transfer layer; (c) imprinting into the second etch resist the patterned surface including one or more recessed features, each recessed feature adjoining at least one plateau feature extending away from the recessed feature; (d) removing the patterning tool (816); and (e) selectively etching the patterned surface of the second etch resist to remove at least a portion of the second etch resistant material and optionally a portion of the transfer layer (860) to remove at least a portion of the at least one plateau feature, thereby forming an etched nano-scale pattern (820) on the substrate. In some embodiments, the etched nano-scale pattern includes a multiplicity of nano-scale features. In some embodiments, the etched nanoscale pattern can be then filled with a high index material (826) as represented in FIG. 8F. In certain such embodiments, each nano-scale feature exhibits at least one dimension from 1 nm to 900 nm.

Three-Layer Method with Capillary Leveling

Figure 10A:
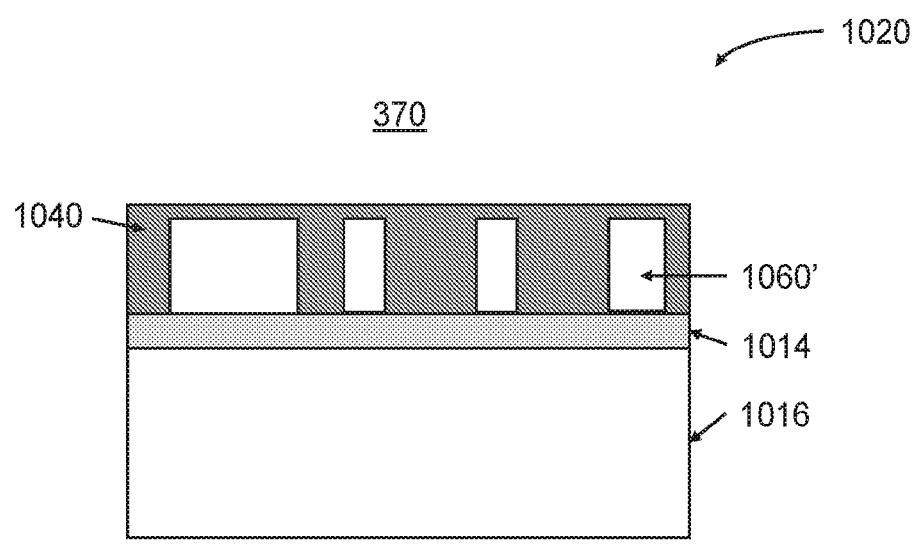
FIGS. 10A-10B are side views of another further exemplary process embodiment of the present disclosure.
Figure 10B:
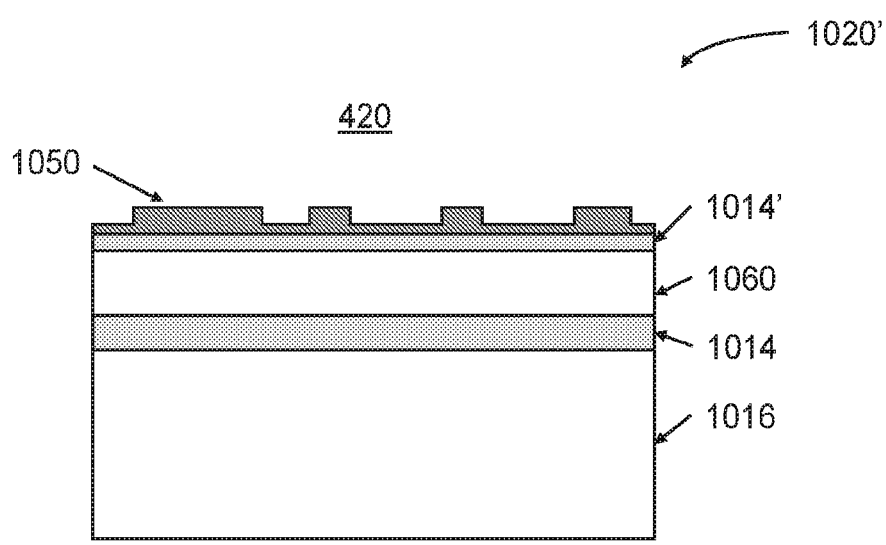

As shown in FIG. 10(*a*), this method can be used to make (a) (370; 1020). By using a selective etch process and back-filling with a high refractive index material, this method can be used to construct article (370). The order of the coating of resist layers and transfer layer is arbitrary and can be done as described in previous references.

In other exemplary embodiments shown in FIG. 9, the present disclosure describes three methods of forming an etched nano-scale pattern on a substrate (910), the method including: (a) providing a first substrate (916) having a patterned surface (918), the patterned surface including one or more recessed features (924), each recessed feature adjoining at least one plateau feature (922) extending away from the recessed feature; (b) depositing a first etch resist (914) comprising a first etch resistant material on at least a portion of the patterned surface; (c) overlaying the first etch resist with a transfer layer (960) contacting the first etch resist; (d) optionally overlaying the transfer layer with a second etch resist (914') comprising a second etch resistant material contacting the transfer layer, (e) optionally overlaying the transfer layer with one or more adhesion promoting layers (932); (f) overlaying the second etch resist with the substrate (910); (g) removing the patterned surface (918) of the first substrate (916) from the first etch resist (914) to create a patterned surface of the first etch resist on the second substrate; (h) etching the patterned surface of the first etch resist to remove at least a portion of the first etch resistant material, thereby forming the etched nano-scale pattern (920) on the second substrate and (i) optionally etching to expose at least a portion of the second etch resistant material. In some embodiments, the etched nanoscale pattern can be then filled with a high index material (926) as represented in FIG. 9J. In some embodiments, the etched nano-scale pattern includes a multiplicity of nano-scale features. In certain such embodiments, each nano-scale feature exhibits at least one dimension from 1 nm to 900 nm.

Figure 9A:
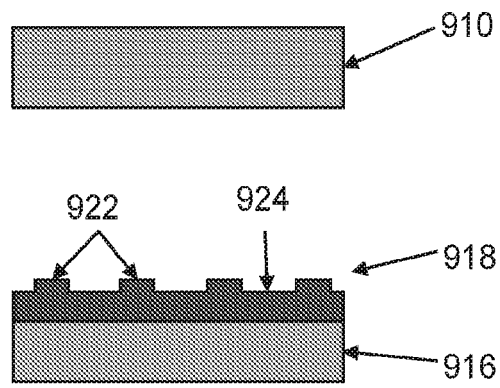
FIGS. 9A-9M are side views of an additional further exemplary embodiment of the present disclosure.
Figure 9B:
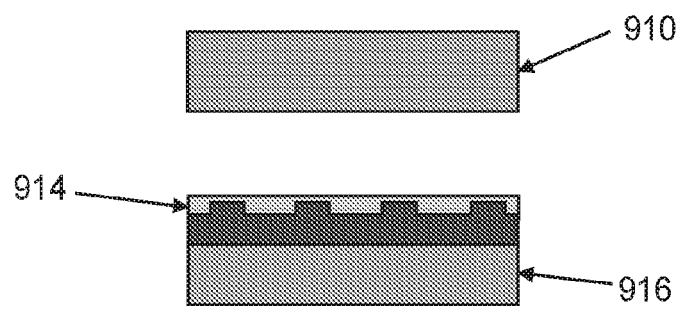
Figure 9C:
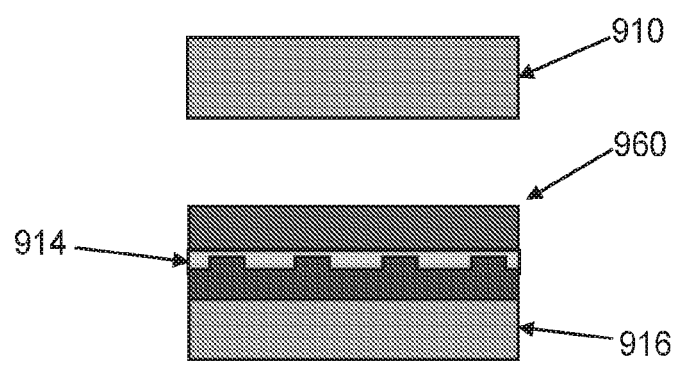
Figure 9D:
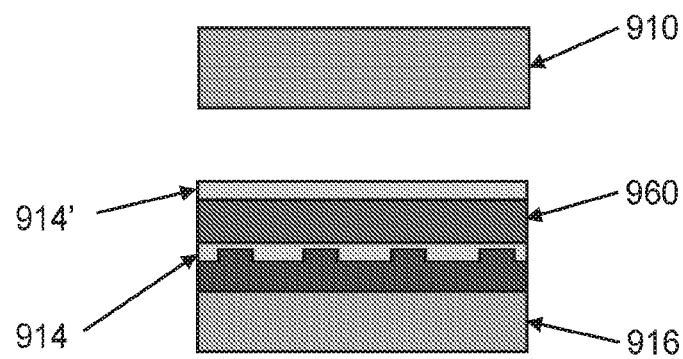
Figure 9E:
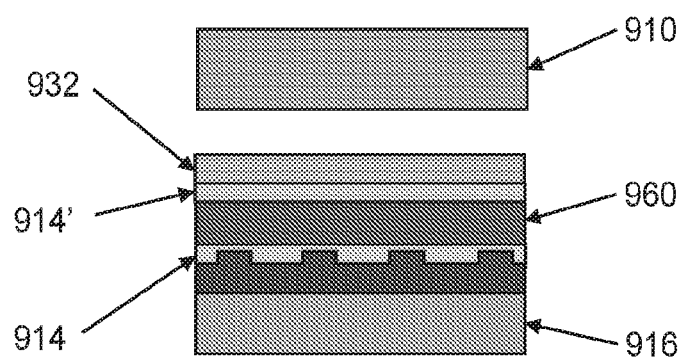
Figure 9F:
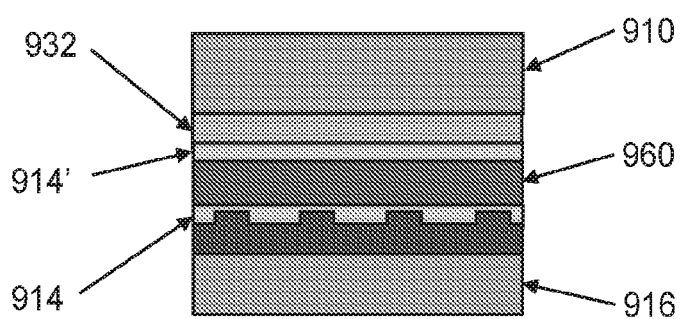
Figure 9G:
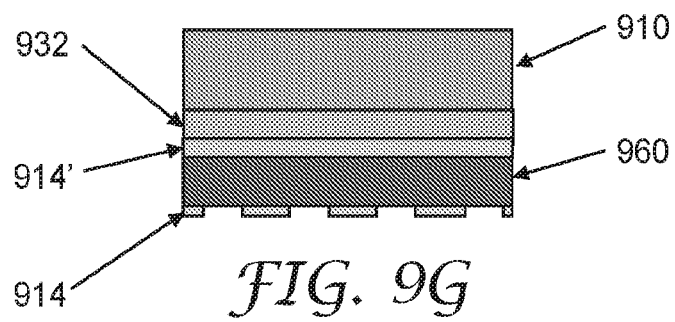
Figure 9H:
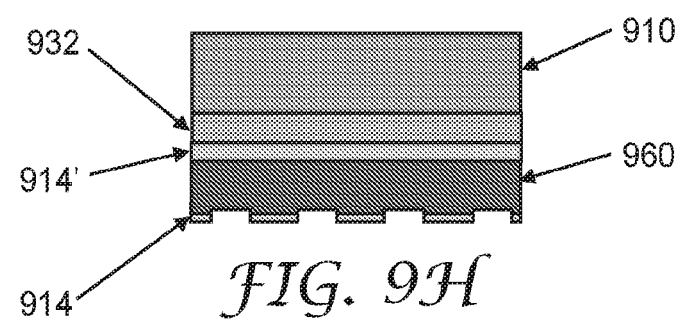
Figure 9I:
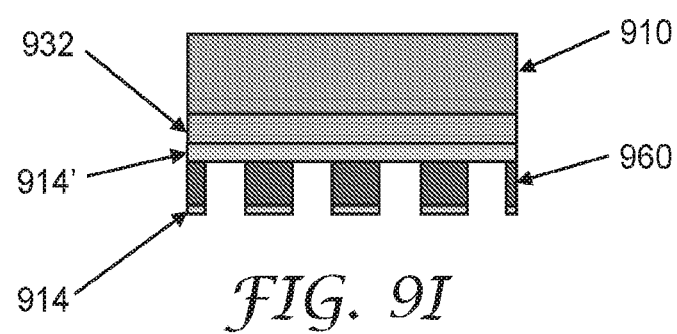
Figure 9J:
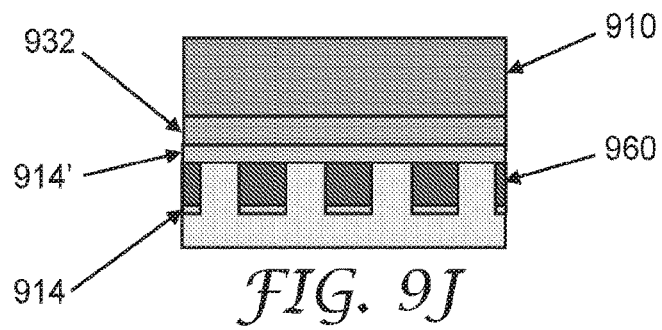
Figure 9K:
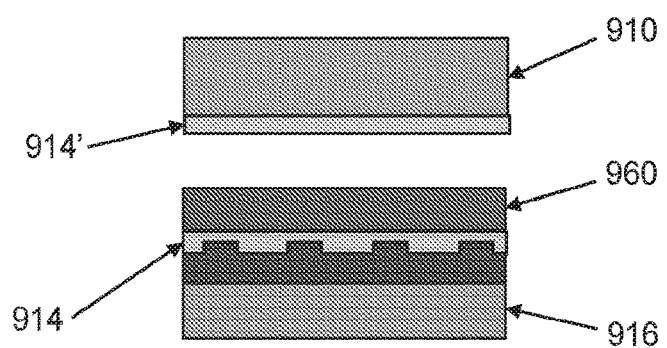
Figure 9L:
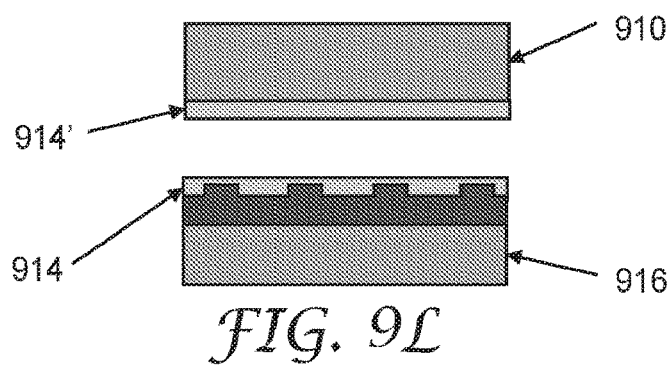
Figure 9M:
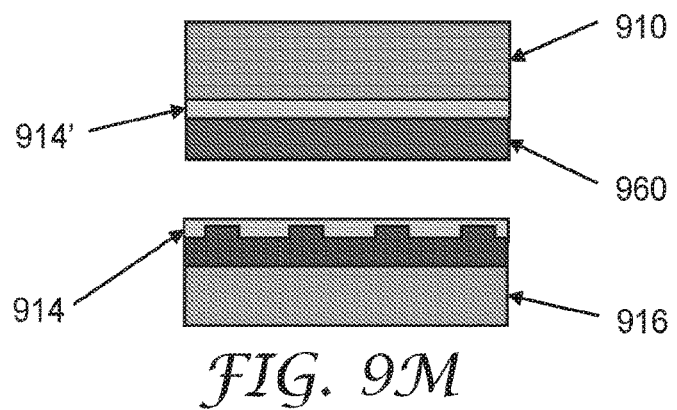

Referring to FIGS. 9A-9C, 9K, 9F-9J, in other exemplary embodiments, the present disclosure describes a method of forming an etched nano-scale pattern on a substrate (910), the method including: (a) providing a first substrate (916)

having a patterned surface (918), the patterned surface including one or more recessed features (924), each recessed feature adjoining at least one plateau feature (922) extending away from the recessed feature; (b) depositing a first etch resist (914) comprising a first etch resistant material on at least a portion of the patterned surface; (c) overlaying the first etch resist with a transfer layer (960) contacting the first etch resist; (k) contacting the substrate (910) with a second etch resist (914') comprising a second etch resistant material, (f) overlaying the second etch resist (914') with the transfer layer (960); (g) removing the patterned surface (918) of the first substrate (916) from the first etch resist (914) to create a patterned surface of the first etch resist on the second substrate; (h) etching the patterned surface of the first etch resist to remove at least a portion of the first etch resistant material, thereby forming the etched nano-scale pattern (920) on the second substrate and (i) optionally etching to expose at least a portion of the second etch resistant material. In some embodiments, the etched nanoscale pattern can be then filled with a high index material (926) as represented in FIG. 9J. In some embodiments, the etched nano-scale pattern includes a multiplicity of nano-scale features. In certain such embodiments, each nano-scale feature exhibits at least one dimension from 1 nm to 900 nm.

Referring to FIGS. 9A-9B, 9L-9M, 9F-9J, in other exemplary embodiments, the present disclosure describes a method of forming an etched nano-scale pattern on a substrate (910), the method including: (a) providing a first substrate (916) having a patterned surface (918), the patterned surface including one or more recessed features (924), each recessed feature adjoining at least one plateau feature (922) extending away from the recessed feature; (b) depositing a first etch resist (914) comprising a first etch resistant material on at least a portion of the patterned surface; (l) contacting the substrate (910) with the second etch resist (914'); (m) contacting the second etch resist with the transfer layer (960); (f) overlaying the first etch resist (914) with the transfer layer (960); (g) removing the patterned surface (918) of the first substrate (916) from the first etch resist (914) to create a patterned surface of the first etch resist on the second substrate; (h) etching the patterned surface of the first etch resist to remove at least a portion of the first etch resistant material, thereby forming the etched nano-scale pattern (920) on the second substrate and (i) optionally etching to expose at least a portion of the second etch resistant material. In some embodiments, the etched nanoscale pattern can be then filled with a high index material (926) as represented in FIG. 9J. In some embodiments, the etched nano-scale pattern includes a multiplicity of nano-scale features. In certain such embodiments, each nano-scale feature exhibits at least one dimension from 1 nm to 900 nm.

Replicated Resist Layer with Near Zero Land and Precision Pattern Transfer Layer Four-Layer Method with Capillary Leveling As shown in FIG. 10, this method can be used to make article (a) (370; 1020). By using a selective etch process and back-filling with a high refractive index material, this method can be used to construct article (a) (420; 1020'). The order of the coating of resist layers and transfer layer is arbitrary and can be done as described in previous references.

Figure 11A:
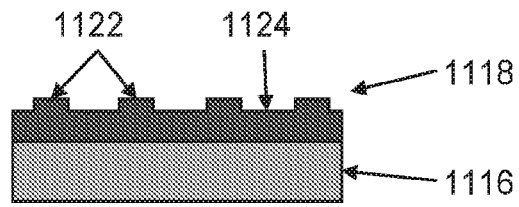
FIGS. 11A-11V are side views of another additional exemplary process embodiment of the present disclosure.
Figure 11B:
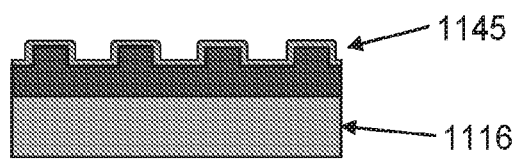
Figure 11C:
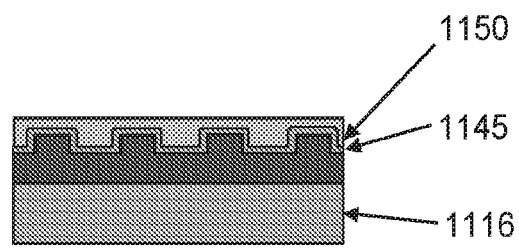
Figure 11D:
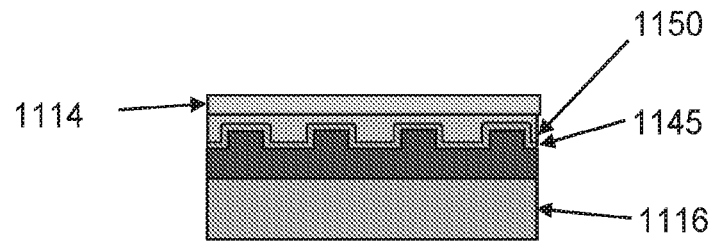
Figure 11E:
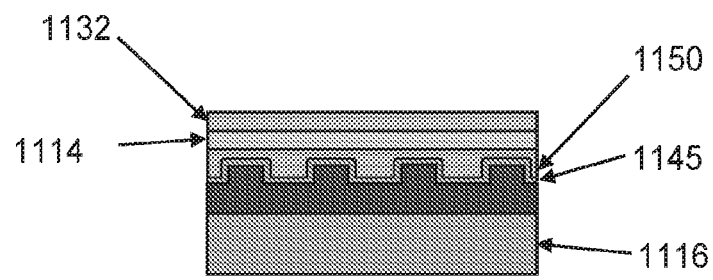
Figure 11F:
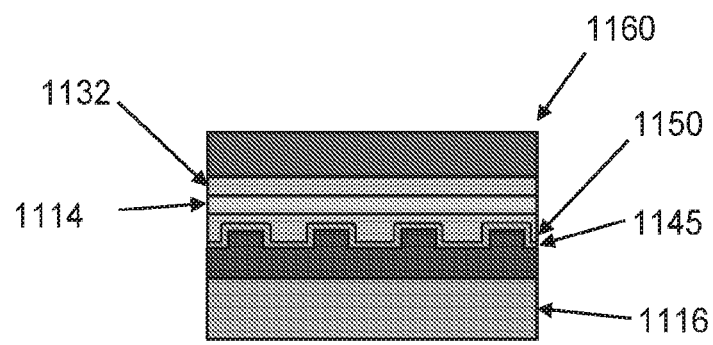
Figure 11G:
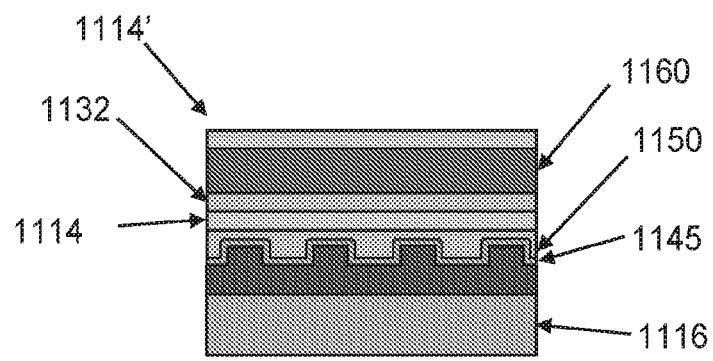
Figure 11H:
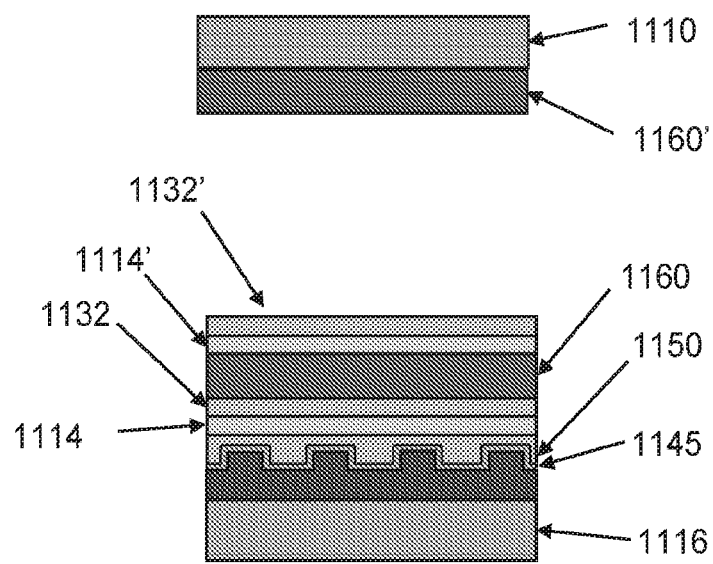
Figure 11I:
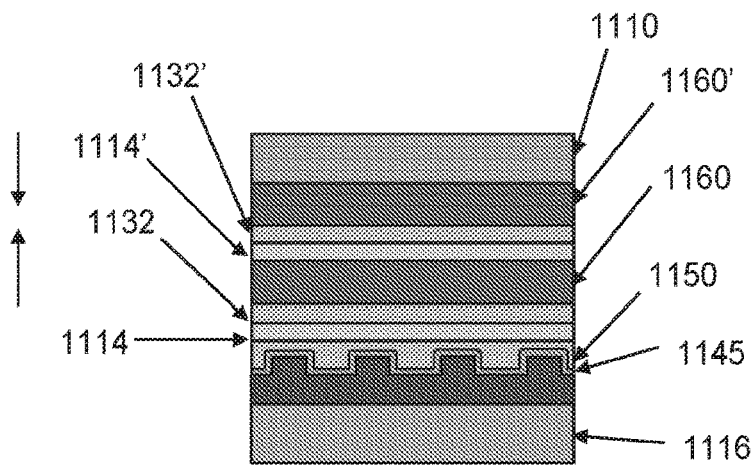
Figure 11J:
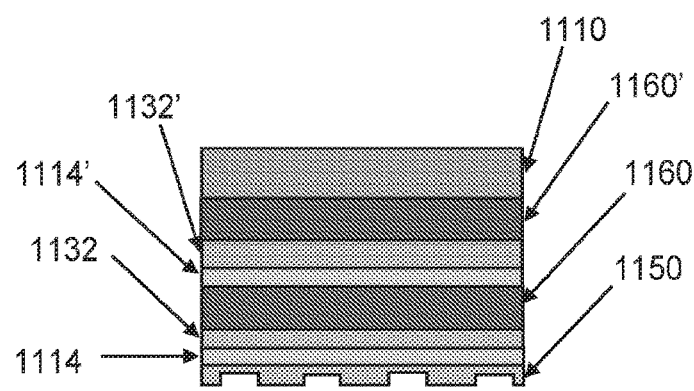
Figure 11K:
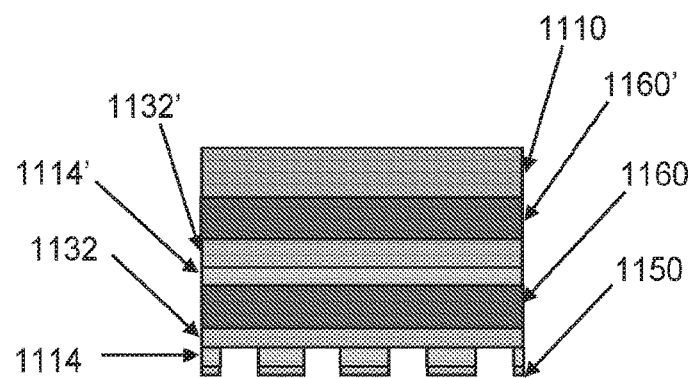
Figure 11L:
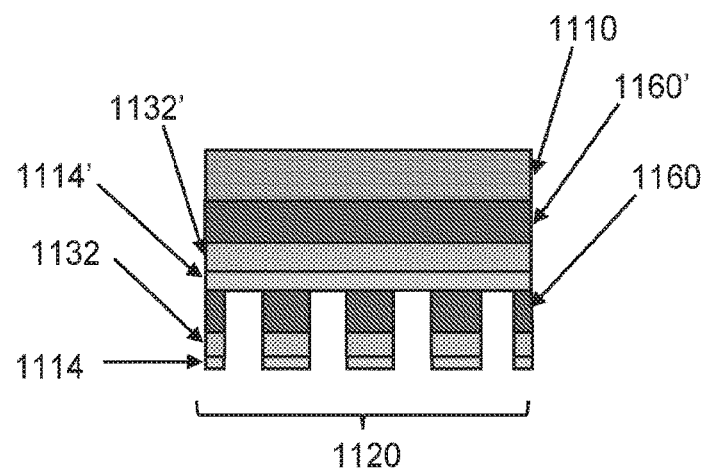
Figure 11M:
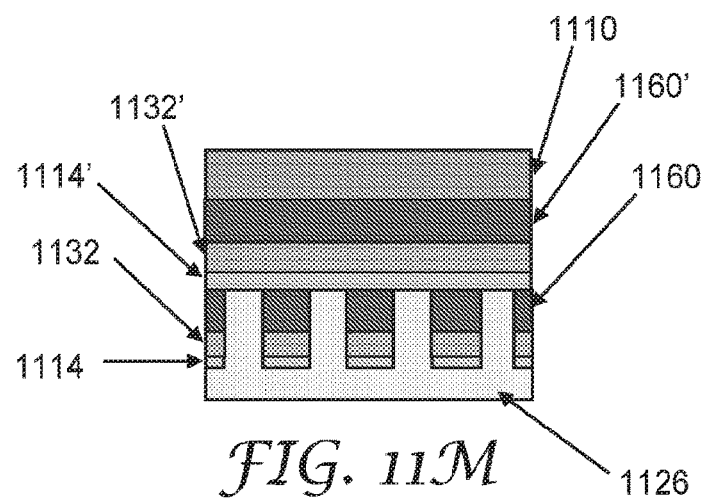
Figure 11N:
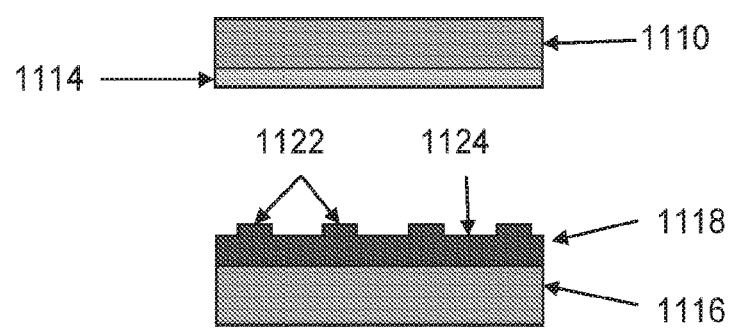
Figure 11O:
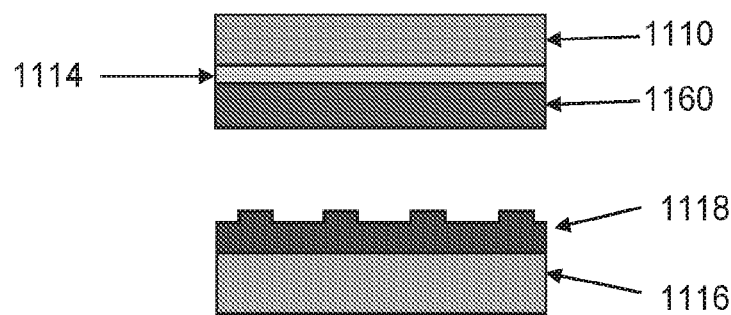
Figure 11P:
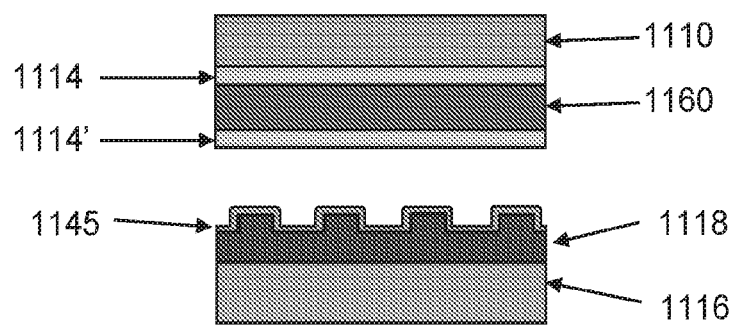
Figure 11Q:
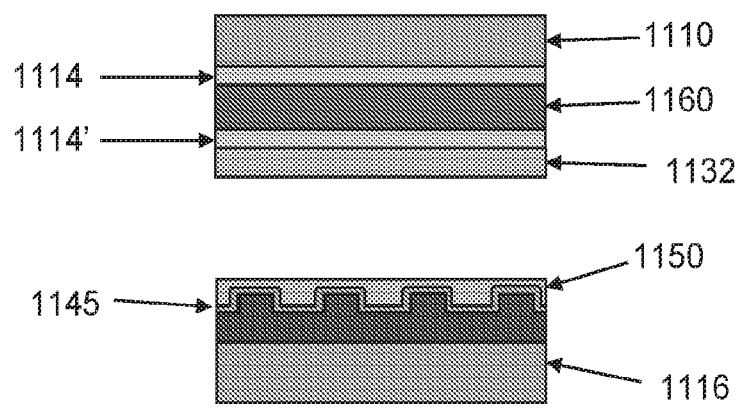
Figure 11R:
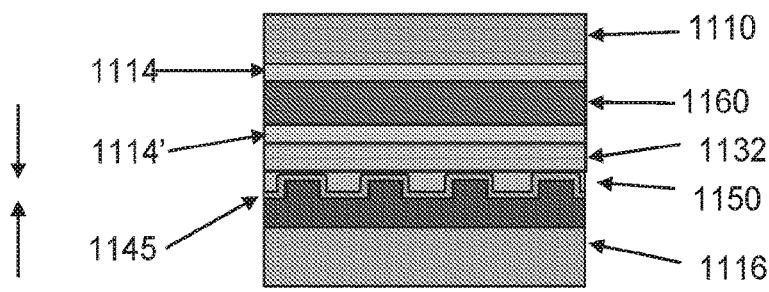
Figure 11S:
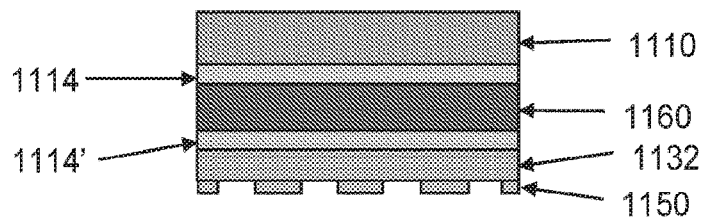
Figure 11T:
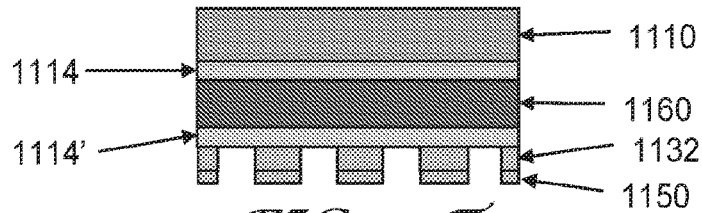
Figure 11U:
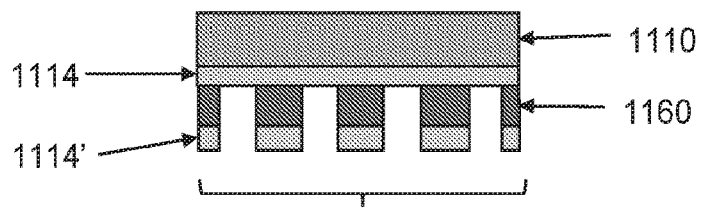

With particular reference to FIGS. 11A-11M, in an additional embodiment, the present disclosure describes a method of forming an etched nano-scale pattern on a substrate, the method including: (a) providing a first substrate (1116) having a patterned surface (1118), the patterned surface including one or more recessed features (1124), each recessed feature adjoining at least one plateau feature (1122) extending away from the recessed feature; (b) overlaying an optional release coating (1145) on the patterned surface; (c) overlaying a first masking layer (1150) on the patterned surface; (d) overlaying the masking layer (1150) with a first etch resist (1114) comprising a first etch resistant material contacting at least a portion of the masking layer; (e) optionally overlaying the first etch resist (1114) with a first adhesion promoter (1132); (f) overlaying the first adhesion promoter (1132) with a transfer layer (1160); (g) overlaying the material (1160) with a second etch resist (1114') comprising a second etch resistant material contacting at least a portion of the material; (h) optionally overlaying the second etch resist (1114)' with a second adhesion promoter (1132'); providing a second substrate (1110) with an optional adhesion layer (1160') where the adhesion layer (1160') and the transfer layer (1160) are optionally the same material, and (i) overlaying the second adhesion promoter (1132') to the adhesion layer (1160'); (j) removing the patterned surface of the first substrate from the first etch resist material and (k) etching the patterned surface of the first etch resist to remove at least a portion of the first etch resistant material, (l) optionally etching into the first transfer layer (1160) and optionally etching to the surface of the second etch resist (1114'), thereby forming the etched nano-scale pattern (1120) on the second substrate. In some embodiments, the etched nano-scale pattern includes a multiplicity of nano-scale features. In some embodiments, the etched nanoscale pattern can be then filled with high index material (1126) as represented in FIG. 11M. In certain such embodiments, each nano-scale feature exhibits at least one dimension from 1 nm to 900 nm. In certain exemplary embodiments, at least one of the first substrate and the second substrate is flexible.

Referring to FIGS. 11N-11V, in other exemplary embodiments, the present disclosure describes a method of forming an etched nano-scale pattern, the method including: (n) providing a substrate (1116) having a patterned surface (1118), the pattern surface including one or more recessed features (1124), each recessed feature adjoining at least one plateau feature (1122) extending away from the recessed feature; providing a first substrate (1110) with a first etch resist layer (1114, (o) overlaying the first etch resist layer (1114) with a transfer layer (1160), (p) overlaying the transfer layer (1160) with a second etch resist (1114'), optionally overlaying a release coating (1145) on the patterned surface (1118), (q) optionally overlaying an adhesion promoting layer (1132) on the second etch resist (1114'), overlaying a masking layer (1150) on the patterned surface (1118) with optional release coating (1145); (r) overlaying the masking layer (1150) with the second etch resist (1114'); (s) removing the patterned surface of the first substrate (1110) from the second etch resist material (1114'); (t) etching the patterned surface to expose the second etch resist layer (1114') and (u) selectively etching the patterned surface of the second etch resist layer (1114') to remove at least a portion of the second etch resistant material, optionally etching into the transfer layer (1160), optionally etching to the surface of the first etch resist layer (1114), thereby forming the etched nano-scale pattern (1120).

In certain exemplary embodiments, the first and second etch layers may advantageously be selected to be the same composition, that is, consisting of or consisting essentially of the same materials. In other exemplary embodiments, the first and second etch layers may advantageously be selected to be different compositions, that is, comprised of different materials.

Figure 11V:
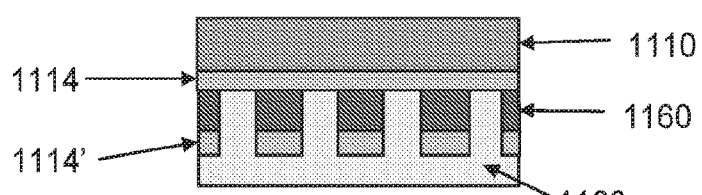

In some embodiments, the etched nano-scale pattern includes a multiplicity of nano-scale features. In some embodiments, the etched nanoscale pattern can be then filled with high index material (1126) as represented in FIG. 11V. In certain such embodiments, each nano-scale feature exhibits at least one dimension from 1 nm to 900 nm. In certain exemplary embodiments, at least one of the first substrate and the second substrate is flexible.

Four-Layer Method with Low Land Replication

Figure 12A:
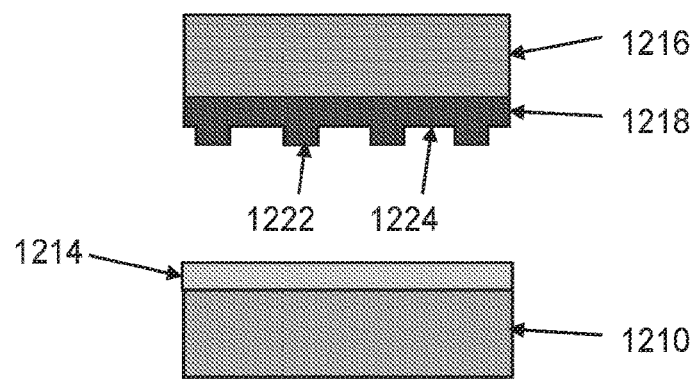
FIGS. 12A-12K are side views of yet another additional exemplary process embodiment of the present disclosure.
Figure 12B:
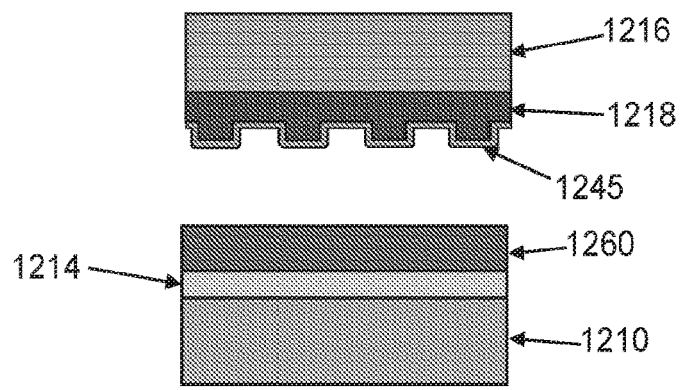
Figure 12C:
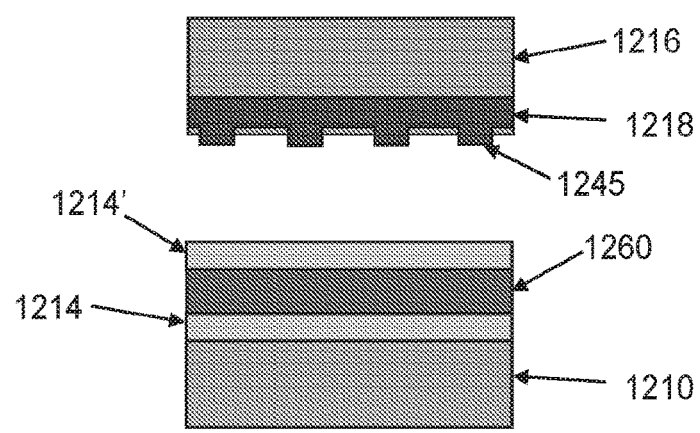
Figure 12D:
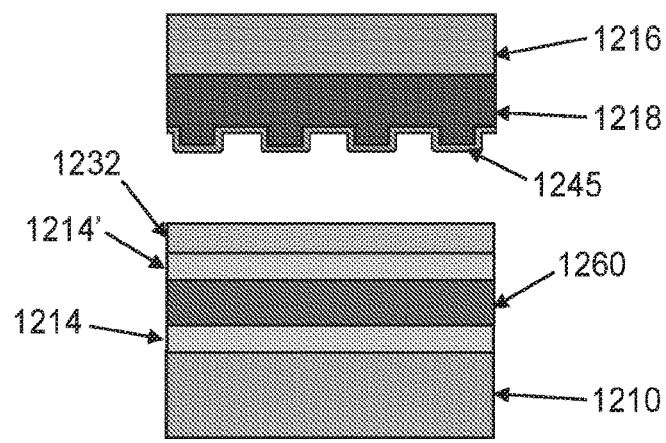
Figure 12E:
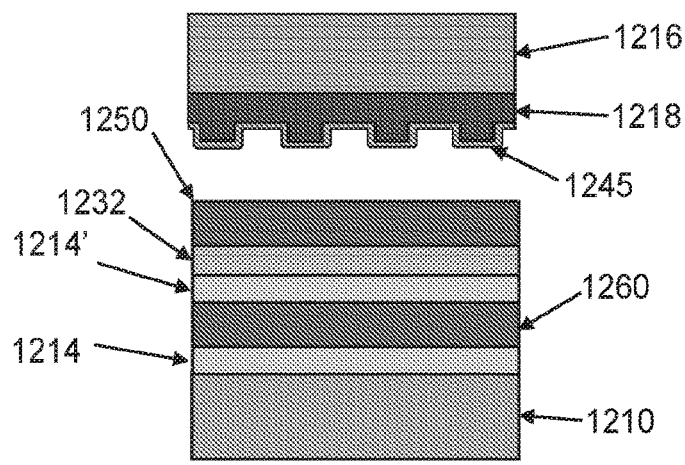
Figure 12F:
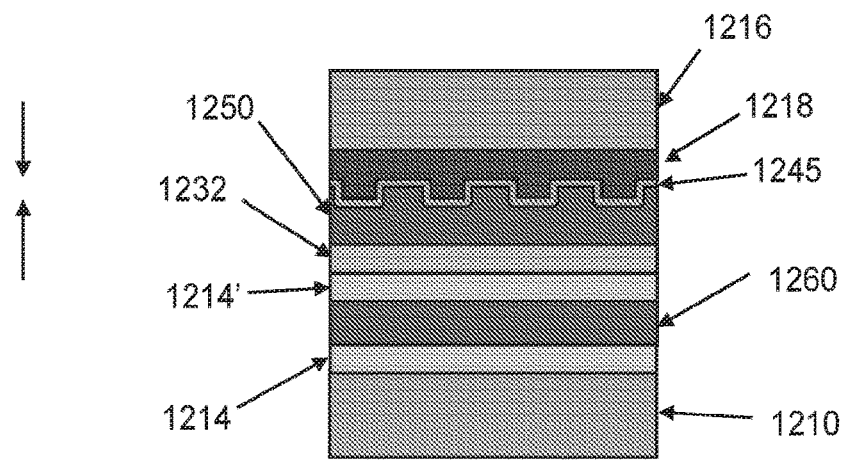
Figure 12G:
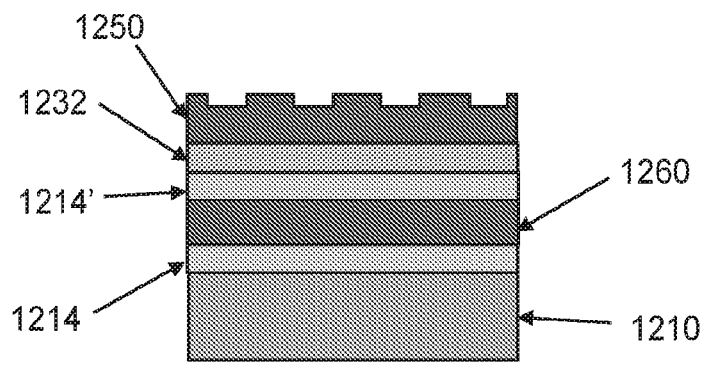
Figure 12H:
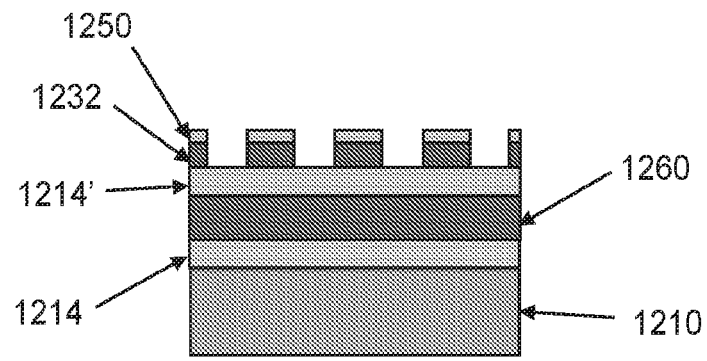
Figure 12I:
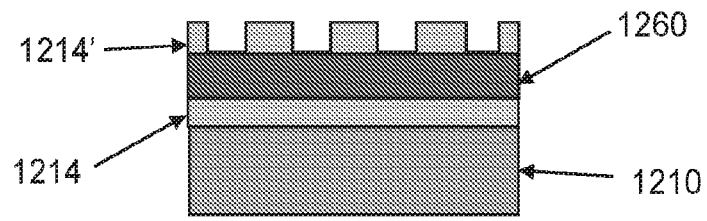
Figure 12J:
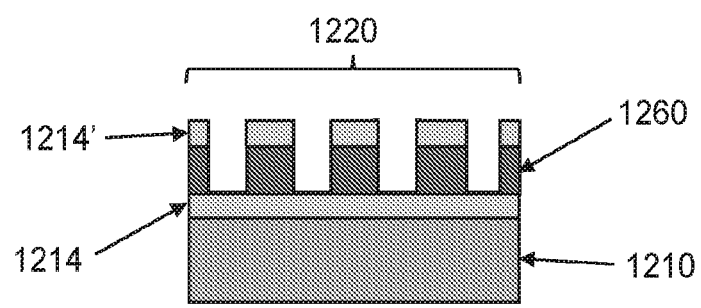
Figure 12K:
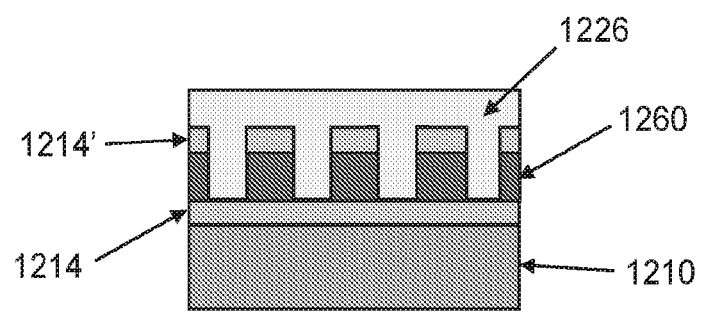

As shown in FIG. 10, this method can be used to make Article (420; 1020'). By using a selective etch process and back-filling with a high refractive index material, this method can be used to construct article (370; 1020). The order of the coating of resist layers and transfer layer is arbitrary and can be done as described in previous references In another exemplary embodiment illustrated in FIG. 12, the present disclosure describes a method of forming an etched nano-scale pattern on a substrate (1210), the method including: (a) providing a substrate (1210) having opposed first and second major surfaces, the first major surface having positioned thereon a first etch resist (1214) comprising a first etch resistant material in contact with the first major surface of the substrate and a support layer (1216) with a patterned layer (1218), the patterned layer having a patterned surface including one or more recessed features (1224), each recessed feature adjoining at least one plateau feature (1222), (b) a transfer layer (1260) overlaying and contacting the first etch resist, and (c) a second etch resist (1214') comprising a second etch resistant material overlaying and contacting the transfer layer (1260); (d) optionally covering the second etch resist with an adhesion layer (1232); (e) overlaying the second etch resist (1214') with a masking layer (1250) (f) imprinting into the masking layer (1250) the patterned surface (1218) on the support layer (1216); that is optionally release treated (1245); (g) removing the patterned surface of the first substrate from the masking layer (h) etching the patterned surface to expose the second etch resist layer (1214'); (i) etching the patterned surface to expose the transfer layer; selectively etching the patterned surface to expose the transfer layer (1260); (j) optionally selectively etching the patterned surface to expose the first etch resist layer (1214') thereby forming an etched nano-scale pattern (1220) on the substrate (1210). In some embodiments, the etched nanoscale pattern can be then filled with high index material (1226) as represented in FIG. 12K. In some embodiments, the etched nano-scale pattern includes a multiplicity of nano-scale features. In certain such embodiments, each nano-scale feature exhibits at least one dimension from 1 nm to 900 nm.

Replicated Resist Layer with Uncontrolled Land and Precision Pattern Transfer Layer In other exemplary embodiments, another method to create a nanoscale pattern on a substrate is to use the "Three-layer method with capillary leveling and tool peel only" wherein the substrate consists of a polymeric support film, an etch stop layer, a patterned transfer layer, and the first etch resist is the hard mask layer. Here the etch depth must be adjusted to create a pattern in the transfer layer, as known to those skilled in the art.

Replicated Resist Layer with Near Zero Land, Precision Pattern Transfer Layer, and Cladding Layer Nano-structured articles can be also created using the "Four-layer method with low land replication" or the "Four-layer method with capillary leveling" with etch and backfill, where the substrate consists of a polymeric support film and a cladding layer. Additionally, the substrate may be comprised of a (co)polymeric support film and a cladding layer as described in any of the foregoing examples.

Articles Including a Nano-Scale Pattern on a Substrate

In final embodiments, the present disclosure describes an article comprising a nano-scale pattern on a substrate, the nano-scale pattern being made using any of the foregoing methods. In certain exemplary embodiments, the article is advantageously selected to be an optical film. The optical film may exhibit a variety of optical properties, including but not limited to reflectance, anti-reflectance, bi-refringence, polarization, selective wavelength transmittance, selective wavelength reflectance, and the like. In other exemplary embodiments, the article is advantageously selected to be a biologically-active film, a fluid filtration medium, a medical dressing, or the like.

In some exemplary embodiments, a height of the nano-scale features is at least five times larger than a width of the nano-scale features, optionally wherein the width of the nanoscale features is less than 500 nm. In certain exemplary embodiments, the nano-scale features include at least one of a multiplicity of holes, a multiplicity of pillars, a multiplicity of recesses having a substantially flat bottom surface, a multiplicity of flat-topped plateau features, or a multiplicity of three-dimensional polygonal structures. In additional exemplary embodiments, a depth of 90% of the nano-scale features is within +/−20 nm of an average etch depth.

Exemplary Component Process Descriptions

Various component processes may be useful in carrying out one or more of the foregoing methods of forming an etched nano-scale pattern on a substrate and articles including such a nano-scale pattern on a substrate. Exemplary component processes include, but are not limited to:

Patterning

The initial step in roll-to-roll patterning with micron or nanometer scale features is the generation of the pattern on a tooling roll. The pattern on the roll could be made of a variety of materials including metals, polymers or inorganics.

Various methods of making these patterns exist. One common method is diamond turning. An example of patterning sub-wavelength gratings can be found here (Chun-Wei Liu, Jiwang Yan, Shih-Chieh Lin, "Diamond turning of high-precision roll-to-roll imprinting molds for fabricating subwavelength gratings," Opt. Eng. 55(6), 064105 (2016), doi: 10.1117/1. OE.55.6.064105.). Diamond turning can provide structures in a variety of materials including polymers, inorganics and metals.

Numerous methods rely on pattern transfer of polymers. For example, some of these can be found in U.S. Pat. No. 9,069,244. Transferring the master pattern from the master to the layer of elastomer material on the surface of the cylinder includes plate-to-cylinder nano-imprint lithography, optical lithography in a standard contact or near-field configurations, bond detach or decal transfer lithography, micro-contact printing, nano-transfer printing, and scanning beam interference lithography." Additional references for methods to generate tooling include WO 2018/052895.

In some embodiments, the pattern is introduced into the method as a patterned layer on a substrate. In these cases, the patterned layer was generated using a tool as described above in a method such as described in WO9511464A2 and U.S. Pat. No. 8,027,086.

Surface treatments as described further below may be useful to ensure release from the tool during patterning.

Pattern Replication

The process of replicating a nanostructured surface involves: providing a nanostructured surface, forming a moldable material to the nanostructured surface, firming the moldable material and removing the moldable material from the nanostructured surface. Examples of a nanostructured surface include a machined or diamond turned metal cylinder, a nickel electroform or a polymeric film. An example of a moldable material is a thermoplastic material (e.g. polycarbonate, polypropylene, polymethyl methacrylate, etc.) that can be molded to the nanostructured surface with heat and pressure and firmed by cooling (e.g. U.S. Pat. Nos. 3,515,778 and 4,097,634).

Another example of moldable material is a curable material (e.g. material compositions that include reactive moieties such as acrylate, methacrylate, and the like) that can be molded to the nanostructured surface and firmed by chemical reaction that can be initiated, for example, by exposure to radiation such as UV, heat, or electron beam (see e.g., U.S. Pat. Nos. 4,374,077; 4,576,850 and 5,175,030). Optionally an additional layer (e.g. a polymer film) may be present adjacent to the moldable material on the surface opposite the nanostructured surface to create a composite construction (e.g. U.S. Pat. No. 5,183,597).

Low Land Replication

The thickness of the moldable material depends upon the composition of the moldable material and the details of the forming process (process configuration, speed, temperature, and the like). The thickness of the moldable layer includes the height of the features (holes, posts, etc.) and the thickness of a residual layer which is the distance from the lowest feature on the nanostructured surface of the moldable material to the opposite side of the moldable material. For a continuous replication process that uses a UV curable moldable material (e.g. U.S. Pat. No. 5,691,846), the thickness of the residual layer can be reduced by increasing the temperature of the nanostructured surface and moldable material, increasing the force pressing the moldable material into the nanostructured surface, decreasing the rate that the moldable material is formed to the nanostructured surface and selecting a moldable material with lower viscosity Coating Methods A thin film can be coated onto a flat or structured surface using coating methods known in the art such as slot die coating, slide coating, curtain coating, knife coating, blade coating, dip coating and spin coating. Exemplary slot die coating equipment is described in U.S. Pat. Nos. 5,639,305 and 7,591,903 B2. A spin coater is described in U.S. Pat. No. 6,033,728. The process of backfilling a flexible structured surface with a die is described in U.S. Pat. No. 8,917,444 B2.

Coating Compositions

The coating composition may be a solution, a dispersion, or a combination thereof. One exemplary solution comprises one or more (meth)acrylate (co)polymers as disclosed, for example, in U.S. Pat. Nos. 4,374,077; 4,576,850; 5,175,030 and 5,691,846. The coating composition can be a dispersion in a resin of nanoparticles made of a material having a refractive index is above 1.6. Such a dispersion can be made, for example, using zirconia or titanium nanoparticles, which can be dispersed in a curable resin. The resin can contain an etch resist; common etch resists contain silicon, for example siloxanes, silicones, silsesquioxanes, and the like.

The coating can be a low index layer comprising voids as described in U.S. Pat. No. 8,808,811 or suitable fluorinated acrylate monomers and oligomers described below in this patent. The coating can also be an adhesive (see U.S. Pat. Pub. No. 2017/0240782 and references disclosed therein) or epoxy, thermally cured adhesive such as EVA, a thermoset such as isocyanate, or an acrylated benzophenone.

The coating material can also comprise a film former such as poly vinyl alcohol, poly methyl methacrylate, or polyvinyl butyral. The resin can be a (meth)acrylate pre-polymer, oligomer or (co)polymer with optical transmissive properties (U.S. Pat. No. 9,360,592). The resin can contain fluorenol groups, such as perfluoropolyether, polytetrafluoroethylene (TEFLON), LTM, Cytop materials, HFPO, or fluorenol methacrylate (U.S. Pat. No. 7,981,986). The resin may be any single or combination of commercially available resins from Sartomer, microresist technology, Nanonex, Toyo Gosei, Miramer, and Miwon.

The resins can be solidified through drying, by heat, by e-beam, or by UV-curing using photoinitiators such as Irgacure 819, TPO-L, and the like.

The specific parameters for coating varies depending on the method. For methods involving capillary leveling, the solvent system, resin, any additives, drying profile, drying method, coating concentration, and coating method must be chosen to prevent the structured surface from causing wetting instabilities. For methods where there is no subsequent peel after coating, the range of coating solutions includes resins that do not replicate well, however, they must be chosen to be etch selective. For methods where capillary leveling or low-land replication is followed by a peel step, the resin must be chosen such the features are accurately reproduced.

When there is no capillary leveling structure induced, then de-wetting as well as flow after coating and before curing are less important. However, flow during imprinting is more important.

Solvents and Drying

Coating solutions can be coated with or without solvent. Exemplary solvents are described in U.S. Pat. Pub. No. 2013/0011608 A1. The solvent can be dried in an ambient environment or with conventional convection drying known to those skilled in the art. Methods to reduce mottle from convective drying as described in WO 1997/11328 can also be employed. The temperature at which the solvent is dried is chosen as described by U.S. Pat. Pub. No. 2013/0011608 A1. Exemplary solvents are mixtures of ethanol, methanol, 1-methoxy-2-propanol, methyl ethyl keytone, methyl isobutyl ketone, isopropyl alcohol, acetone, water, ethyl acetate, toluene, and hexanes.

Wetting Instabilities

The solvent and the concentration of the solute can be chosen to reduce wetting instabilities. This can be achieved by using low surface energy solvents and tuning viscosity of the solution to prevent mobility of solution. As the solution dries the viscosity typically increases. The duration at which the solution maintains a set viscosity and surface tension can be used to tune the flow of the solution around structured surfaces as they interact with the local evaporation rate and Marangoni forces as described by Weidner, Scwartz and Eley in *J. Colloid and Interface Science*, 179, 66-75 (1996). Additionally, surfactants (such as HFPO (prepared as copolymer B in U.S. Pat. Pub. No. 2010/030875 A1, Hao et al), Tego® Rad series 2300, 2250 (Available from Evonik Goldschmidt Corp,), TRITON X-100 (available from), Tergitol® (available from) and the like can be added to modify the wetting properties. Wetting instabilities can also be reduced or eliminated by modifying the surface energy of the surface to be coated as described below.

Adhesion to Surfaces

Depending on the process path, the resin is chosen to either adhere or release from its neighboring surfaces. The adhesion between interfaces depends upon the nano-structure of the surfaces, the roughness, the surface energy, any adhesion layers, and the composition of the layers. The adhesion can also be modified by temperature and contact time before peel, as well as the solvent which contacts the interface. When the goal is to accurately reproduce patterns or release from a surface, the solvent is also chosen to interact minimally with the surface it is coated on. When the goal is to adhere to the surface below, a solvent can be chosen to partially solubilize or swell the layer below. Higher temperatures can also be used to increase adhesion.

Replication

The resin can be advantageously selected to accurately replicate a patterned surface from a tooling master such as a tooling film bearing a pattern of nano-scale features. For example, resins which exhibit low shrinkage on cure are generally preferred. Preferably, shrinkage on cure in at least one dimension is no greater than 2%, 1%, 0.5%, 0.25%, 0.1%, or even as low as 0%.

Resins having a low modulus (e.g., no greater than 20 kPa, 10 kPa, 5 kPa, 1 kPa or even as low as 0 Pa) are generally not presently preferred, as such resins may fail cohesively during or after the replication step. Resins having too low a viscosity (e.g., no greater than 100 mPa-s, 50 mPa-s, 10 mPa-s, 1 mPa-s or even less than 1 mPa-s) are generally not presently preferred, as the low viscosity resin may flow around the edges of the tooling film creating rounded nanoscale features on the substrate, or fouling the back side of the tooling film. Resins having too high a viscosity (e.g., greater than 50 kPa-s, 100 kPa-s, 500 kPa-s, 1 MPa-s or even greater than 1 MPa-s) are generally not presently preferred, as the high viscosity resin may not flow all the way to the bottom of the tool recesses, resulting in defects in the nano-replicated substrate.

Likewise, Resins that are too tacky (e.g., approaching a Dahlquist criteria for defining a pressure sensitive adhesive) are generally not presently preferred, as the resin may not separate or release well from a tooling film bearing a pattern of nano-scale features. Additional parameters affecting release from a structured surface are volume change upon cure, elastic modulus, Poisson's ratio, and the like.

Corona Treating

The surface energy of any surface can be modified by exposure to corona discharge as described in U.S. Pat. No. 5,972,176. The local atmosphere can contain oxygen, nitrogen, or other gases, or the local atmosphere may be controlled to lack certain gases, such as oxygen, nitrogen, or other gases, in order to increase adhesion or improve release between any two interfaces.

Laminating

Two substrates can be laminated by passing them through two nip rolls, a single nip roll, pressing together with a flat press, or laminating in a free-span as described in WO 1995/29811. The backing on any of the substrates can vary in elasticity; softer materials allow conformal contact and harder materials can induce flows to create more layers more uniform in thickness. To prevent gas capture, the lamination can be done in vacuum, or in the presence of air, or carbon dioxide, or helium, or other gases that are soluble in the liquid layer. The time and the force applied can be varied as well; for roll to roll systems line speed and nip contact force per width. Temperature can be applied to reduce viscosity, although too high of a temperature can warp the structured pattern or other layers. The cleanliness and geometric ideality of the rolls and flat surfaces are important for good lamination. The roll size in lamination processes could also alter the fidelity of the lamination.

Typically, materials are agitated as little as possible between lamination and cure steps. In the case of roll to roll systems, this means curing on the lamination roll, or curing in the nip. In the case of piece-part processing, this means curing on the lamination station.

Peel and Retain Layer

The peeling of two materials can be optimized by varying incoming angle and peel angle of the films, peel speed, and temperature of peel. Peeling can be done roll-to-roll or piece-part. For roll-to-roll peeling the opening in the nip, the tension on the incoming and outgoing films can be further modified to find exemplary peel conditions.

Reactive Ion Etching

Transferring the pattern of the masking layer into the underlying layers can be achieved by plasma etching. Where high aspect ratio structures are needed, ion-assisted plasma processing is conveniently used. Methods for achieving anisotropic etching include reactive ion etching (RIE), high density ion source processing, or a combination of high-density ion source processing along with RIE. High density plasmas can be generated by inductive rf, or microwave coupling, or by helicon ion sources. Linear high-density plasma sources are particularly advantageous for generating high aspect ratio features. Combining high density plasmas with RIE enables the decoupling of the ion generation (by high density plasma) from the ion energy (by RIE bias voltage).

The RIE method includes etching portions of the major surface not protected by the masking layer to form a nanostructure on the substrate. In one embodiment, the provided method can be carried out using a continuous roll-to-roll process referred to as "cylindrical reactive ion etching" (cylindrical RIE). Cylindrical RIE utilizes a rotating cylindrical electrode to provide anisotropically etched nanostructures on the surface of a substrate or article. In general, cylindrical RIE can be described as follows. A rotatable cylindrical electrode ("drum electrode") powered by radio-frequency (RF) and a grounded counter-electrode are provided inside a vacuum vessel. The counter-electrode can comprise the vacuum vessel itself. An etchant gas is fed into the vacuum vessel, and a plasma is ignited and sustained between the drum electrode and the grounded counter-electrode.

A continuous substrate comprising a patterned masking layer can then be wrapped around the circumference of the drum and the substrate can be etched in the direction normal to the plane of the substrate. The exposure time of the substrate can be controlled to obtain a predetermined etch depth of the resulting nanostructure. The process can be carried out at an operating pressure of approximately 1-10 mTorr. Cylindrical RIE is disclosed, for example, in U.S. Pat. No. 8,460,568 (David et al.).

The chemistry of the plasma environment can be controlled to achieve selectivity of etching, when multiple materials are present. Oxygen, and mixtures of oxygen with fluorinated gases are used to etch carbon containing materials such as polymers, diamond-like carbon, diamond, and the like. The concentration of the fluorine in the plasma is critical to optimize the etching rate and selectivity. Typically, a small amount of fluorinated gas is used to dramatically increase the etching rate of hydrocarbon polymers by as much as 300%.

To etch siliceous materials (silicon dioxide, $SiO_x$, diamond-like glass, silicon nitride, silicon carbide, silicon oxycarbide, polysiloxane, silsequioxane (SSQ) resins, etc), mixtures of fluorocarbons such as $CF_4$, $C_2F_6$, $C_3F_8$ and the like, are used in combination with oxygen. The etch selectivity between siliceous materials and hydrocarbon polymers may be carefully tailored by obtaining the etching profiles of these materials as a function of the F/O atomic ratio in the plasma feed gas mixture. Oxygen rich conditions provide excellent selectivity of etching hydrocarbon polymers and diamond-like carbon (DLC) while using siliceous materials as the masking layer. In contrast, fluorine rich conditions provide excellent selectivity of etching siliceous materials while using hydrocarbon polymer-based masking materials.

Fluorinated plasma chemistries may be used for etching other masking materials such as tungsten, whose fluorides are volatile. Chlorine containing gas mixtures may be used to etch materials whose chlorides are volatile, such as aluminum, and titanium. Oxide, nitrides and carbides of these etchable metals can also be etched by using chlorine-based chemistries. Silicon nitride, aluminum nitride, and titanium oxide are high index materials that may be etched with chlorine chemistries. Typical gases used for etching include: oxygen, nitrogen trifluoride ($NF_3$), $CF_4$, $C_2F_6$, $C_3F_8$, $SF_6$, $Cl_2$, $CH_4$, and the like.

Vapor Deposition

Vapor deposition incudes the techniques of Physical Vapor Deposition (PVD) including sputtering and evaporation; Chemical Vapor Deposition (CVD) including the techniques of CVD, plasma enhanced CVD, atomic layer deposition (ALD), and plasma assisted atomic layer deposition (PAALD); and monomer deposition and curing, as described further below.

Atomic Layer Deposition (ALD)

Conformal, high-refractive-index coatings can be deposited into nanostructures using Atomic Layer Deposition. Suitable materials are those metal oxides and nitrides with refractive index greater than 2, including oxides of titanium, zirconium, hafnium, niobium, or cerium. ALD has been adopted because of its ability to create highly uniform and conformal coatings at the nanometer scale. ALD involves alternating exposure of the substrate surface to a precursor vapor (A) which creates a chemisorbed (sub)monolayer followed by exposure to a second precursor vapor (B or commonly referred to as the "reactant") which chemisorbs and reacts with the chemisorbed A to form a (sub)monolayer film of oxide or other material.

The ALD process can be done in a batch setting where the precursor(s) are introduced sequentially and separated by an inert gas purging step that acts as a diffusion barrier between the reactive gasses. It is common to rely on thermal energy (system temperature) to assist in reaction kinetics, but it is also possible to enhance the kinetics via plasma activation.

In addition to batch processing, in some embodiments ALD can be done by spatially separating the reactive gasses in different regions of the chamber and transporting the substrate(s) through those regions which can include a plasma such as in U.S. Pat. No. 8,187,679. Lastly, the ALD process can also be performed in a (semi)continuous roll-to-roll mode with a system like the ones described in WO 2017/003870 and WO 2017/172531. In one exemplary embodiment, $TiO_2$ may be deposited into nanostructures by a spatial plasma-enhanced ALD process.

High refractive index layers can be formed from a sequential combination of solution coating and ALD. The sequence can be first solution coating followed by ALD, or it can be first ALD coating followed by solution coating. The solution coating uses materials that include sols and/or organometallic precursors of high-index materials, such as titania sols or organo-titanate precursors. When the solution of sols and/or organometallic precursors is first coated onto nanostructures and dried, then the ALD process is used to fill in most of the volume remaining in the nanostructure. When the ALD process is first coated into nanostructures, then the solutions coating process is done to planarize the surface of the high index layer.

Etch resistant layers can be deposited by Atomic Layer Deposition (ALD) of metal oxides or nitrides. Suitable materials include oxides of silicon, aluminum, tin, indium, titanium, zirconium, hafnium, tantalum, niobium, or cerium. This process can be done in a batch setting where the precursor(s) are introduced sequentially and separated by an inert gas purging step that acts as a diffusion barrier between the reactive gasses. It is common to rely on thermal energy (system temperature) to assist in reaction kinetics, but it is also possible to enhance the kinetics via plasma activation. In additional to batch processing, in some embodiments ALD can be done by spatially separating the reactive gasses in different regions of the chamber and transporting the substrate(s) through those regions which can include a plasma such as in U.S. Pat. No. 8,187,679. Lastly, the process can also be performed in a (semi)continuous roll-to-roll mode with a system like the ones described in WO 2017/003870 and WO 2017/172531.

Change in Patent Reference for Physical Vapor Deposition—Sputter Etch Resistant Layers Plasma Treatment A patterned surface can be treated to control the surface adhesion strength through a plasma deposition process. One suitable type of plasma reactor provides a reaction chamber having a capacitively-coupled system with at least one electrode powered by a radiofrequency (RF) source and at least one grounded electrode. Regardless of the specific type, such a chamber may provide an environment which allows for the control of, among other things, pressure, the flow of various inert and reactive gases, voltage supplied to the powered electrode, strength of the electric field across an ion sheath formed in the chamber, formation of a plasma containing reactive species, intensity of ion bombardment, rate of deposition, and the like.

In order to perform the plasma treatment, the patterned surface may be placed in, or passed through, the reaction chamber. Plasma, created from a gas or gas mixture within the chamber, may be generated and sustained by supplying; power (for example, from an RF generator) to at least one electrode, as will be well understood. Various ancillary components (power sources, oscillators, and so on, are often used in such systems, again as will be well understood). The pressure in the reaction chamber may be maintained at any pressure that is conducive to the formation of a suitable plasma. Often, the plasma reaction chamber may be maintained at a reduced pressure. However, in some embodiments, so called atmospheric pressure plasma treatment may be performed.

In some embodiments, a mode of plasma treatment may be used that involves the positioning of at least the patterned surface within an ion sheath that is established within the reaction chamber of the plasma reactor. Such a mode may provide e.g. enhanced attachment of plasma-reactive species to the patterned surface, may provide enhanced coverage of such species over the area of the patterned surface, may provide enhanced durability of the plasma treatment, and the like. Methods of establishing such an ion sheath and of positioning a substrate within such an ion sheath, are described in detail in U.S. Pat. Nos. 7,125,603 and 7,387,081.

The plasma treatment environment may be composed of any desired gas or gas-phase mixture with an appropriate applied power to initiate a plasma, thereby depositing a covalently bound thin film with a desirable surface energy. The plasma treatment environment may include one or more suitable organosilane, hydrocarbon, fluorocarbon, or fluorosilane constituents, as described for example in U.S. Pat. No. 6,696,157 and U.S. Pat Pub. No. 2010/0308497.

In some embodiments, the plasma treatment environment may comprise a mixture of an oxygen-containing constituent and an organosilane and/or fluorosilane constituent at any suitable ratio. In certain exemplary embodiments, a mixture of oxygen and tetramethyl silane may be used. In further embodiments a volumetric ratio of TMS to O2 of about 1:1, 1:3, 1:5, 1:8, or 1:10 may be used, as described for example in U.S. Pat. Pub. No. 2016/0263929. In some exemplary embodiments, the plasma treatment environment may comprise oxygen, resulting in surface modification rather than deposition.

Monomer Deposition and Cure

Masking layers may be deposited by a process of vapor coating (meth)acrylate monomer(s), oligomers, pre-polymers, or combinations thereof, optionally with photoinitiator(s), and curing by exposure to ultraviolet radiation (UV), electron beam (e-beam), ionizing radiation (gamma rays) or plasma radiation. This process is generally described in U.S. Pat. No. 8,658,248, with an emphasis on controlling the temperature of the condensed monomer to maintain a viscosity low enough for liquid flow into the nanostructures. Suitable monomers are described in U.S. Pat. No. 8,658,248 and the references incorporated therein. In one example, the vapor coating precursor is SR306, the process drum temperature is 25° C., and the coating is cured by exposure to electron beam radiation.

Etch resistant layers and etch stop layers of $SiO_2$ or silicon-containing hybrid organic/inorganic materials can be deposited by the vapor deposition of silicon-containing organic precursors and reaction with water, as described in U.S. Pat. Pub. No. 2016/0083839.

(Meth)acrylate coatings suitable for use as transfer layers may be deposited by a process of vapor coating (meth)acrylate monomer(s), optionally including added adhesion promoter(s) and/or photoinitiator(s), and cured by exposure to ultraviolet radiation (UV), electron beam (e-beam), ionizing radiation (gamma rays) or plasma radiation. This process, and suitable photocurable monomer materials for use therein, are described in U.S. Pat. No. 8,658,248 and the references incorporated therein.

Suitable adhesion promoters can be organosilanes known in the art, including those described in U.S. Pat. Nos. 9,254,506; 9,790,396; 9,982,160; 10,011,735; and U.S. Pat. Pub. Nos. 2015/0203707 and 2015/0218294. In one exemplary embodiment, the vapor coating formulation is 85 wt % tricyclodecyldimethanoldiacrylate (SR833M from Sartomer) with 10% silane coupling agent, and 5% IRGACURE 184 photoinitiator, and the coating is cured by exposure to UV-C radiation.

Low refractive index transfer layers may be deposited by a process of vapor coating fluorinated acrylate monomers and/or oligomers, optionally with adhesion promoter(s) and/or photoinitiator(s), and curing by exposure to ultraviolet radiation (UV), electron beam (e-beam), ionizing radiation (gamma rays) or plasma radiation. This process is described in U.S. Pat. No. 8,658,248 and the references incorporated therein.

Suitable fluorinated acrylate monomers and oligomers are mono- and di-(meth)acrylates with molecular weight from about 200-3000, including mono- and di-acrylates of perfluoropolyether oligomers. Suitable adhesion promoters can be organosilanes known in the art, including those described in U.S. Pat. Nos. 9,254,506; 9,790,396; 9,982,160; 10,011,735, and U.S. Pat. Pub. Nos. 2015/0203707 and 2015/0218294.

In one advantageous exemplary embodiment, the vapor coating formulation is selected to be 97 wt % 3M HFPO diacrylate (developmental), 2% silane coupling agent, and 1% DAROCUR 1173 photoinitiator, and the coating is cured by exposure to UV-C radiation.

Physical Vapor Deposition

Sputter etch resistant layers—etch resistant layers can be deposited by a sputtering vapor coating process. The process and materials are described in WO 2017/003870. In one example, two targets of composition 90% Si/10% Al were reactively sputtered in an alternating current (AC) mode in a mixture of Ar and $O_2$.

Transparent high index layers can be deposited by a sputtering vapor coating process. Suitable materials are metal oxides, including oxides of titanium, zirconium, hafnium, niobium, or cerium which can be sputtered from metallic or ceramic targets. These materials can be sputtered by pulsed direct current (DC), alternating current (AC), or radio frequency (RF) power modes depending on the target material. In one example, a high index layer of $Nb_2O_5$ is reactively deposited in a pulsed DC mode from a target of Nb metal in a mixture of Ar and $O_2$.

Transparent etch resistant layers can be deposited by an e-beam evaporation method, or by sputtering. Suitable materials are metal oxides, including oxides of titanium, zirconium, hafnium, niobium, or cerium. In one exemplary embodiment, $TiO_2$ may be deposited by e-beam evaporation. In other exemplary embodiments, $SiAlO_x$ may be deposited using sputtering.

Chemical Vapor Deposition

The conformal coating can be performed using thermal CVD by simultaneous introduction of a reactant and a reactive gas in vapor phase into a reaction chamber having the heated substrate therein, and allowing the reactive gas to decompose the reactant onto the substrate surface to form a film layer. Suitable thermal CVD apparatus and processes are described in U.S. Pat. No. 7,749,802 (for Ti CVD) and U.S. Pat. Pub. No. 2017/0005038 (for metal CVD).

Plasma-Enhanced CVD (PECVD) is a thin film deposition method consisting of the introduction (a) a reactant in vapor phase into a reaction chamber having the substrate therein, (b) introducing a reactive gas ($O_2$, $N_2$, $H_2$, or the like) in vapor phase into the reaction chamber; c) exposing the reaction chamber to plasma to drive a reaction between the reactant and reactive gas species on the substrate surface to form a film layer. Suitable PECVD apparatus and processes are described in U.S. Pat. Pub. No. 2017/0005038.

Coupling Agents

Coupling agents can be coated either by vapor deposition or by solvent coating. Thickness of coupling agent layers are less than 100 nm.

Useful coupling agents include functional silanes with alkoxy or chlorinated groups bonded to silicon atoms, with (meth)acrylic silane coupling agents being particularly useful. Suitable materials may include functional groups that bond with (meth)acrylate coatings, including (meth)acrylate, vinyl, amine, urethane, urea, and thiol functional groups. Included are Acrylic silane coupling agent O-(vinyloxybutyl)-H-(triethoxysilylpropyl)-urethane, and others given in U.S. Pat. Nos. 7,799,888; 9,029,586; 9,254,506; 9,790,396; 9,982,160; 10,011,735, and U.S. Pat. Pub. Nos. 2015/0203707 A1 and 2015/0218294 A1.

Coupling agents can be coated either by plasma deposition or by solvent coating. Thickness of coupling agents is less than 100 nm.

In some embodiments, the substrate 2 can be a flexible substrate, for example, a web of indefinite length polymeric material. The flexible substrate or web may be stretched (e.g., along a machine direction and/or a cross direction) when moving along a web path. The flexible substrate may include, for example, polyethylene terephthalate (PET), polycarbonate (PC), polyethylene terephthalate glycol-modified (PETG), polyethylene, polyimide, polystyrene, polyurethane, etc. The processes described herein can be carried out on a roll-to-roll apparatus including one or more rollers to convey the web along the web path. The substrate 2 may have a thickness of, for example, about 2 mm or less, about 1 mm or less, about 500 microns or less, or about 200 microns or less.

The processes described herein, such as, for example, replication, plasma coating, etching, coating, physical vapor deposition, chemical vapor deposition, solidifying/drying, laminating, peeling, etc., can be performed in a substantially continuous roll-to-roll manner. Exemplary continuous or roll-to-roll micro-replication processes were described in U.S. Pat. No. 9,759,663 (Halverson et. al.). Exemplary continuous or roll-to-roll processes of plasma coating and etching were described in U.S. Pat. No. 8,460,568 (David et. al.). Exemplary continuous or roll-to-roll processes of coating and drying were described in U.S. Pat. No. 8,623,140 (Yapel et al). Exemplary continuous or roll-to-roll processes of physical vapor deposition methods were described in WO 2017/003870.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Experimental Example 1

Stack Building—An Example Stack of $W/DLC/Si_xC_yH_z$ was Built on a PET Film

An example of a $W/DLC/Si_xC_yH_z$ stack, i.e. using a tungsten layer as the upper hard mask, a DLC layer as the second pattern transfer layer, and a CVD deposited $Si_xC_yH_z$ layer as the etch-stop layer, was built up on a PET film substrate. The experimental details are listed in Table 1.

TABLE 1

Stack-building Details for Exemplary $W/DLC/Si_xC_yH_z$ Stack on PET Film

| Layers | Material | Deposition Method | Thickness |
|---|---|---|---|
| Upper Hard Mask Layer | W | Sputter coating | 100 nm |
| second Pattern Transfer Layer | DLC | CVD | 340 nm |
| Etch-Stop Layer | $Si_xC_yH_z$ | CVD | 120 nm |
| Substrate | PET | N/A | 5 mils |

The $W/DLC/Si_xC_yH_z$ stack is useful as a tool to fabricate articles (e.g., optical films) having a nano-scale pattern replicated surface, using the various nano-scale pattern replication techniques described herein.

Experimental Example 2

Multi-Step RIE Process—Layer Opening Through the Stack Example on the PET Film Substrate.

TABLE 2

Multi-Step RIE on the Exemplary $W/DLC/Si_xC_yH_z$ Stack on PET Film

| | $NF_3$ RIE Conditions | | |
|---|---|---|---|
| Sample ID | Flow rate, (sccm) | Speed (ft/min) | Etching Time, min |
| (a) | 500 | 2 | 2.5 |
| (b) | 500 | 10 | 0.5 |
| (c) | 200 | 2 | 2.5 |
| (d) | 200 | 10 | 0.5 |

A multi-step RIE process was tested on the example stack built in Experiment-1. In this test, a $NF_3$ chemistry was used for the RIE-1 step to etch the tungsten hard mask at different $NF_3$ flow rate and film (sample) rolling speed (i.e., different etching time). And oxygen was used for the RIE-2 step, aiming to etch the DLC layer below. The RIE control details are shown in Table 2; pictures of the etched stack samples are shown in FIG. 13.

Figure 13A:
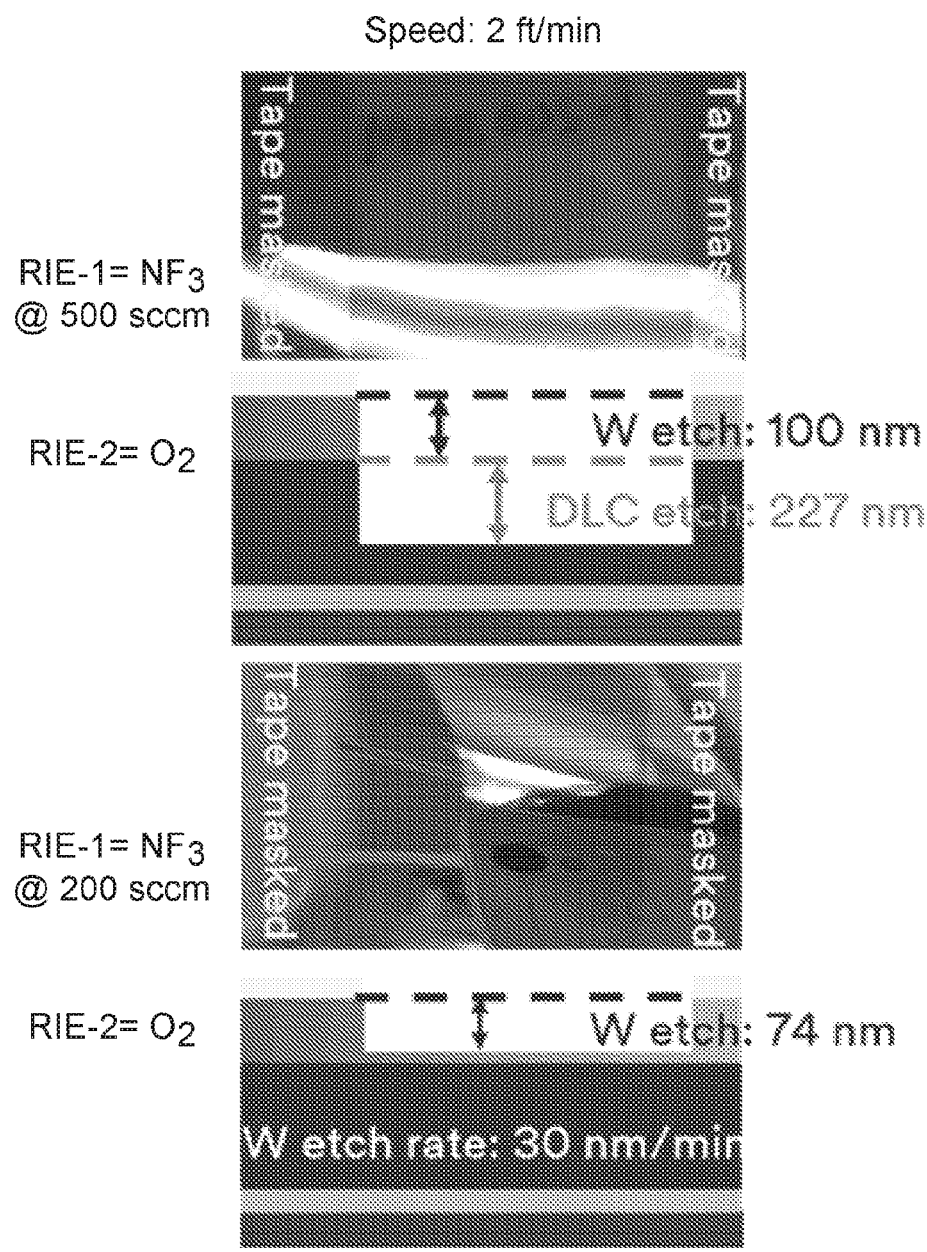
FIGS. 13A and 13B are side views of etched surfaces according to exemplary article embodiments of the present disclosure.
Figure 13B:
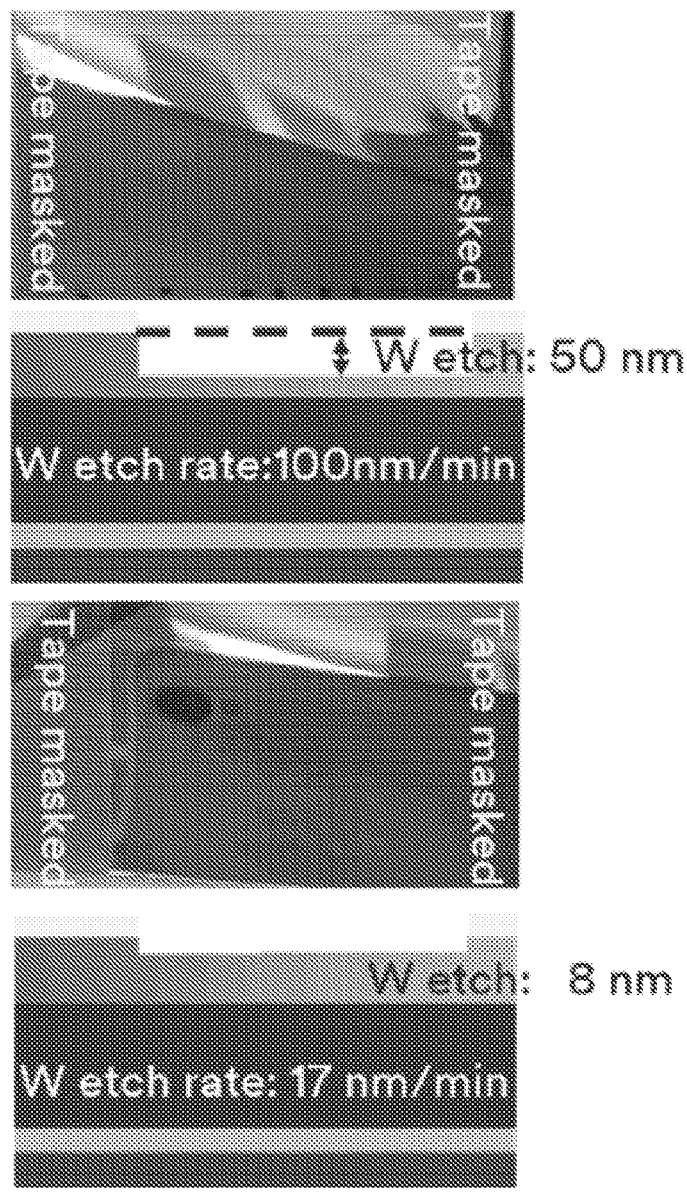

As shown in FIG. 13, on Samples (b-d), different etching depths were generated on each tungsten layer, although each sample top was still covered with a tungsten hard mask layer with a different end thickness. Because of that, the RIE-2 step using oxygen did not generate any further etching on these sample stacks. For example, after a RIE-1 with a $NF_3$ flow rate at 500 standard cubic centimeters per minute (sccm) and a sample rolling speed at 3.05 meters per minute (m/min), Sample (b) received a 50 nm etch in its tungsten layer at the highest etch rate of the three: 100 nm/min. On the contrary, with a RIE-1 flow rate at 200 sccm and a sample rolling speed at 10 ft/min, Sample (d) was only etched down 8 nm in its tungsten layer at the slowest etch rate at 17 nm/min.

Also, as shown in FIG. 3-(a), Sample (a) was etched at the higher $NF_3$ flow rate of 500 sccm and the slower rolling speed of 0.61 m/min. In other words, Sample (a) was etched with the most severe conditions in the group of 4 samples. Such RIE-1 set-up not only generated an etch-through in the whole tungsten layer in Sample (a), but also etched away part of the DLC layer underneath. Comparing Samples (a) and (c), they were etched at the same rolling speed, but the $NF_3$ flow rate on Sample (a) was 2.5 times of that of Sample (c). However, the tungsten etching depth in Sample (a) is 100 nm, while that in Sample (c) is 74 nm. Therefore, after etching through the whole tungsten upper layer on Sample (a), the extra RIE-1 etching and the following RIE-2 oxygen etching took away 227 nm of DLC layer underneath.

TABLE 3

| Materials | | |
|---|---|---|
| Designation | Description | Source |
| PHOTOMER 6210 | Urethane acrylate oligomer available under the trade designation PHOTOMER 6210 | IGM Resins, Charlotte, NC, United States |
| SR601 | Ethoxylated (4) bisphenol A diacrylate available under the designation SR601 | Sartomer Americas, Exton, PA, United States |
| SR602 | Ethoxylated (10) bisphenol A diacrylate available under the designation SR602 | Sartomer Americas, Exton, PA, United States |
| SR238 | 1,6-Hexandiol diacrylate available under the designation SR238 | Sartomer Americas, Exton, PA, United States |
| SR351 | Trimethylopropane triacrylate available under the designation SR351 | Sartomer Americas, Exton, PA, United States |
| SR454 | Ethoxylated trimethylolpropane triacylate available under the designation SR454 | Sartomer Americas, Exton, PA, United States |
| SR833 | Tricyldodecane dimethanol diacrylate available under the designation SR833 | Sartomer Americas, Exton, PA, United States |
| SR306HP | Tripropylene glycol diacrylate | Sartomer Americas, Exton, PA, United States |
| ETERMER 210 | 2-Phenoxyethyl acrylate available under the designation Etermer EM 210 | Toagosei America Inc., West Jefferson, OH, United States |
| HMDI | 4,4'-Methylenebis(cyclohexyl isocyanate) | Covestro LLC, Pittsburgh, PA, United States |
| TERETHANE 1000 | Polyether glycol available under the trade designation TERETHANE 1000 | Invista, Wichita, KS, United States |
| Dibutyultin dilaureate | Dibutyultin dilaureate | Sigma-Aldrich Corporation, St. Louis, MO, United States |
| HEA | 2-hydroxy ethylacrylate | Kowa American Corporation, New York, NY, United States |
| BHT | Butylated hydroxytoluene | Oxiris Chemicals S.A., Barcelona, Spain |
| MEHQ | Methoxy hydroquinone | Solvay USA Inc., Cranbury, NJ, United States |
| 1035 | Sulfur containing primary phenolic antioxidant available under the trade designation IRGANOX 1035 | BASF, Florham Park, NJ, United States |
| TPO | Diphenyl(2,4,6- trimethylbenzoyl)phosphine oxide available under the trade designation IRGACURE TPO | BASF, Florham Park, NJ, United States |
| TPO-L | 2,4,6-trimethylbenzoylphenylphosphinic acid ethyl ester available under the trade designation IRGACURE TPO-L | BASF, Florham Park, NJ, United States |
| 1173 | 2-Hydroxy-2-methyl-1-phenyl-propanone available under the designation Darocur 1173 | BASF, Florham Park, NJ, United States |
| AEBP | 2-Propenoic Acid, 2-(4-benzoylphenoxy) ethyl ester assembled as described in Example B of U.S. Pat. No. 4,847,137 (Kellen et al.) | 3M Company, St Paul, MN, United States |
| 90% Si/10% Al | Sputter Target 90% Silicon/10% Aluminum | Protech Materials, Hayward, CA, United States |

TABLE 3-continued

Materials

| Designation | Description | Source |
|---|---|---|
| $O_2$ | Oxygen (UHP compressed gas) | Oxygen Service Company, Saint Paul, MN, United States |
| Ar | Argon (UHP compressed gas) | Oxygen Service Company, Saint Paul, MN, United States |
| $N_2$ | Nitrogen (UHP compressed gas) | Oxygen Service Company, Saint Paul, MN, United States |
| $CO_2$ | Carbon dioxide (UHP compressed gas) | Oxygen Service Company, Saint Paul, MN, United States |
| K90 | 2-(3-trimethoxysilylpropylcarbamoyloxy)ethyl prop-2-enoate assembled as described in Example 7 of U.S. Pat. No. 9,790,396 (Klun et al.) | 3M Company, St Paul, MN, United States |
| 1189 | N-(n-Butyl)-3-aminopropyltrimethoxysilane available under the trade designation DYNASYLAN 1189 | Evonik Industries, Essen, Germany |
| 184 | Methanone, (1-hydroxycyclohexyl)phenyl-ketone) available under the trade designation IRGACURE 184 | BASF, Florham Park, NJ, United States |
| HFPO | Hexafluoropropyleneoxide dihydro diol diacrylate assembled as described in the Examples of U.S. Pat. No. 9,718,961 (Corveleyn et al.) | 3M Company, Saint Paul, MN, United States |
| HFPO-UA | Hexafluoropropyleneoxide multiacrylate assembled as described in the Examples of U.S. Pat. No. 7,173,778 (Jing et al.) | 3M Company, Saint Paul, MN, United States |
| PGME | Propylene Glycol Methyl Ether | Brenntag Great Lakes, Wauwatosa, WI, United States |
| MEK | Methyl ethyl keytone | Brenntag Great Lakes, Wauwatosa, WI, United States |
| HMDSO | Hexamethyldisiloxane | Gelest Inc., Morrisville, PA, United States |
| PF-5060 | Fully-fluorinated liquid ($C_6F_{14}$) available under the designation PF-5060 | 3M Company, Saint Paul, MN, United States |
| TTIP | Titanium Tetraisopropoxide | Sigma-Aldrich Corporation, St. Louis, MO, United States |
| ST504 | Polyester film available under the trade designation MELINEX ST504 | Du Pont Teijin Films, Chester, VA, United States |
| ST505 | Polyester film available under the trade designation MELINEX ST505 | Du Pont Teijin Films, Chester, VA, United States |
| Polycarbonate Film | 125-micron thick polycarbonate film with a gloss surface finish on both sides | Tekra, Inc., New Berlin, WI, United States |

PREPARATORY EXAMPLES

The following Preparatory Examples are used in the additional examples which follow.

Preparatory Example 1 (PE1)

An acrylate solution was prepared by first adding 75 wt % PHOTOMER 6210 with 25 wt % SR238 and 0.5% TPO to create a first acrylate mixture. 93 wt % of the first acrylate mixture was manually mixed with 7 wt % HFPO-UA resulting in a second acrylate mixture. The acrylate solution was then created by manually combining 14 wt % of the second acrylate mixture with 43 wt % PGME and 43 wt % MEK.

Preparatory Example 2 (PE2)

An adhesive promoter solution was prepared by adding 0.3 wt % of K90 with 99.7 wt % MEK and 0.003 wt % TPO-L.

Preparatory Example 3 (PE3)

A polyurethane acrylate mixture was prepared by first adding 540 g of HMDI to 1000 g TERETHANE 1000 with 0.38 g dibutyultin dilaureate as a catalyst. This isocyanate-terminated prepolymer was further reacted with 239.4 g HEA in the presence of 1.4 g BHT and 0.1 g MEHQ.

The reaction was considered complete when an isocyanate peak is no longer present at around 2275 cm-1 by Fourier-transform infrared spectroscopy. The resulting polyurethane acrylate mixture was then diluted with 1021 g of SR454.

For Preparatory Examples 4-7, after all components were added, the resin compositions were blended by warming to approximately 50 degrees C. and mixing for 12 hours on a roller mixer.

Preparatory Example 4 (PE4)

The mixture produced in PE3, SR602, SR601, SR351, and ETERMER 210 were combined and mixed in weight ratios of 60/20/4/8/8 to produce Resin A.

Preparatory Example 5 (PE5)

TPO, 1173 and 1035 were added and mixed in respective weight ratios of 0.35/0.1/0.2 parts per 100 parts of Resin A created in PE4 to produce Resin B.

Preparatory Example 6 (PE6)

Resin C was prepared by combining and mixing 0.5 parts by weight of AEBP to 99.5 parts by weight of Resin B created in PE5.

Preparatory Example 7 (PE7)

Resin D was prepared by combining and mixing PHOTOMER 6210, SR238, SR351 and TPO in weight ratios of 60/20/20/0.5.

Processing Methods

The following defined processing methods were used in the following examples and will be referred to as they are implemented in an appropriate step.

Method for Release Treatment

A silicon containing release film layer assembled according to methods described in U.S. Pat. No. 6,696,157 (David et al.) and U.S. Pat. No. 8,664,323 (Iyer et al.) and U.S. Patent Publication No. 2013/0229378 (Iyer et al.) was applied to the nanostructure tooling film in a parallel plate capacitively coupled plasma reactor. The chamber has a central cylindrical powered electrode with a surface area of 1.7 m$^2$ (18.3 ft$^2$).

After placing the nanostructured tooling film on the powered electrode, the reactor chamber was pumped down to a base pressure of less than 1.3 Pa (2 mTorr). $O_2$ gas was flowed into the chamber at a rate of 1000 SCCM. Treatment was carried out using a plasma enhanced CVD method by coupling RF power into the reactor at a frequency of 13.56 MHz and an applied power of 2000 watts. Treatment time was controlled by moving the nanostructured tooling film through the reaction zone at rate of 9.1 meter/min (30 ft/min) resulting in an approximate exposure time of 10 seconds. After completing the deposition, RF power was turned off and gasses were evacuated from the reactor.

Following the 1$^{st}$ treatment, a 2$^{nd}$ plasma treatment was carried out in the same reactor without returning the chamber to atmospheric pressure. HMDSO gas was flowed into the chamber at approximately 1750 SCCM to achieve a pressure of 9 mTorr. 13.56 MHz RF power was subsequently coupled into the reactor with an applied power of 1000 W. The film was then carried through the reaction zone at a rate of 9.1 meter/min (30 ft/min) resulting in an approximate exposure time of 10 seconds. At the end of this treatment time, the RF power and the gas supply were stopped, and the chamber was returned to atmospheric pressure.

Method of Liquid Coating the Adhesion Promoter

The adhesion promoter solution prepared in PE2 was coated in 15.24 cm wide stripes onto a film using a slot die. The solution was pumped using a Harvard syringe pump at 3 sccm onto the film, which was moving at a rate of 0.10 meters per second. The film moved through a 65° C. oven for 1.5 minutes after which it was cured using a Fusion H bulb and subsequently wound up.

Method for Reactive Ion Etching

Reactive ion etching was performed on a patterned film in the same reactor chamber used to deposit the release treatment layer. After placing the patterned film on the powered electrode, the reactor chamber was pumped down to a base pressure of less than 1.3 Pa (1 mTorr). A mixture of PF-5060 and $O_2$ gas was flowed into the chamber at a rate of 100 standard cubic centimeters per minute (sccm) and 50 sccm, respectively. 13.56 MHz RF power was subsequently coupled into the reactor with an applied power of 7500 W. The film was then carried through the reaction zone at a rate of 0.91 meter/min (3 ft/min), to achieve an exposure time of 100 s in order to transfer the pattern into the top layer.

After completing the 1$^{st}$ etch step, RF power was turned off and gasses were evacuated from the reactor. Following the 1$^{st}$ etch, a 2$^{nd}$ reactive ion etching treatment was carried out in the same reactor without returning the chamber to atmospheric pressure. $O_2$ gas was flowed into the chamber at a flow rate of 300 SCCM. 13.56 MHz RF power was subsequently coupled into the reactor with an applied power of 7500 W.

The nanostructured tooling film was then carried through the reaction zone at a rate of 0.61 meter/min (2 ft/min) resulting in an approximate exposure time of 150 seconds. At the end of this treatment time, the RF power and the gas supply were stopped and the chamber was returned to atmospheric pressure.

Additional information regarding materials and processes for continuous reactive ion etching through a nanostructured mask and further details around the reactor used can be found in U.S. Pat. No. 8,460,568 (David et al.).

Method of Vapor Coating Etch Stop and Transfer Layers

Etch stop and transfer layers were deposited by reactive sputtering and organic vapor deposition in a system similar to that described in U.S. Pat. No. 5,440,446 (Shaw et al.) and U.S. Pat. No. 7,018,713 (Padiyath, et al.). A substrate film was coated in roll-to-toll (R2R) format. In a first pass through this system, the substrate film was treated with a nitrogen plasma from an unbalanced dc magnetron cathode with titanium target at 50 W power and a nitrogen flowrate of 100 sccm.

Immediately after plasma treatment the film, a base etch stop layer of about 25 nm of a SiAlOx was sputter-deposited atop the plasma-treated surface. An alternating current (AC) 40 kHz power supply was used to control a pair of rotating cathodes; with each cathode housing a 90%/10% Si/Al sputtering target (obtained from Soleras Advanced Coatings US, of Biddeford, ME). During sputter deposition, the voltage signal from the power supply was used as an input for a proportional-integral-differential control loop to maintain a predetermined oxygen flow to each cathode. The sputtering conditions were: AC power 16 kW, line speed 4.88 meters/min (16 ft/min), with a gas mixture containing sccm argon and 223 sccm oxygen at a sputter pressure of 2.6 mTorr.

While maintaining the system under vacuum, the SiAlOx-coated film was then coated with the transfer layer in a second pass through the system. A line speed of 7.71 meters/min (25.3 ft/min) was held while maintaining the backside of the film in contact with a coating drum chilled to −10° C. With the backside in contact with the drum, the SiAlOx surface was treated with a dc oxygen plasma at 100 W and an oxygen flowrate of 100 sccm.

Immediately after the oxygen plasma treatment, the SiAlOx surface was then coated with a mixture of 88 wt % SR833, 4 wt % K90, 4 wt % 1189, and 4 wt % 184 using an organic vapor deposition system and method described in U.S. Pat. No. 9,302,291 (Lyons et al.). The monomer was degassed under vacuum to a pressure of 20 mTorr prior to coating, then evaporated and delivered to the SiAlOx surface. The vapor stream condensed onto the film surface and was cured by UV irradiation using a low-pressure mercury arc lamp. The oxygen plasma and organic vapor deposition were operated at a line speed of 7.71 meters/min (25.3 ft/min) to form a 1100-nm-thick polymer transfer layer.

While maintaining the system under vacuum, the film with base etch stop and transfer layer was then coated with another etch stop layer in a third pass through the system. The film with base etch stop and transfer layer was treated with a nitrogen plasma at 50 W power and a nitrogen flowrate of 100 sccm.

Immediately after plasma treatment the top etch stop layer of about 25 nm of a SiAlOx layer was sputter-deposited atop the SR833 layer surface. An alternating current (AC) 40 kHz power supply was used to control a pair of rotating cathodes; with each cathode housing a 90%/10% Si/Al sputtering target (obtained from Soleras Advanced Coatings US, of Biddeford, ME). During sputter deposition, the voltage signal from the power supply was used as an input for a proportional-integral-differential control loop to maintain a predetermined oxygen flow to each cathode. The sputtering conditions were: AC power 16 kW, line speed 4.88 meters/min (16 ft/min), with a gas mixture containing sccm argon and 228 sccm oxygen at a sputter pressure of 2.6 mTorr.

Method of Backfilling Etched Nanostructures with High Index Coating

High refractive index nanostructures were formed by backfilling an etched nanofeature film with TiO2 by spatial atomic layer deposition (ALD). Etched high-aspect-ratio features were coated in a spatial R2R ALD machine as described by PCT Patent Publication No. 2017/172531 (Lyons et al.). $TiO_2$ was deposited using TTIP heated to 80° C. with 300 sccm $N_2$ push gas, and a plasma discharge (approximately 0.50 mA/cm$^2$) in an environment of 1.1 ton $N_2$ and 0.3 torr $CO_2$. The ALD chamber was heated to 100° C.

The etched nanofeature film was translated through the ALD chamber for a plurality of passes at 30.48 meters/min (100 ft/min), with one precursor exposure and one plasma exposure per ALD cycle, and 72 ALD cycles per chamber pass. The etched nanofeature film was translated through the ALD chamber up to 50 passes to yield a $TiO_2$ layer thickness of approximately 200 nm.

Experimental Example 3

Step 1: A nano-featured template film was prepared by die coating Resin D onto a polycarbonate film. The coated film was pressed against a nanostructured nickel surface attached to a steel roller controlled at 60° C. using a rubber covered roller at a speed of 15.2 meters/min. The nanostructured nickel tool consists of twelve 6 mm by 6 mm patterned areas with features ranging in size between 75 nm and 500 nm. The patterned area consisted of a multi-pitch pattern with pitches of 150, 200 and 250 nm with feature widths of half the pitch (75, 100, 125 nm).

The features were arranged in a square grid so that pitches were varied in both axes resulting in a nine unit repeating cell with rectangles of all combinations of widths mentioned above. In this repeating cell, the 150 nm pitch sections had 27 features, the 200 nm pitch sections had 20 features and the 250 nm pitch sections had 16 features. The features were about 200 nm tall and had side wall angles of approximately 4 degrees.

The coating thickness of Resin D on the film was sufficient to fully wet the nickel surface and form a rolling bead of resin as the coated film was pressed against the nano-structured nickel surface. The film was exposed to radiation from two Fusion UV lamp systems (obtained under the trade designation "F600" from Fusion UV Systems, Gaithersburg, MD) fitted with D bulbs both operating at 142 W/cm while in contact with the nanostructured nickel surface. After peeling the film from the nanostructured nickel surface, the nanostructured side of the film was exposed again to radiation from the Fusion UV lamp system.

Step 2: A release layer was deposited on the nano-featured template film using the Method for Release Treatment.

Step 3: A 3-layer stack of 25 nm SiAlOx base etch stop/1100 nm SR833 transfer layer/25 nm SiAlOx top etch stop was deposited onto 11.5-inch-wide ST505 film using the Method of Vapor Coating the Etch Stop and Transfers Layers.

Step 4: An adhesion promoter solution of PE2 was coated onto the 3-layer stack created in Step 3 using the Method of Liquid Coating the Adhesion Promoter.

Step 5: The release treated template film created in Step 2 was slot-die coated with a solution of acrylate solution created in PE1 at 0.05 meters per second. The solution was coated 10.16 cm wide and pumped with a Harvard syringe pump at a rate of 1.05 sccm.

The coating was partially cured 1.5 meters from the solution application using a 405 nm UV-LED system powered at 0.2 Amps at 40 volts. The coating experienced approximately 0.005 W/cm$^2$ irradiance in the UV-Visible spectrum.

The film was then dried at ambient conditions for 3 minutes before entering a nip. At the nip, the film with the 2$^{nd}$ etch resist, transfer layer, 1$^{st}$ etch resist, and adhesion promoter from Step 4 was laminated with the overcoated release treated template film. The nip consisted of a 90-durometer rubber roll and a steel roll set at 37° C. The nip was engaged by two Bimba air cylinders pressed by 0.28 MPa.

The solution was cured using a Fusion H bulb and the first acrylate mixture was separated from the release treated template film remaining on the 3-layer film for the entirety of the 6 mm by 6 mm patterned areas. Web tensions were set to be approximately 0.0057 N/m. Although the theoretical dry thickness was 350 nm, SEM images showed that the thickness of the transferred layer and cured first acrylate mixture was only 300 nm, implying that there was only 100 nm of continuous coating underneath the 200 nm features.

Step 6: The patterned 3-layer film from Step 5 was etched according the Method for Reactive Ion Etching. The breakthrough etch step was completed with a mixture of PF-5060 and O$_2$ gas at flow rates of 100 SCCM and 50 SCCM, respectively, for an exposure time of 100 s. The transfer layer etch step was completed using 400 sccm of O$_2$ gas and an exposure time of 240 s. After completing the etch step, cross-sectional SEM images were obtained after cryo-fracturing. The SEM images confirmed that the patterned features were transferred into the transfer layer down to the etch stop.

Experimental Example 4

Step 1: A nano-featured template film was prepared following the same procedure as described in Step 1 of Example 3 except that Resin B was used. Resin B was die coated onto the polycarbonate film from a heated storage container, through a heated hose, with temperature set to 65.5° C.

Step 2: A release layer was deposited on the nano-featured template film using the Method for Release Treatment.

Step 3: The release-treated template film from Step 2 was vapor coated with SR306HP. A line speed of 2.4 meters/min (8 ft/min) was held while maintaining the backside of the film in contact with a coating drum chilled to −10° C. With the backside in contact with the drum, the release-treated template film surface was coated with SR306HP using an organic vapor deposition system and method described in U.S. Pat. No. 8,658,248 (Anderson et al.).

The monomer was degassed under vacuum to a pressure of 20 mTorr prior to coating. This liquid was pumped into an ultrasonic atomizer at a liquid flowrate of 0.5 ml/min using a syringe pump, and a nitrogen gas flowrate of 10 sccm was input to the atomizer. The liquid was flash-evaporated at 250° C. and delivered to the release-coated template surface. The vapor stream condensed onto the film surface and was electron beam crosslinked using a multi-filament electron-beam cure gun operating at 7.0 kV and 4 mA to form a 600 nm thick planarizing polymer layer.

Step 4: While maintaining vacuum after Step 3, a 3-layer stack of 25 nm SiAlOx base etch stop/1100 nm SR833 transfer layer/25 nm SiAlOx top etch stop was deposited onto the acrylate-coated/release-coated template film using the Method of Vapor Coating the Etch Stop and Transfers Layers, except that the transfer layer composition was 85 wt % SR833, 10 wt % K90, and 5 wt % 184.

Step 5: An adhesion promoter solution of PE2 was coated onto the 3-layer stack created in Step 4 using the Method of Liquid Coating the Adhesion Promoter.

Step 6: The first acrylate mixture as prepared in PE1 was syringe fed onto the top layer of SiAlO$_x$ using a plastic tube, as the film was moving at 0.025 m/s. The film was laminated to a ST504 film using a 90 durometer rubber roll and a steel roll set at 76.6° C. The nip was engaged by two Bimba air cylinders with a force of 70,000 Pa. The solution was cured using a Fusion H bulb, then the first acrylate mixture/SiAlOx/SR833/SiAlOx/SR306H was separated from the film. Web tensions were set to be approximately 0.0057 N/m.

Step 7: The patterned 3-layer film from Step 6 was etched according to the Method for Reactive Ion Etching. The breakthrough etch step was completed with NF$_3$ gas at a flow rate of 100 sccm for an exposure time of 50 s. The transfer layer etch step was completed using 100 sccm of O$_2$ gas and an exposure time of 300 s.

Experimental Example 5

Step 1: A nano-featured template film was prepared following the same procedure as described in Step 1 of Example 3 except that Resin C was used. Resin C was die coated onto the polycarbonate film from a heated storage container, through a heated hose, with temperature set to 65.5° C.

Step 2: A release layer was deposited on the nano-featured template film using the Method for Release Treatment.

Step 3: A first etch stop layer of SiAlOx 25-nm-thick was deposited onto a 11.5-inch-wide ST505 PET film as described in the Method of Vapor Coating Etch Stop and Transfer Layers. The etch stop layer was then vapor coated with a layer of 96 wt % K90 and 4 wt % 1173 approximately 15 nm thick.

A line speed of 19.8 meters/min (65 ft/min) was held while maintaining the backside of the film in contact with a coating drum chilled to 0° C. With the backside in contact with the drum, the SiAlOx surface was treated with a dc nitrogen plasma at 100 W and a nitrogen pressure of 150 mTorr.

Immediately after the nitrogen plasma treatment, the SiAlOx surface was then coated with K90/Darocur 1173 using an organic vapor deposition system and method described in U.S. Pat. No. 8,658,248 (Anderson et al.). The monomer was degassed under vacuum to a pressure of 20 mTorr prior to coating. This liquid was pumped into an ultrasonic atomizer at a liquid flowrate of 0.1 ml/min using a syringe pump, and a nitrogen gas flowrate of 10 sccm was input to the atomizer. The liquid was flash-evaporated at 250° C. and delivered to the SiAlOx surface. The vapor stream condensed onto the film surface and was cured by UV irradiation using a low-pressure mercury arc lamp.

While remaining under vacuum, the K90/1173 layer was vapor coated with an acrylate layer of 97.5 wt % HFPO 2.5 wt % 1173 approximately 1100 nm thick. A line speed of 3.81 meters/min (12.5 ft/min) was held while maintaining the backside of the film in contact with a coating drum chilled to 0° C.

With the backside in contact with the drum, the K90 surface was coated with the HFPO/1173 mixture using an organic vapor deposition system and method described in U.S. Pat. No. 8,658,248 (Anderson et al.). The monomer was degassed under vacuum to a pressure of 20 mTorr prior to coating. The liquid was pumped into an ultrasonic atomizer at a liquid flowrate of 2.05 ml/min using a syringe pump, and a nitrogen gas flowrate of 10 sccm was input to the atomizer. The liquid was flash-evaporated at 250° C. and delivered to the K90 surface.

The vapor stream condensed onto the film surface and was cured by UV irradiation using a low-pressure mercury arc lamp. A top etch stop layer of SiAlOx 25-nm-thick was deposited onto HFPO/SiAlOx coated film as described in the Method of Vapor Coating Etch Stop and Transfer Layers.

Step 4: An adhesion promoter solution of PE2 was coated onto the 3-layer stack created in Step 4 using the Method of Liquid Coating the Adhesion Promoter.

Step 5: The release treated template film from step 4 was slot-die coated with a solution of acrylate solution created in PE1 at 0.05 meters per second. The solution was coated 10.16 cm wide and pumped with a Harvard syringe pump at a rate of 1.05 sccm. The coating was partially cured 1.5 meters from the solution application using a 405 nm UV-LED system powered at 0.2 Amps at 40 volts. The coating experienced approximately 0.005 W/cm$^2$ irradiance in the UV-Visible spectrum.

The film was then dried at ambient conditions for 3 minutes before entering a nip. At the nip, the film with the $2^{nd}$ etch resist, transfer layer, $1^{st}$ etch resist, and adhesion promoter from Step 4 was laminated with the overcoated release treated template film. The nip consisted of a 90-durometer rubber roll and a steel roll set at 37° C. The nip was engaged by two Bimba air cylinders pressed by 0.28 MPa.

The solution was cured using a Fusion H bulb and the first acrylate mixture was separated from the release treated template film remaining on the 3-layer film for the entirety of the 6 mm by 6 mm patterned areas. Web tensions were set to be approximately 0.0057 N/m. Although the theoretical dry thickness was 350 nm, SEM images showed that the thickness of the transferred layer and cured first acrylate mixture was only 300 nm, implying that there was only 100 nm of continuous coating underneath the 200 nm features.

Step 6: The patterned 3-layer film was etched according the Method for Reactive Ion Etching. The breakthrough etch step was completed with a mixture of PF-5060 and $O_2$ gas at flow rates of 100 sccm and 50 sccm, respectively, for an exposure time of 75 s. The transfer layer etch step was completed using 275 sccm of $O_2$ gas and an exposure time of 50 s. After completing the etch step, cross-sectional SEM images were obtained after cryo-fracturing. The patterned features were transferred into the low index transfer layer down to the etch stop.

Step 7: The etched nanofeature film from Step 6 was backfilled with $TiO_2$ according to the Method of Backfilling Etched Nanostructures with High Index Coating. After processing, the samples were removed from the chamber and a cross-sectional SEM image was completed showing that the full range of features sizes were filled with no evidence of voids.

Experimental Example 6

Step 1: A nano-featured template film was prepared by die coating Resin B onto a polycarbonate film from a heated storage container, through a heated hose, with temperature set to 71.1° C. The coated film was pressed against a nanostructured nickel surface attached to a steel roller controlled at 71.1° C. using a rubber covered roller at a speed of 15.2 m/min.

The nanostructured nickel tool was a 65 mm by 65 mm square-packed hole array of 310 nm deep holes having a diameter of 200 nm, a pitch of 400 nm, and a draft angle of 6.3 degrees. The coating thickness of Resin B on the film was sufficient to fully wet the nickel surface and form a rolling bead of resin as the coated film was pressed against the nanostructured nickel surface.

The film was exposed to radiation from two Fusion UV lamp systems ("F600" from Fusion UV Systems) fitted with D bulbs both operating at 142 W/cm while in contact with the nanostructured nickel surface. After peeling the film from the nanostructured nickel surface, the nanostructured side of the film was again exposed to radiation from a Fusion UV lamp system.

Step 2: A release layer was deposited on the nano-featured template film using the Method for Release Treatment.

Step 3: A silicon containing etch stop layer comprised of $SiC_yO_x$ was applied to film using the same reactor described in Method for Release Treatment. After placing the film on the powered electrode, the reactor chamber was pumped down to a base pressure of less than 1.3 Pa (2 mTorr). A mixture of HMDSO and $O_2$ gas was flowed into the chamber at a rate of 100 sccm and 1000 sccm, respectively.

Treatment was carried out using a plasma enhanced CVD method by coupling RF power into the reactor at a frequency of 13.56 MHz and an applied power of 7500 watts. Treatment time was controlled by moving the nanostructured tooling film through the reaction zone at rate of 15 ft/min, resulting in an approximate exposure time of 20 seconds.

After completing the deposition, RF power was turned off and gasses were evacuated from the reactor. Following the $1^{st}$ treatment, a $2^{nd}$ plasma treatment was carried out in the same reactor without returning the chamber to atmospheric pressure. $O_2$ gas was flowed into the chamber at approximately 1500 sccm. 13.56 MHz RF power was subsequently coupled into the reactor with an applied power of 6000 W. The nanostructured tooling film was then carried through the reaction zone at a rate of 30 ft/min, resulting in an approximate exposure time of 10 seconds. At the end of this treatment time, the RF power and the gas supply were stopped and the chamber was returned to atmospheric pressure.

Step 4: An adhesion promoter solution of PE2 was coated onto the 3-layer stack created in Step 4 using the Method of Liquid Coating the Adhesion Promoter.

Step 5: The release treated template film from step 4 was slot-die coated with a solution of acrylate solution created in PE1 at 0.05 meters per second. The solution was coated 10.16 cm wide and pumped with a Harvard syringe pump at a rate of 1.45 sccm. The coating was partially cured 1.5 meters from the solution application using a 405 nm UV-LED system powered at 0.2 Amps at 40 volts. The coating experienced approximately 0.005 W/cm$^2$ irradiance in the UV-Visible spectrum.

The film was then dried at ambient conditions for 3 minutes before entering a nip. At the nip, the release treated nanostructure template film from Step 2 is introduced from an auxiliary unwind and laminated with the first acrylate mixture coated film from Step 4. The nip consisted of a 90-durometer rubber roll and a steel roll set at 37° C. The nip was engaged by two Bimba air cylinders pressed by 0.28 MPa.

The solution was cured using a Fusion H bulb and the first acrylate mixture was separated from the release treated template film remaining on the 3-layer film for the entirety of the 6 mm by 6 mm patterned areas. Web tensions were set to be approximately 0.0057 N/m. Although the theoretical dry thickness was 500 nm, SEM images showed that the thickness of the transferred layer and cured first acrylate mixture was only 400 nm, implying that there was only 100 nm of continuous coating underneath the 100 nm features. The pattern transferred for the entirety of the 65 mm by 65 mm patterned area.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of forming an etched nano-scale pattern on a substrate, the method comprising:
   (i) providing a multi-layer material stack comprising
       (a) a first substrate having a patterned surface, the patterned surface of the first substrate including one or more recessed features, each recessed feature adjoining at least one plateau feature extending away from the recessed feature;
       (b) a masking layer overlaying at least a portion of the patterned surface of the first substrate;
       (c) a first etch resist comprising a first etch resistant material overlaying the masking layer;
       (d) a pattern transfer layer overlaying at least a portion of the first etch resist;
       (e) a second etch resist comprising a second etch resistant material overlaying the pattern transfer layer; and
       (f) a second substrate overlaying the second etch resist;
   (ii) removing the patterned surface of the first substrate from the masking layer and the first etch resist to create a patterned surface of the masking layer on the first etch resist, wherein the patterned surface of the masking layer comprises plateau features corresponding to the recessed features of the patterned surface of the first substrate surrounded by recessed areas corresponding to the plateau features of the patterned surface of the first substrate;
   (iii) performing a first etching step to the patterned surface of the masking layer to remove the masking layer and the first etch resistant material in the recessed areas of the masking layer to expose the underlying pattern transfer layer without removing the first etch resistant material covered by the masking layer forming the plateau features of the masking layer, thereby forming a first etched nanoscale pattern on the pattern transfer layer, wherein the first etched nano-scale pattern comprises a plurality of first nano-scale features; and
   (iv) performing a second selective etching step to remove the pattern transfer layer in the recessed areas exposing the second etch resist layer and to remove the masking layer in the plateau regions to expose the first etch resist layer thereby forming a second etched nanoscale pattern on the second substrate, wherein the second etched nano-scale pattern comprises a plurality of second nano-scale features;
   wherein each second nano-scale feature exhibits at least one dimension from 1 nm to 900 nm; and
   wherein the second substrate is not etched.

2. The method of claim 1, wherein the first etching step is carried out using reactive ion etching, high density RF inductive plasma etching, high density linear ion plasma etching, microwave plasma etching, linear microwave plasma etching, helicon wave plasma etching, ion-beam milling, pulsed ion beam etching, pulsed reactive ion etching, or a combination thereof.

3. The method of claim 1, wherein the first etching step is a reactive ion etch in a fluorine-containing environment and the second selective etching step is a reactive ion etch in an oxygen-containing environment.

4. The method of claim 3 further comprising back-filling the second etched nano-scale pattern with a high refractive index layer comprising a material having a refractive index of at least 1.7.

5. The method of claim 4, wherein the high refractive index layer is deposited by chemical vapor deposition, atomic layer deposition, liquid coating, or a combination thereof.

6. The method of claim 3, wherein an aspect ratio of the second etched pattern is at least 2.5:1.

7. The method of claim 1, wherein providing the multi-layer material stack comprises coating the masking layer onto the patterned surface of the first substrate, then laminating masking layer to the first etch resist layer, then solidifying the masking layer.

8. The method of claim 1, wherein at least one of the first substrate and the second substrate is a flexible substrate.

9. The method of claim 1, wherein providing the multi-layer material stack comprises modifying the surface of the first etch resist to increase adhesion to the masking layer.

10. The method of claim 1, wherein providing the multi-layer material stack comprises applying a coating to modify a surface composition of one or more of: the patterned surface, the first etch layer, the pattern transfer layer, the second etch layer or the second substrate to modify the surface.

11. The method of claim 1, wherein the method is carried out on a roll of the multi-layer material stack, (iii) performing a first etching step is performed using a substantially continuous roll-to-roll processes, and (iv) performing the second selective etching step is performed using a substantially continuous roll-to-roll process.

\* \* \* \* \*